United States Patent
Christophersen et al.

(10) Patent No.: US 10,901,044 B2
(45) Date of Patent: Jan. 26, 2021

(54) APPARATUSES AND METHODS FOR TESTING ELECTROCHEMICAL CELLS BY MEASURING FREQUENCY RESPONSE

(71) Applicant: Battelle Energy Alliance, LLC, Idaho Falls, ID (US)

(72) Inventors: Jon P. Christophersen, Moscow, ID (US); John L. Morrison, Butte, MT (US); William H. Morrison, Butte, MT (US); Patrick A. Bald, Moscow, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 0 days.

(21) Appl. No.: 16/167,962

(22) Filed: Oct. 23, 2018

(65) Prior Publication Data

US 2019/0064284 A1    Feb. 28, 2019

Related U.S. Application Data

(63) Continuation of application No. 14/296,321, filed on Jun. 4, 2014, now Pat. No. 10,379,168.

(60) Provisional application No. 61/831,001, filed on Jun. 4, 2013.

(51) Int. Cl.
*G01R 31/392* (2019.01)
*G01R 31/389* (2019.01)

(52) U.S. Cl.
CPC ......... *G01R 31/392* (2019.01); *G01R 31/389* (2019.01)

(58) Field of Classification Search
CPC .......................... G01R 31/392; G01R 31/389
See application file for complete search history.

(56) References Cited

U.S. PATENT DOCUMENTS

| | | | |
|---|---|---|---|
| 4,498,044 | A | 2/1985 | Horn |
| 4,697,134 | A | 9/1987 | Burkum et al. |
| 5,061,890 | A | 10/1991 | Longini |
| 5,261,007 | A | 11/1993 | Hirsch |
| 5,281,920 | A | 1/1994 | Wurst |

(Continued)

FOREIGN PATENT DOCUMENTS

| | | |
|---|---|---|
| EP | 1811592 B1 | 8/2008 |
| EP | 2447728 B1 | 6/2013 |

(Continued)

OTHER PUBLICATIONS

J.P. Christophersen, "Battery State-of-Health Assessment Using a Near Real-Time Impedance Measurement Technique Under No-Load and Load Conditions", Montana State University, Apr. 2011.*

(Continued)

*Primary Examiner* — Catherine T. Rastovski
(74) *Attorney, Agent, or Firm* — TraskBritt

(57) ABSTRACT

Real-time battery impedance spectra are acquired by stimulating a battery or battery system with a signal generated as a sum of sine signals at related frequencies. An impedance measurement device can be used to interface between the battery system and a host computer for generating the signals. The impedance measurement device may be calibrated to adapt the response signal to more closely match other impedance measurement techniques. The impedance measurement device may be adapted to operate at mid-range voltages of about 50 volts and high-range voltages up to about 300 volts.

27 Claims, 22 Drawing Sheets

(56) References Cited

U.S. PATENT DOCUMENTS

| | | |
|---|---|---|
| 5,406,496 A | 4/1995 | Quinn |
| 5,454,377 A | 10/1995 | Dzwonczyk et al. |
| 5,457,377 A | 10/1995 | Jonsson et al. |
| 5,512,832 A | 4/1996 | Russell et al. |
| 5,821,757 A | 10/1998 | Alvarez et al. |
| 5,946,482 A | 8/1999 | Barford et al. |
| 5,969,625 A | 10/1999 | Russo |
| 6,002,238 A | 12/1999 | Champlin |
| 6,072,299 A | 6/2000 | Kurle et al. |
| 6,160,382 A | 12/2000 | Yoon et al. |
| 6,208,147 B1 | 3/2001 | Yoon et al. |
| 6,222,369 B1 | 4/2001 | Champlin |
| 6,249,186 B1 | 6/2001 | Ebihara et al. |
| 6,262,563 B1 | 7/2001 | Champlin |
| 6,307,378 B1 | 10/2001 | Kozlowski |
| 6,313,607 B1 | 11/2001 | Champlin |
| 6,330,933 B1 | 12/2001 | Boeckman et al. |
| 6,472,847 B2 | 10/2002 | Lundberg |
| 6,481,289 B2 | 11/2002 | Dixon et al. |
| 6,519,539 B1 | 2/2003 | Freeman et al. |
| 6,653,817 B2 | 11/2003 | Tate et al. |
| 6,691,095 B2 | 2/2004 | Singh et al. |
| 6,778,913 B2 | 8/2004 | Tinnemeyer |
| 6,816,797 B2 | 11/2004 | Freeman et al. |
| 6,832,171 B2 | 12/2004 | Barsoukov et al. |
| 6,876,174 B1 | 4/2005 | Samittier et al. |
| 6,922,058 B2 | 7/2005 | Potempa |
| 7,019,542 B2 | 3/2006 | Tinnemeyer |
| 7,051,008 B2 | 5/2006 | Singh et al. |
| 7,065,474 B2 | 6/2006 | Petchenev et al. |
| 7,072,871 B1 | 7/2006 | Tinnemeyer |
| 7,259,572 B2 | 8/2007 | Houldsworth et al. |
| 7,395,163 B1 | 7/2008 | Morrison et al. |
| 7,616,003 B2 | 11/2009 | Satoh et al. |
| 7,675,293 B2 | 3/2010 | Christophersen et al. |
| 7,698,078 B2 | 4/2010 | Kelty et al. |
| 7,898,263 B2 | 3/2011 | Ishida et al. |
| 8,150,643 B1 | 4/2012 | Morrison et al. |
| 8,193,771 B2 | 6/2012 | Coccio |
| 8,332,342 B1 | 12/2012 | Saha et al. |
| 8,352,204 B2 | 1/2013 | Morrison et al. |
| 8,368,357 B2 | 2/2013 | Ghantous et al. |
| 8,415,926 B2 | 4/2013 | Bhardwaj et al. |
| 8,427,112 B2 | 4/2013 | Ghantous et al. |
| 8,447,544 B2 | 5/2013 | Hsu et al. |
| 8,467,984 B2 | 6/2013 | Gering |
| 8,487,628 B2 | 7/2013 | Sciarretta et al. |
| 8,513,921 B2 | 8/2013 | Berkowitz et al. |
| 8,521,497 B2 | 8/2013 | Gering |
| 8,532,945 B2 | 9/2013 | Sciarretta et al. |
| 8,548,762 B2 | 10/2013 | Prada et al. |
| 8,582,675 B1 | 11/2013 | Harris |
| 8,598,849 B2 | 12/2013 | Bhardwaj et al. |
| 8,638,070 B2 | 1/2014 | Maluf et al. |
| 8,648,602 B2 | 2/2014 | Van Lammeren |
| 8,680,868 B2 | 3/2014 | Van et al. |
| 8,710,847 B2 | 4/2014 | Marvin et al. |
| 8,725,456 B1 | 5/2014 | Saha et al. |
| 8,738,310 B2 | 5/2014 | Swanton |
| 8,738,311 B2 | 5/2014 | Wu |
| 8,762,109 B2 | 6/2014 | Christophersen et al. |
| 8,773,145 B2 | 7/2014 | Phlippoteau et al. |
| 8,791,669 B2 | 7/2014 | Ghantous et al. |
| 8,831,897 B2 | 9/2014 | McHardy |
| 8,838,401 B2 | 9/2014 | Kelly |
| 8,849,598 B2 | 9/2014 | Mingant et al. |
| 8,868,363 B2 | 10/2014 | Morrison et al. |
| 8,878,549 B2 | 11/2014 | Nakanishi et al. |
| 8,889,309 B2 | 11/2014 | Manabe et al. |
| 8,901,886 B2 | 12/2014 | Berkowitz et al. |
| 8,907,631 B1 | 12/2014 | Gurries et al. |
| 8,907,675 B2 | 12/2014 | Phlippoteau et al. |
| 8,952,823 B2 | 2/2015 | Xie et al. |
| 8,970,178 B2 | 3/2015 | Berkowitz et al. |
| 8,975,874 B2 | 3/2015 | Berkowitz et al. |
| 9,030,173 B2 | 5/2015 | McHardy et al. |
| 9,035,621 B2 | 5/2015 | Berkowitz et al. |
| 9,035,623 B1 | 5/2015 | Berkowitz et al. |
| 9,063,018 B1 | 6/2015 | Ghantous et al. |
| 9,121,910 B2 | 9/2015 | Maluf et al. |
| 9,142,994 B2 | 9/2015 | Berkowitz et al. |
| 9,207,285 B1 | 12/2015 | Swanton et al. |
| 9,252,465 B2 | 2/2016 | Hariharan |
| 9,312,577 B2 | 4/2016 | Jamison |
| 9,373,972 B2 | 6/2016 | Ghantous et al. |
| 9,385,555 B2 | 7/2016 | Ghantous et al. |
| 9,461,492 B1 | 10/2016 | Berkowitz et al. |
| 9,465,077 B2 | 10/2016 | Love et al. |
| 9,519,031 B2 | 12/2016 | Jamison |
| 9,851,414 B2 | 12/2017 | Morrison et al. |
| 2002/0065621 A1 | 5/2002 | Jungerman |
| 2003/0184307 A1 | 10/2003 | Kozlowski et al. |
| 2003/0206021 A1 | 11/2003 | Laletin et al. |
| 2004/0095249 A1 | 5/2004 | Zaccaria |
| 2004/0162683 A1 | 8/2004 | Verbrugge et al. |
| 2005/0127908 A1 | 6/2005 | Schlicker et al. |
| 2005/0182584 A1 | 8/2005 | Plusquellic |
| 2006/0111854 A1 | 5/2006 | Plett |
| 2006/0111870 A1 | 5/2006 | Plett |
| 2006/0170397 A1 | 8/2006 | Srinivasan et al. |
| 2006/0284617 A1 | 12/2006 | Kozlowski et al. |
| 2006/0284618 A1 | 12/2006 | Cho et al. |
| 2007/0172708 A1 | 7/2007 | Takebe et al. |
| 2007/0182371 A1 | 8/2007 | Boebel |
| 2007/0257681 A1* | 11/2007 | Christophersen .... G01R 31/367 324/426 |
| 2008/0303528 A1 | 12/2008 | Kim |
| 2009/0076752 A1 | 3/2009 | Wang et al. |
| 2009/0278037 A1 | 11/2009 | Grothe, Jr. |
| 2010/0010762 A1 | 1/2010 | Seki |
| 2010/0201320 A1 | 8/2010 | Coe et al. |
| 2010/0274510 A1 | 10/2010 | Morrison et al. |
| 2010/0332165 A1 | 12/2010 | Morrison et al. |
| 2011/0018543 A1 | 1/2011 | Bos et al. |
| 2011/0077880 A1 | 3/2011 | Gering |
| 2011/0169452 A1 | 7/2011 | Cooper et al. |
| 2011/0270559 A1* | 11/2011 | Christophersen ...... G01R 27/26 702/65 |
| 2011/0301931 A1 | 12/2011 | Gering |
| 2012/0019253 A1 | 1/2012 | Ziegler et al. |
| 2012/0032688 A1 | 2/2012 | Christophersen et al. |
| 2012/0038452 A1 | 2/2012 | Phlippoteau et al. |
| 2012/0078552 A1 | 3/2012 | Mingant et al. |
| 2012/0105070 A1 | 5/2012 | Van et al. |
| 2012/0188086 A1 | 7/2012 | Xie et al. |
| 2012/0217985 A1 | 8/2012 | Amanuma |
| 2012/0262186 A1 | 10/2012 | Morrison et al. |
| 2012/0316815 A1 | 12/2012 | Morigaki |
| 2013/0002267 A1 | 1/2013 | Kothandaraman et al. |
| 2013/0069660 A1 | 3/2013 | Bernard et al. |
| 2013/0141109 A1 | 6/2013 | Love et al. |
| 2013/0229156 A1 | 9/2013 | Brandon et al. |
| 2013/0267943 A1* | 10/2013 | Hancock .............. A61B 18/042 606/33 |
| 2014/0125284 A1 | 5/2014 | Qahouq |
| 2014/0188414 A1 | 7/2014 | Jeong et al. |
| 2014/0266821 A1* | 9/2014 | Shibata ................ H03M 1/001 341/110 |
| 2014/0358462 A1 | 12/2014 | Christophersen et al. |
| 2014/0372054 A1 | 12/2014 | Wang et al. |
| 2014/0372055 A1 | 12/2014 | Wang et al. |
| 2015/0002105 A1 | 1/2015 | Kelly |
| 2015/0165921 A1 | 6/2015 | Paryani |
| 2015/0168500 A1 | 6/2015 | Jamison |
| 2015/0197159 A1 | 7/2015 | Lee |
| 2017/0254859 A1 | 9/2017 | Christophersen et al. |
| 2018/0143257 A1 | 5/2018 | Garcia et al. |
| 2019/0214937 A1 | 7/2019 | Kristjansson |

FOREIGN PATENT DOCUMENTS

| | | |
|---|---|---|
| JP | 2000-009817 A | 1/2000 |
| JP | 2003-090869 A | 3/2003 |

(56) References Cited

FOREIGN PATENT DOCUMENTS

| | | |
|---|---|---|
| JP | 2003-223918 A | 8/2003 |
| JP | 2011-174925 A | 9/2011 |
| JP | 2012-078287 A | 4/2012 |
| JP | 2013-517755 A | 5/2013 |
| JP | 2014-106119 A | 6/2014 |
| JP | 2015-078992 A | 4/2015 |
| WO | 2004/106946 A2 | 12/2004 |
| WO | 2010/144834 A2 | 12/2010 |
| WO | 2010/144857 A2 | 12/2010 |
| WO | 2011/041094 A1 | 4/2011 |
| WO | 2011/140123 A1 | 11/2011 |
| WO | 2011/140131 A1 | 11/2011 |
| WO | 2013/085996 A1 | 6/2013 |
| WO | 2014/070831 A1 | 5/2014 |
| WO | 2015/029647 A1 | 3/2015 |
| WO | 2016/012922 A1 | 1/2016 |

OTHER PUBLICATIONS

Christophersen et al., "Lumped Parameter Modeling as a Predictive Tool for a Battery Status Monitor," Oct. 2003, Proceedings from IEEE Vehicular Technology Conference, 6 pages.
Christophersen et al., "Long-Term Validation of Rapid Impedance Spectrum Measurements as a Battery State-of-Health Assessment Technique", INL/CON-12-27063 SAE 2013 World, Apr. 2013, 11 pages.
Christophersen et al., "Crosstalk Compensation for a Rapid, Higher-Resolution Impedance Spectrum Measurement", Aerospace Conference, 2012 IEEE, Mar. 2012, 16pages.
Christophersen et al., "Advanced Technology Development Program for Lithium-Ion Batteries: Gen 2 Performance Evaluation Final Report", FreedomCAR & Vehicle Technoliges Program, INL/EXT-05-00913 (Jul. 2006) 140 pages.
Christophersen et al., "Performance Evaluation of Gen3 Advanced Technology Development Cells", 214th ECE Meeting, Abstract #549, The Electrochemical Society, (2008), 1 page.
Chapra, "Numerical Methods for Engineers," pp. 394-398, McGraw-Hill Publishing Company, 1985.
Bloom et al., "An Investigation of the Impedance Rise and Power Fade in High-Power Li-Ion Cells", presented at the 19th Inernational Electric Vehicle Symposium (EVS-19) (Oct. 2002) 14, pages.
Blanke et al., "Impedance measurements on lead-acid batteries for state-of-charge, state-of-health and cranking aapability prognosis in electric and hybrid electric venicles", Journal of Power Sources, 144 (2005) pp. 418-425.
Battery Test Manual for Plug-In Hybrid Electric Vehicles, U.S. Department of Energy Vehicle Technologies Program, INL/EXT-14-32849, Revision 3 (Sep. 2014) 82 pages.
Battery Test Manual for Plug-In Hybrid Electric Vehicles, INL/EXT-07-12536, Revision 2, Dec. 2010, 67 pages.
Bald et al., "Hardware Architecture for Rapid Impedance Measurements of 50V Battery Module", San Diego : The International Society of Automation, 2012. 58th International Instrumentation Symposium, INL/CON-12-24516, Jun. 2012, 18 pages.
Baert et al., "Determination of the State-of-Health of VRLA Batteries by Means of Noise Measurements", IEEE (downloaded Feb. 2010) pp. 301-306.
Ashtiani, Cyrus N., "Battery Hazard Modes and Risk Mitigation Analysis", USABC Version 0.0 (Aug. 2007) 10 pages.
Alpaydin, Ethem, "Radial Basis Functions," 2004, Chapter 12.3, pp. 284-290, Introduction to Machine Learning, The MIT Press, Cambridge, Massachusetts, London, England.
Aglzim et al., "Characterization of the Resistance of a Fuel Cell on Load by Electrochemical Impedance pectroscopy", Proceedings from the EUROCON Conference, IEEE (2007) pp. 1489-1492.
1260 Impedance/Gain-Phase Analyzer, Operating Manual, Solartron Analytical (Jan. 1996) 215 pages.
Zhu et al., "PSpice Simulation via AC Impedance for PEFC at Operational Loads", http://folk.ntnu.no/skoge/prosl/proceedings/aiche-2005/topical/pdffiles/T1/papers/215c.pdf (2005) 3 pages.
Zhu et al., "In-Situ Assessment of PEM Fuel Cells via AC Impedance at Operational Loads", http://folk.ntnu.no/skoge/prost/proceedings/aiche-2004/pdffiles/papers/014g.pdf (2004) 5 pages.
Zhang et al., "Prediction of Lithium-Ion Baller! s Remaining Useful Life Based on Relevance Vector Machine", SAE Int. J. All. Power 5(1) (May 2016) pp. 30-40.
Zechang et al., "Battery Management Systems in the China-made 'Start' series FCHVs", IEEE Vehicle Power and Propulsion Conference (VPPC) (Sep. 2008) 6 pages.
Yamada et al., "The intelligent automotive battery, 'CYBOX' ", Journal of Power Sources 185 (2008) pp. 1478-1483.
Wasserman, Philip D., "Radial Basis-Function Networks," Chapter 8, pp. 147-176, Advanced Methods in Neural Computing, 1993, New York: Van Nostrand Reinhold.
Verbrugge, Mark, "Adaptive, multi-parameter battery state estimator with optimized lime-weighting factors" J Appl Electrochem, vol. 37 (2007) pp. 605-616.
Unkelhaeuser et al., "Electrochemical Storage System Abuse Test Procedure Manual", United States Advanced Battery Consortium, SAND99-0497 (Jul. 1999) 28 pages.
U.S. Appl. to Christophersen et al., titled "Apparatuses and Methods for Testing Electrochemical Cells by Measuring Frequency Response", filed Jun. 4, 2013., U.S. Appl. No. 61/831,001.
Tang et al., "Temperature Dependent Performance and in Situ AC Impedance of High-Temperature PEM Fuel Cells Using the Nafion-112 Membrane", Journal of the Electrochemical Society, 153(11) (2006) pp. A2036-A2043.
Tabema et al., "Electrochemical Characteristics and Impedance Spectroscopy Studies of Carbon-Carbon Supercapacitors", Journal of the Electrochemical Society, 150(3), (2003) pp. A292-A300.
Sternad et al., "Condition monitoring of Lithium-Ion Batteries for electric and hybrid electric vehicles", Elektrotechnik & Informationstechnik, 126/5 (2009) pp. 186-193.
Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.
Saha et al., "Prognostics Methods for Battery Health Monitoring Using a Bayesian Framework", IEEE Transactions on Instrumentation and Measurement, vol. 58, No. 2, Feb. 2009, pp. 291-296.
Ranade et al., An overview of harmonics modeling and simulation, Elect. Power Syst Res., vol. 74, pp. 37-56, Apr. 2005, Retrieved online at <http://www.calvin.edu/~pribeiro/IEEE/ieee_cd/chapters/pdffiles/c1pdf.pdf>.
Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirecl.com/science/article/pii/S0263224109001031>.
Qnovo "Fundamentals of Qnovo Adaptive Charging in Lithium Ion Batteries" http://qnovo.com/wp-content/uploads/2015/12/Qnovo.sub.--TechWhitePaper.su- b.-v2.4.pdf, (2015) 13 pages.
PCT International Search Report and Written Opinion of the International Searching Authority for PCT/US11/35052, dated Jul. 26, 2011, 11 pages.
Pastor-Fernandez et al., "A Comparison between EIS and IC-DV as Li-ion Diagnostic Techniques to Identify and Duantify the Effects of Degradation Modes within BMS", Journal of Power Sources 360 (2017) pp. 301-318.
Noworolski et al., "Reducing and Utilizing Electrical Noises for Battery Monitoring Purposes", IEEE 32-4 (2004) pp. 611-614.
Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.
Morrison, William H., "Development and Implementation of a Calibration Procedure for Complex Impedance Spectrum Measurements with Applications to Embedded Battery Health Monitoring and Management Systems", Master's Thesis, (Oct. 2012) 119 pages.
Morrison, William H., "Intelligent Self-Evolving Prognostic Fusion, Phase I STTR Interim Report," Jul. 29, 2005, Qualtech Systems, Inc., NASA, Ames Research Center, 23 pages.

(56) References Cited

OTHER PUBLICATIONS

Morrison, J.L., "Signals and Systems: Synchronous Detection", Montana Tech Digital Commons, Sep. 2013, Chapter 20, pp. 241-244.

Morrison, J.L., "Signals and Systems: State Variable Description of Linear Time Invariant Systems", Montana Tech Digital Commons, Sep. 2013, chapter 17, pp. 198-214.

Morrison, J.L., "Signals and Systems: Recursive Solution of Linear Time Invariant Systems", Montana Tech Digital Commons, Sep. 2013, Chapter 18, pp. 215-226.

Morrison, J. L., "DC Buffering and Floating Current for a High Voltage IMB Application", INL/EXT-14-32858, Prepared for the U.S. Department of Energy, https://inldigitallibrary.inl.gov/sti/6330933.pdf , Aug. 2014, 8 pages.

Morrison, "CSD Algorithms as Matlab Code for Real Time Estimation of Battery Impedance", Montana Tech of the University of Montana (Sep. 2005), 20 pages.

Morrison et al., "Real Time Estimation of Battery Impedance," Proceedings from the IEEE Aerospace Conference, Mar. 5-11, 2006, Big Sky, MT, 13 pages.

Morrison et al., "Fast Summation Transformation for Battery Impedance Identification," IEEE Aerospace 2009 conference, Mar. 7-14, 2009, Big Sky, Montana, 9 pages.

Morrison et al., "An Advanced Calibration Procedure for Complex Impedance Spectrum Measurements of Advanced Energy Storage", San Diego : The International Society of Automation, 2012. 58th International Instrumentation Symposium, INL/CON-12-24519, Jun. 2012, 17 pages.

Mix, Dwight F., "Random Signal Processing," p. 296, Prentice Hall Publishing Company, 1995.

Mingant et al., "Towards onboard Li-ion battery state-0f-health diagnosis by a virtual sensor", World Electric Vehicle Journal, vol. 5 (2012) pp. 405-411, EVS26.

Kozlowski, James D., "Electrochemical Cell Prognostics using Online Impedance Measurements and Model-Based Data Fusion Techniques", Aerospace Conference, 2003 Proceedings, vol. 7-3257, Mar. 2003, 14 pages.

Huang et al., "An Online Battery Impedance Measurement Method Using DC-DC Power Converter Control", IEEE Transactions on Inductrial Electronics, vol. 61, No. 11 (Nov. 2014) pp. 5987-5995.

Howey et al., "On-line measurement of battery impedance using motor controller excitation", IEEE Transactions on Vehicular Technology, vol. 63, Issue 6, (Jul. 2014) pp. 2557-2566.

Hoffmann et al. "Development and Test of a Real Time Battery Impedance Estimation System", IEEE Aerospace 2006 Conference, Mar. 5-11, 2006, Big Sky Montana.

Hirschorn et al., "On Selection of the Perturbation Amplitude Required to Avoid Nonlinear Effects in Impedance Measurements", Israel Journal of Chemistry, vol. 48, (2008) pp. 133-142.

Haskins et al., "Battery Technology Life Verification Test Manual", Idaho National Laboratory, INEEL/EXT-04-01986 (Feb. 2005) 133 pages.

Gould et al., "New Battery Model and State-of-Health Determination Through Subspace Parameter Estimation and State-Observer Techniques", IEEE Transactions on Vehicular Technology, vol. 58, No. 8 (Oct. 2009) pp. 3905-3916.

Goebel et al., "Prognostics in Battery Health Management", IEEE Instrumentation & Measurement Magazine, 1094-6969/08, Aug. 2008, pp. 33-40.

FreedomCAR Ultracapacitor Test Manual, Idaho National Laboratory, DOE/ID-11173, Revision 0 (Sep. 2004) 116 pages.

FreedomCAR Battery Test Manual for Power-Assist Hybrid Electric Vehicles, manual, Oct. 2003, Appendix D, DOE/ID-11069, Idaho National Laboratory, 130 pages.

Ford, "Validation of Push Pull Current", Proceedings of the Annual Montana Tech Electrical and General Engineering Symposium, (2016) 25 pages.

Doughty et al., "Electrical Energy Storage System Abuse Test Manual for Electric and Hybrid Electric Vehicle Applications", FreedomCAR, SAND2005-3123 (Jun. 2005) 45 pages.

Crow et al., "Integrated Prognostic Health Monitoring of Battery Health in Ground Robots", PennState Applied Research Laboratory, 32nd Association for Unmanned Vehicle Systems International Meeting (Jun. 2005) 16 pages.

Christophersen, Jon P., "Impedance Noise Identification for State-of-Health Prognostics," Jul. 7-10, 2008, Philadelphia, PA, 43rd Power Sources Conference, 4 pages.

Christophersen, Jon P., "Battery State-of-Health Assessment Using a Near Real-Time Impedance Measurement Technique Under No-Load and Load Conditions", A dissertation submitted in partial fulfillment of the requirements for the degree of Doctor of Philosophy in Electrical Engineering, Montana State University, Apr. 2011, 288 pages.

Christophersen et al., "Rapid Impedance Spectrum Measurements for State-of-Health Assessment of Energy Storage Devices", INL/CON-11-22677 SAE 2012 World Congress & Exhibition, Apr. 2012, 12 pages.

Christophersen et al., "Pulse resistance effects due to charging or discharging of high-power lithium-ion cells: A path dependence study", Journal of Power Sources, 173 (2007) pp. 998-1005.

Xueyuan et al., "State Estimation of Lithium ion Battery Based on Electrochemical Impedance Spectroscopy with On-board Impedance Measurement System," IEEE Vehicle Power and Propulsion Conference, 2015, 5 pages.

Varnosfaderani et al., "Online Impedance Spectroscopy Estimation of a dc-dc converter connected Battery using an Earth Leakage Monitoring Circuit," 19th European Conference on Power Electronics and Applications, 2017, pp. p. 1-p. 10.

Varnosfaderani et al., "Online Impedance Spectroscopy Estimation of a Battery," 18th European Conference on Power Electronics and Applications, 2017, 10 pages.

Varnosfaderani et al., "A Comparison of Online Electrochemical Spectroscopy Impedance Estimation of Batteries," IEEE Access, vol. 6, 2018, pp. 23668-23677.

Ranieri et al., "Electronic Module for the Thermal Monitoring of a Li-ion Battery Cell through the Electrochemical Impedance Estimation," 22nd International Workshop on Thermal Investigations of ICs and Systems, Sep. 21-23, 2016, pp. 294-297.

Ran et al., "Prediction of State of Charge of Lithium-ion Rechargeable Battery with Electrochemical Impedance Spectroscopy Theory," 5th IEEE Conference on Industrial Electronics and Applications, 2010, pp. 684-688.

Qahouq et al., "Single-Perturbation-Cycle Online Battery Impedance Spectrum Measurement Method With Closed-Loop Control of Power Converter," IEEE Transactions on Industrial Electronics, vol. 64, No. 9, Sep. 2017, pp. 7019-7029.

Piret et al., "Tracking of electrochemical impedance of batteries," Journal of Power Sources, vol. 312, 2016, pp. 60-69.

Koch et al., "On-line Electrochemical Impedance Spectroscopy Implementation for Telecommunication Power Supplies," IEEE International Telecommunications Energy Conference, 2015, 6 pages.

Koch et al., "Impedance Spectroscopy for Battery Monitoring with Switched Mode Amplifiers," 16th International Power Electronics and Motion Control Conference and Exposition, Antalya, Turkey Sep. 21-24, 2014, pp. 496-501.

Koch et al., "Electrochemical Impedance Spectroscopy for Online Battery Monitoring—Power Electronics Control," 16th European Conference on Power Electronics and Applications, 2014, 10 pages.

Katayama et al., "Real-Time Electrochemical Impedance Diagnosis for Fuel Cells Using a DC-DC Converter," IEEE Transactions on Energy Conversion, vol. 30, No. 2, Jun. 2015, pp. 707-713.

Karden et al., "A method for measurement and interpretation of impedance spectra for industrial batteries", Journal of Power Sources, vol. 85, 2000, pp. 72-78.

Jaber A. Abu Qahouq, "Online Battery Impedance Spectrum Measurement Method," IEEE Applied Power Electronics Conference and Exposition, 2016, pp. 3611-3615.

Harting et al., "State-of-Health Diagnosis of Lithium-Ion Batteries Using Nonlinear Frequency Response Analysis," Journal of the Electrochemical Society, vol. 166, No. 2, 2019, pp. A277-A285.

Doan et al., "Intelligent Charger with Online Battery Diagnosis Function," 9th International Conference on Power Electronics-ECCE Asia, Jun. 1-5, 2015, pp. 1644-1649.

(56) References Cited

OTHER PUBLICATIONS

Din et al., "Online Spectroscopic Diagnostics Implemented in an Efficient Battery Management System," 16th Workshop on Control and Modeling for Power Electronics, 2015, 7 pages.

Din et al., "A Scalable Active Battery Management System With Embedded Real-Time Electrochemical Impedance Spectroscopy," IEEE Transactions on Power Electronics, vol. 32, No. 7, Jul. 2017, pp. 5688-5698.

Cho et al., "Battery Impedance Analysis Considering DC Component in Sinusoidal Ripple-Current Charging," IEEE Transactions on Industrial Electronics, vol. 63, No. 3, Mar. 2016, pp. 1561-1573.

Chen et al., "Sinusoidal-Ripple-Current Charging Strategy and Optimal Charging Frequency Study for Li-Ion Batteries", IEEE Transactions on Industrial Electronics, vol. 60, No. 1, Jan. 2013, pp. 88-97.

Breugelmans et al., "Odd random phase multisine electrochemical impedance spectroscopy to quantify a non-stationary behaviour: Theory and validation by calculating an instantaneous impedance value," Electrochimica Acta, vol. 76, 2012, pp. 375-382.

Brett Novak, "Developing an advanced, predictive battery health monitoring solution with a low-cost microcontroller solution," Texas Instruments, White Paper, Sep. 2012, 6 pages.

Zou et al., "Combined State of Charge and State of Health estimation over lithium-ion battery cell cycle lifespan for electric vehicles", Journal of Power Sources 273 (2015) pp. 793-803.

Ziemer et al., "Signals and Linear Systems," 2002, Chapter 2, pp. 56-123, Principles of Communications, 5th edition, John Wiley & Sons.

Zhu et al., "In-Situ Electrical Characterization of PEM Fuel Cells at Load", American Institute of Chemical Engineers (2007) 5 pages.

Zhang et al., "Cycling degradation of an automotive LiFePO4 lithium-ion battery", Journal of Power Sources, 196 (2011) pp. 1513-1520.

Yoo et al., "An Electrochemical Impedance Measurement Technique Employing Fourier Transform", Analytical Chemistry, vol. 72, No. 9 (May 2000) pp. 2035-2041.

Xing et al., "Prognostics and Health Monitoring for Lithium-ion Battery", Proceedings of the IEEE International Conference on Intelligence and Security Informatics, (2011) pp. 242-247.

Xing et al., "Battery Management Systems in Electric and Hybrid Vehicles", Energies 2011, 4, pp. 1840-1857.

Wu et al., "A Review on Fault Mechanisms and Diagnosis Approach for Li-Ion Batteries", Journal of Nanomaterials, Article ID 631263 (2015) 10 pages.

Waligo et al., "A Comparison of the Different Broadband Impedance Measurement Techniques for Lithium-Ion Batteries", Energy Conversion congress and Exposition (ECCE), IEEE (2016) 7 pages.

Weng et al., "On-board state of health monitoring of lithium-ion batteries using incremental capacity analysis with support vector regression", Journal of Power Sources 235 (2013) pp. 36-44.

Verbrugge et al., "Adaptive state of charge algorithm for nickel metal hydride batteries including hysteresis phenomena" Journal of Power Sources, 126 (2004) pp. 236-249.

Thomas et al., "Statistical methodology for predicting the life of lithium-ion cells via accelerated degradation testing", Journal of Power Sources, 184 (2008) pp. 312-317.

Tachibana et al., "Development of in situ a.c. impedance measurement system under constant-current conditions and its application to galvanostatic discharge of electrolytic manganese dioxide in alkaline solution" Journal of Power Sources 74 (1998) pp. 29-33.

Stroe et al., "Diagnosis of Lithium-Ion Batteries State-of-Health based on Electrochemical Impedance Spectroscopy Technique", Proceedings of the 2014 Energy Conversion Congress and Exposition (ECCE) IEEE Press, pp. 1576-4582.

Srivastav et al., "State-of-charge indication in Li-ion batteries by simulated impedance spectroscopy", J Appl Electrochem 47 (2017) pp. 22-236.

Socher et al., "Improving the functional safety of automotive batteries using in-situ impedance spectroscopy", Transportation Research Procedia 14 ( 2016) pp. 3661-3666.

Smyth, Brian, "Development of a Real Time Battery Impedance Measuring System," M.S. Thesis Montana Tech of the University of Montana, 2008, 128 pages.

Singh et al., "Fuzzy logic modeling of EIS measurements on lithium-ion batteries", Electrochimica Acta, 51 (2006) pp. 1673-1679.

Schweiger et al., "Comparison of Several Methods for Determining the Internal Resistance of Lithium Ion Cells", Sensors, 10, (2010) pp. 5604-5625.

Sazhin et al., "Enhancing Li-Ion Battery Safety by Early Detection of Nascent Internal Shorts", Journal of The Electrochemical Society, 164 (1), (2017) pp. A6281-A6287.

Salehen et al., "Development of battery management systems (BMS) for electric vehicles (EVs) in Malaysia", MATEC Web of Conferences, 90, 01001 (2017), AiGEV 2016, 8 pages.

Saha et al., "Comparison of Prognostic Algorithms for Estimating Remaining Useful Life of Batteries", Transactions of the Institute of Measurement and Control, vol. 31, Issue 3-4 (2009) 10 pages.

Raijmakers et al., "Crosstalk Interferences on Impedance Measurements in Battery Packs", IFAC-PapersOnline 49(11) (2016) pp. 042-047.

Rahmoun et al., "Determination of the Impedance of Lithium-Ion Batteries using Methods of Digital Signal Processing", Energy Procedia 46 (2014) pp. 204 213.

Pop et al., "State-of-the-art of battery state-of-charge determination", Measurement Science and Technology, 16 (2005) R93-R110.

Piller et al., "Methods for state-of-charge determination and their applications", Journal of Power Sources 96, 2001, pp. 113-120.

PCT International Search Report and Written Opinion of the International Searching Authority for PCT/US2010/038358, dated Dec. 31, 2010, 8 pages.

PCT International Search Report and Written Opinion of the International Searching Authority for PCT/US2011/035043, dated Aug. 10, 2011, 12 pages.

PCT International Search Report and Written Opinion of the International Searching Authority for PCT/US2010/038401, dated Dec. 31, 2010, 8 pages.

Pastor-Fernandez et al., "A Study of Cell-to-Cell Interactions and Degradation in Parallel Strings: Implications for the Battery Management System", Journal of Power Sources 329 (2016) pp. 574-585.

Okoshi et al., "Battery condition monitoring (BCM) technologies about lead-acid batteries", Journal of Power Sources 158 (2006) pp. 874-878.

Motloch et al., "High-Power Battery Testing Procedures and Analytical Methodologies for HEV's", 7, SAE Int. Passenger Cars Electron. Electr. Syst., vol. 111 (2002) pp. 797-802.

Lu et al., "A review on the key issues for lithium-ion battery management in electric vehicles", Journal of Power Sources 226 (2013) pp. 272-288.

Li et al., "Understanding the molecular mechanism of pulse current charging for stable lithium-metal batteries", Sci. Adv. 3, e1701246 (2017) 10 pages.

Le et al., "Lithium-ion Battery State of Health Estimation Using Ah-V Characterization", Annual Conference of the Prognostics and Health Management Society, (2011) 7 pages.

Kozlowski, James D., "A Novel Online Measurement Technique for AC Impedance of Batteries and Other Electrochemical Systems", IEEE (2001) pp. 257-262.

Kiel et al., Validation of single frequency Z measurement for standby battery state of health determination, IEEE, 2-3 (2008) 7 pages.

Karden et al., "A method for measurement of interpretation of impedance spectra for industrial batteries", Journal of Power Sources, 85 (2000) pp. 72-78.

Huet, F., "A review of impedance measurements for determination of the state-of-charge or state-of-health of secondary batteries", Journal of Power Sources 70, 1998, pp. 59-69.

Hlavac et al., "VRLA Battery Monitoring Using Conductance Technology", IEEE, (Dec. 3, 1995) pp. 284-291.

Hariprakash et al., "On-line monitoring of lead-acid batteries by galvanostatic non-destructive technique", Journal of Power Sources 137 (2004) pp. 128-133.

(56) References Cited

OTHER PUBLICATIONS

Hariprakash et al, "Monitoring sealed automotive lead-acid batteries by sparse-impedance spectroscopy", Proc. Indian Acad. Sci. (Chem. Sci.), vol. 115, Nos. 5&6 (Oct.-Dec. 2003) pp. 465-472.
Guha et al., "Remaining Useful Life Estimation of Lithium-Ion Batteries based on the Internal Resistance Growth Model" Indian Control Conference (ICC), (2017) pp. 33-38.
Garcia et al., "On-line State-of-Health and Remaining-Useful-Life Assessment of Batteries using Rapid Impedance Spectrum Measurements", 45th Power Sources Conference Proceedings, 7.3, 2012, pp. 115-118.
Fenton et al., "BSM Development Documentation Senior Project Final Report for the Idaho National Laboratory," May 2005, Montana Tech of the University of Montana, 21 pages.
Farmann et al., "Critical review of on-board capacity estimation techniques for lithium-ion batteries in electric and hybrid electric vehicles", Journal of Power Sources 281 (2015) pp. 114-130.
Egloff et al., "A Critical Analysis of an Instrumentation Current Sources", Cleveland : The International Society of Automation, 2013. 59th International Instrumentation Symposium, May 2013.
Carkhuff et al., "Impedance-Based Battery Management System for Safety Monitoring of Lithium-Ion Batteries", IEEE Transactions on Industrial Electronics, vol. 65, No. 8 (Aug. 2018) pp. 6497-6504.
Fasmin et al., "Review—Nonlinear Electrochemical Impedance Spectroscopy", Journal of the Electrochemical Society, vol. 164, No. 7 (2017) pp. H443-H455.
Lamb et al., "Determination of Battery Stability With Advanced Diagnostics," SAND2017-6959, Unlimited Release, (Jul. 2017), 56 pages.
Lamd et al., "Determination of Battery Stability With Advanced Diagnostics," (Report No. DOT HS 812 249), Washington, DC: National Highway Traffic Safety Administration, (Mar. 2016), 42 pages.
Love et al., "State-of-Health Monitoring of 18650 4S Packs With a Single-Point Impedance Diagnostic," Journal of Power Sources, vol. 266, (2014), pp. 512-519.
Donnellan et al., "Impedance Noise Identification", (May 2008) 72 pages.
Diard et al., "Impedance measurements of polymer electrolyte membrane fuel cells running on constant load", Journal of Power Sources, 74 (1998) pp. 244-245.
Diard et al., "EIS study of electrochemical battery discharge on constant load", Journal of Power Sources, 70 (1998) pp. 78-84.
Diard et al., "Constant load vs constant current EIS study of electrochemical battery discharge", Electrochimica Acta, vol. 42, Nos. 23-24 (1997) pp. 3417-3420.
Delaille et al., "Study of the 'coup de fouet' of lead-acid cells as a function of their state-of-charge and state-of-health", Journal of Power Sources, 158 (2006) pp. 1019-1028.
Cox et al., "Battery State of Health Monitoring, Combining Conductance Technology with other Measurement Parameters for Real-Time Battery Performance Analysis", IEEE, 19-2 (2000) pp. 342-347.
Christophersen et al.. "Effects of Reference Performance Testing during Aging Using Commercial Lithium-ion Cells," J. Electrochem Soc., 153(7) 2006, pp. A2406-A1416.
Christophersen et al., "Electrochemical Impedance Spectroscopy Testing on the Advanced Technology Development Program Lithium-ion Cells", 2002, IEEE Trans. Veh. Technol., pp. 1851-1855, 56(3).
Christophersen et al., "Battery Technology Life Verification Testing and Analysis", Idaho National Laboratory INL/ CON-07-12282 (Dec. 2007)12 pages.
Christensen et al., "Using on-board Electrochemical Impedance Spectroscopy in Battery Management Systems", World Electric Vehicle Journal, vol. 6—ISSN 2032-6653 (2013) pp. 0793-0799.
Cheng et al., "Battery-Management System (BMS) and SOC Development for Electrical Vehicles", IEEE Transactions on Vehicular Technology, vol. 60, No. 1, (Jan. 2011) pp. 76-88.
Cabrera-Castillo et al, "Calculation of the state of safety (SOS) for lithium ion batteries", Journal of Power Sources 324 (2016) pp. 509-520.
Brigham, "The Fast Fourier Transform", 1974, Prentice-Hall, Chapter 6 pp. 91-109.
Brigham, "The Fast Fourier Transform", 1974, Prentice-Hall, Chapter 13 pp. 198-223.
Brigham, "The Fast Fourier Transform", 1974, Prentice-Hall, Chapter 1 pp. 1-10.
Brigham, "The Fast Fourier Transform", 1974, Prentice Hall, Chapter 7 pp. 110-122.
Brauer et al., "Residential Energy Storage from Repurposed Electric Vehicle Batteries: Market Overview and Development of a Service-Centered Business Model", IEEE 18th Conference on Business Informatics, (2016) pp. 143-152.
Bose et al., "Lessons Learned in Using OHMIC Techniques for Battery Monitoring", IEEE (2001) pp. 99-104.
Bohlen et al., "Impedance Based Battery Diagnosis for Automotive Applications", 35th Annual IEEE Power Electronics Specialists Conference (2004) pp. 2192-2797.
Blidberg, Andreas, "Correlation between different impedance measurement methods for battery cells", KTH Chemical Science and Engineering (2012) 42 pages.
Belt et al., "Calendar and PHEV cycle life aging of high-energy, lithium-ion cells containing blended spinel and layered-oxide cathodes", Journal of Power Sources 196, 2011, pp. 10213-10221.
Barsukov et al., "Challenges and Solutions in Battery Fuel Gauging", www.ti.com/lit/ml/slyp086/slyp086.pdf, Power Management Workbook. Texas Instruments Inc., (2004), 10 pages.
Banaei et al., "Online Detection of terminal voltage in Li-ion Batteries via Battery Impulse Response", IEEE (2009) pp. 194-198.
Albrecht, Weston, "Battery Complex Impedance Identification with Random Signal Techniques," May 4, 2005, Montana Tech of the University of Montana, 99 pages.
Adany et al., "Switching algorithms for extending battery life in Electric Vehicles", Journal of Power Sources, 231 (2013) pp. 50-59.
"Impedance Measurement Box", INL R&D 100 Technologies—2011. [Online] Idaho National Laboratory. [Cited: Mar. 21, 2012.] http://www.inl.gov/rd100/2011/impedance-measurement-box/, 3 pages.
"Battery Test Manual for Plug-In Hybrid Electric Vehicles", INL/ EXT-07-12536, 2008, 67 pages.
"Battery Test Manual for Electric Vehicles", U.S. Department of Energy Vehicle Technologies Program, INL/EXT-15-34184, Revision 3 (Jun. 2015) 67 pages.
"Battery Test Manual for 38 Volt Mild Hybrid Electric Vehicles", U.S. Department of Energy Vehicle Technologies Program, IN/EXT-15-36567, Revision 0 (Mar. 2017) 70 pages.
"Battery Test Manual for 12 Volt Start/Stop Vehicles", U.S. Department of Energy Vehicle Technologies Program, INL/EXT-12-26503, Revision 1 (May 2015) 67 pages.
"Battery Calendar Life Eslimatory Manual, Modeling and Simulation", U.S. Department of Energy Vehicle Technologies Program, Revision 1, INL-EXT-08-15136, (Oct. 2012), 84 pages.
"1287 Electrochemical Interface", User Guide, Solartron Analytical (2001) 134 pages.
Chinese Office Action for Application No. 201780027941.6, dated Apr. 29, 2020, 31 pages.
Indian First Examination Report for Application No. 201817035077, dated Aug. 31, 2020, 5 pages.

* cited by examiner

APPARATUSES AND METHODS FOR TESTING ELECTROCHEMICAL CELLS BY MEASURING FREQUENCY RESPONSE

CROSS-REFERENCE TO RELATED APPLICATIONS

This application is a continuation of U.S. patent application Ser. No. 14/296,321, filed Jun. 4, 2014, now U.S. Pat. No. 10,379,168, issued Aug. 13, 2019 which application claims the benefit of U.S. Provisional Patent Application Ser. No. 61/831,001, filed Jun. 4, 2013, the disclosure of each of which is hereby incorporated herein in its entirety by this reference.

This application is related to U.S. patent application Ser. No. 12/772,880, filed May 3, 2010, now U.S. Pat. No. 8,352,204, which is a continuation-in-part of U.S. patent application Ser. No. 12/217,013, filed Jun. 30, 2008, now U.S. Pat. No. 8,150,643, which is a continuation-in-part of U.S. patent application Ser. No. 11/825,629, filed Jul. 5, 2007, now U.S. Pat. No. 7,395,163. This application is also related to U.S. patent application Ser. No. 13/438,741, filed Apr. 3, 2012, now U.S. Pat. No. 9,244,130, issued Jan. 26, 2016, U.S. patent application Ser. No. 12/813,750, filed Jun. 11, 2010, which claims benefit of U.S. patent application Ser. No. 61/186,358, filed Jun. 11, 2009, U.S. patent application Ser. No. 13/100,170, filed May 3, 2011, which claims benefit of U.S. patent application Ser. No. 61/330,766, filed May 3, 2010, and U.S. patent application Ser. No. 13/100,184, filed May 3, 2011, now U.S. Pat. No. 8,762,109, issued Jun. 24, 2014, which claims benefit of U.S. patent application Ser. No. 61/330,733, filed May 3, 2010. The disclosures of each of these applications are hereby incorporated herein in their entirety by this reference.

STATEMENT REGARDING FEDERALLY SPONSORED RESEARCH OR DEVELOPMENT

This invention was made with government support under Contract Number DE-AC07-05ID14517 awarded by the United States Department of Energy. The government has certain rights in the invention.

TECHNICAL FIELD

Embodiments of the present disclosure relate generally to methods and apparatuses for analysis of electrochemical cells and, more particularly, to analysis of the state of health of electrochemical cells using frequency responses.

BACKGROUND

Electrical energy storage devices (e.g., batteries, fuel cells, ultracapacitors, etc.) have become important subsystems for many military, space and commercial applications. Consequently, in situ diagnostics for accurate state-of-health estimations have also gained significant interest. For many applications, however, it is insufficient to monitor simple parameters such as voltage, current, and temperature to gauge the remaining capacity of the energy storage device. Knowledge of impedance and power capability also may be necessary for an accurate state-of-health estimation. An important component of in situ impedance monitoring is rapid measurements that minimally perturb the energy storage device.

Advanced techniques for real-time assessment of the impedance spectra for energy storage devices have been proposed. Many of these techniques can be implemented in an embedded device and periodically query the energy storage device to determine its state-of-health. For example, it has been shown that a shift in the impedance spectra of battery technologies strongly correlates to the corresponding pulse resistance and power capability.

One technique, referred to herein as Impedance Noise Identification (INI), disclosed in U.S. Pat. No. 7,675,293 to Christophersen et al., uses a random signal excitation covering a frequency range of interest and monitors a response. The input and response signals may be cross-correlated, normalized by an auto-correlated input signal, and then averaged and converted to the frequency domain through Fast Fourier Transforms. INI can be implemented on an embedded system and yield high-resolution data.

Another technique, referred to herein as Compensated Synchronous Detection (CSD), disclosed in U.S. Pat. No. 7,395,163 to Morrison et al., uses a sum-of-sines (SOS) input signal that adequately covers a frequency range of interest. The magnitude and phase at each frequency of the response signal is initially determined through synchronous detection. However, these data may be tainted by cross-talk error, so the response signal is reassembled with all the frequencies except the one of interest, and then subtracted from the original response signal and synchronously detected again. Generally, CSD may be more rapid than INI, but it may need three periods of the lowest frequency, and trades off resolution for speed of measurement.

Yet another technique, referred to herein as Fast Summation Transformation (FST), disclosed in U.S. patent application Ser. No. 12/217,013 to Morrison et al., also uses an SOS input signal that covers a frequency range of interest. However, to eliminate the cross-talk error, the frequency is increased in octave harmonic steps. Thus, no compensation is required and the response signal can simply be rectified relative to the sine and the cosine to establish the impedance spectra. Some attributes of FST are that it only requires a time record of acquired data covering one period of the lowest frequency, and the data processing algorithm is very simple. However, with FST the resolution in frequencies cannot be any finer than octave steps.

Battery performance degrades as a function of age, but the mechanisms responsible for failure are complex. Various different commercial fields (auto, military, space, etc.) are looking for ways to accurately assess a battery's state-of-health and estimate remaining life with a high degree of confidence. Many systems may require this assessment to be made in situ while minimally perturbing the battery so as not to create additional aging effects due to the measurement. However, in situ impedance monitoring presents a significant challenge. The difficulty is to accurately determine impedance in real time with minimal impact on battery life.

An accurate state-of-health meter would allow for a more efficient use of battery systems in various applications, which can have a significant economic benefit since good batteries are presently being discarded at regular intervals to ensure continuous operation. If a battery status monitor successfully projects life with a high degree of confidence, users will be able to keep batteries in operation longer, and also identify bad batteries much earlier in life as well.

DETAILED DESCRIPTION

Figure 1:
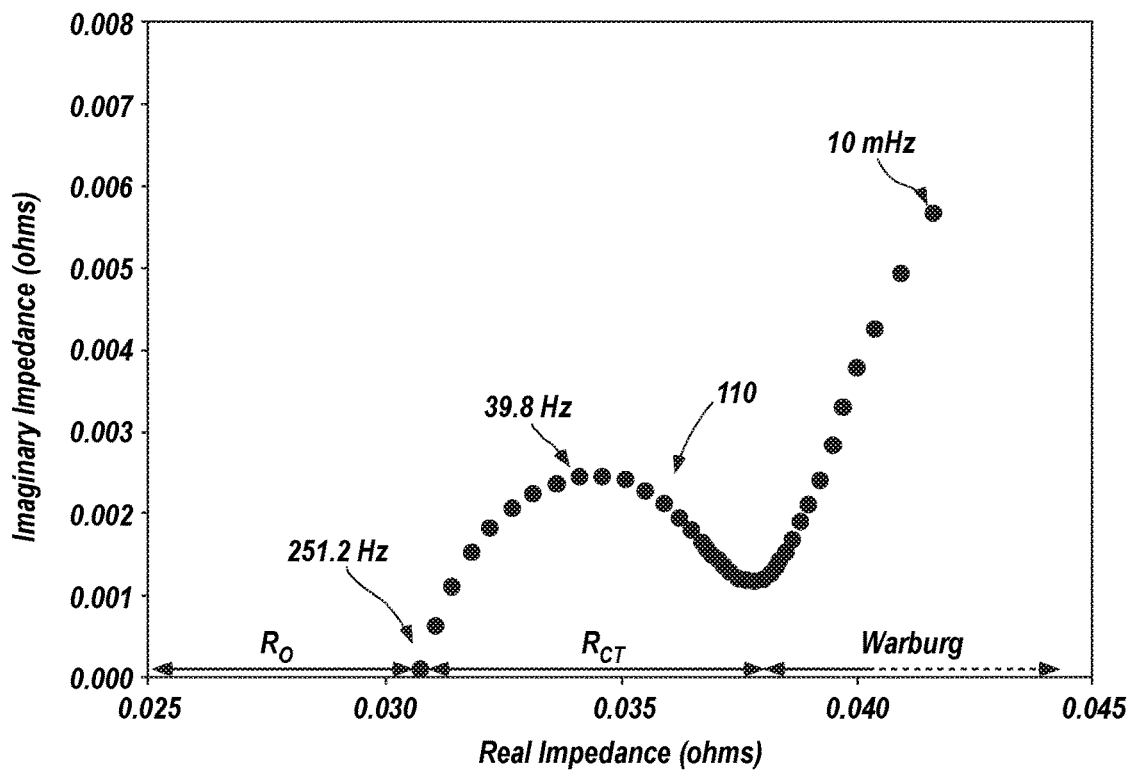
FIG. 1 illustrates a battery impedance plot of real impedance versus imaginary impedance.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

Elements, circuits, modules, and functions may be shown in block diagram form in order not to obscure the present disclosure in unnecessary detail. Moreover, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill would appreciate that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

When implemented with hardware, the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. When executing software for carrying out processes for embodiments described herein, a general-purpose processor should be considered a special-purpose processor configured for carrying out such processes. A processor may also be implemented as a combination of computing devices, e.g., a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

Those of ordinary skill in the art will understand that information and signals may be represented using any of a variety of different technologies and techniques. For example, data, instructions, commands, information, signals, bits, symbols, and chips that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus for carrying the signals, wherein the bus may have a variety of bit widths.

Figure 3:
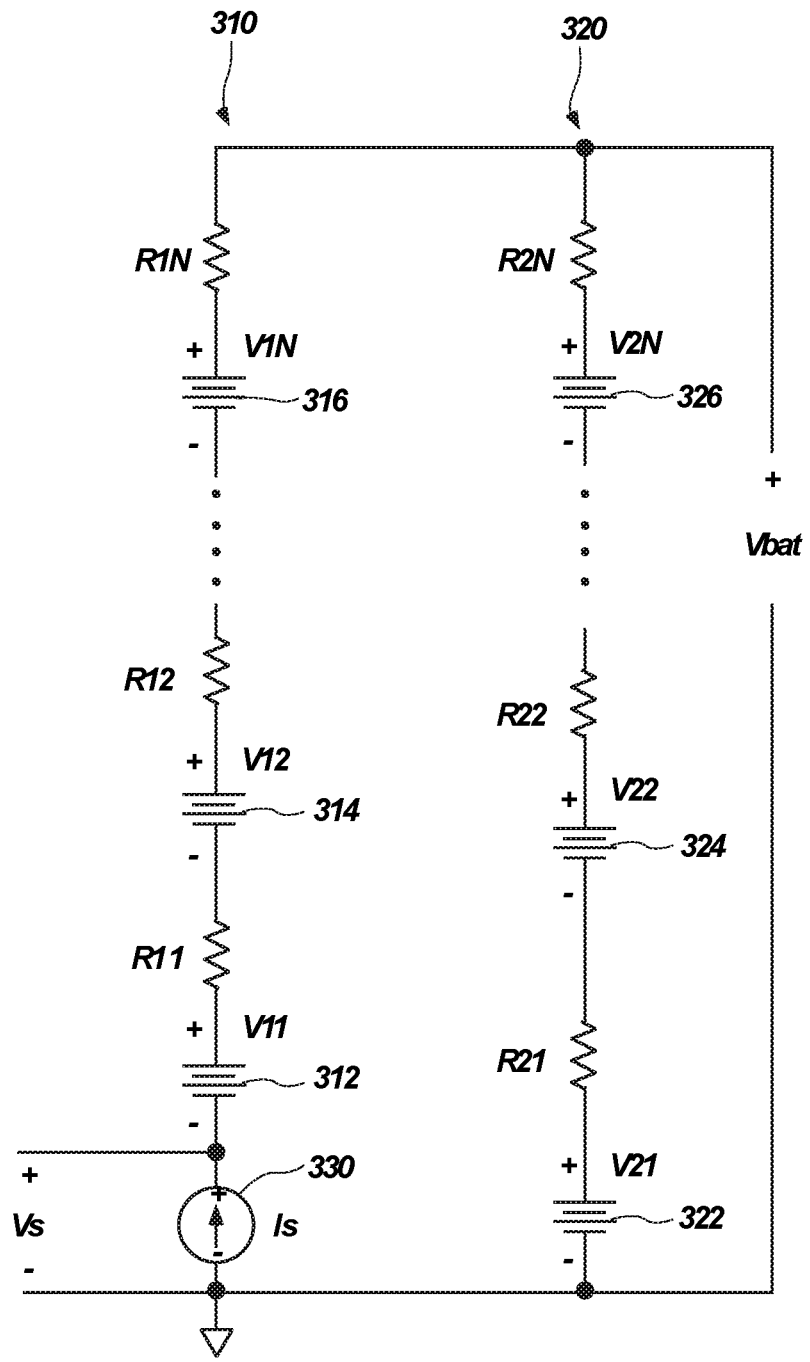
FIG. 3 illustrates a simplified case of two parallel strings of series impedance and cells.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. For example, where feasible elements in FIG. 3 are designated with a format of 3xx, where 3 indicates FIG. 3 and xx designates the unique element.

When describing circuit elements, such as, for example, resistors, capacitors, and transistors, designators for the circuit elements begin with an element type designator (e.g., R, C, M) followed by a numeric indicator. Circuit element numbers may be repeated on different drawings and are not to be considered the same element unless expressly indicated as such. In other words, a capacitor C1 on FIG. 1 is a different element from a capacitor C1 on FIG. 6. Power sources such as, for example, VDD and VCC as well as ground voltages may be generically indicated. When appropriate, these power signals may be described in detail. In other cases, the power signals may not be described, as it would be apparent to a person of ordinary skill in the art which power signal should be used. As a non-limiting example, it may be appropriate to maintain separate analog and digital grounds and a person of ordinary skill in the art would understand which is the appropriate ground for a specific circuit.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

As used herein, the term "mid-range voltage" means a voltage in a range near 50 volts. Thus, a mid-range voltage may include an average voltage of about 40 volts to 60 volts with a variation of about 90% to 99% met depending on the tolerances desired for a given system.

As used herein, the term "high-range voltage" means a voltage in a range near 300 volts. Thus, a high-range voltage may include an average voltage of about 250 volts to 350 volts with a variation of about 90% to 99% met depending on the tolerances desired for a given system.

For ease of description, electrochemical cell charge storage devices may generally be referred to herein as a batteries and a battery may include one or more electrochemical cells.

Headings are included herein to aid in locating certain sections of detailed description. These headings should not be considered to limit the scope of the concepts described under any specific heading. Furthermore, concepts described in any specific heading are generally applicable in other sections throughout the entire specification.

1. Electrochemical Impedance Spectroscopy

Battery health and health monitoring research have garnered considerable interest recently. Numerous methodologies for battery State of Health (SOH) estimation have been proposed with techniques ranging from simple numerical methods, autoregressive moving average filters to neural networks, support vector machines, extended Kalman filters and fuzzy logic. Many in situ SOH estimation techniques rely on directly measurable quantities such as voltage, current, and temperature. However, in many cases battery electrochemical impedance may give greater insight to the battery health.

Electrical Impedance Spectroscopy (EIS) measurements involve measuring a battery response to a known input signal, typically a sinusoid of known frequency. This input signal can be either a voltage signal or a current signal with the response measure being the complement (e.g., if the input signal is current then the response is voltage). Data processing then calculates the complex impedance of the battery at the input frequency. This process is generally performed at each desired frequency to create an array of the complex impedances. This process produces impedance measurements that range typically from 100 kHz to 10 mHz and may take from ten minutes to an hour to perform.

1.1. Battery Impedance Plots

The impedance spectrum is typically displayed graphically in a plot that is very similar to a standard Nyquist plot. Following the convention amongst electrochemical researchers, these plots differ in that the Y axis is the negative imaginary impedance and only the positive frequencies are plotted.

FIG. 1 illustrates a battery impedance plot 110 of real impedance versus imaginary impedance. The ohmic resistance value (Ro) is the real impedance value where the plot crosses the x axis. The mid-frequency semicircle, or "bubble," is the charge transfer resistance (Rct) and the low-frequency tail is often referred to as the Warburg tail.

Figure 2:
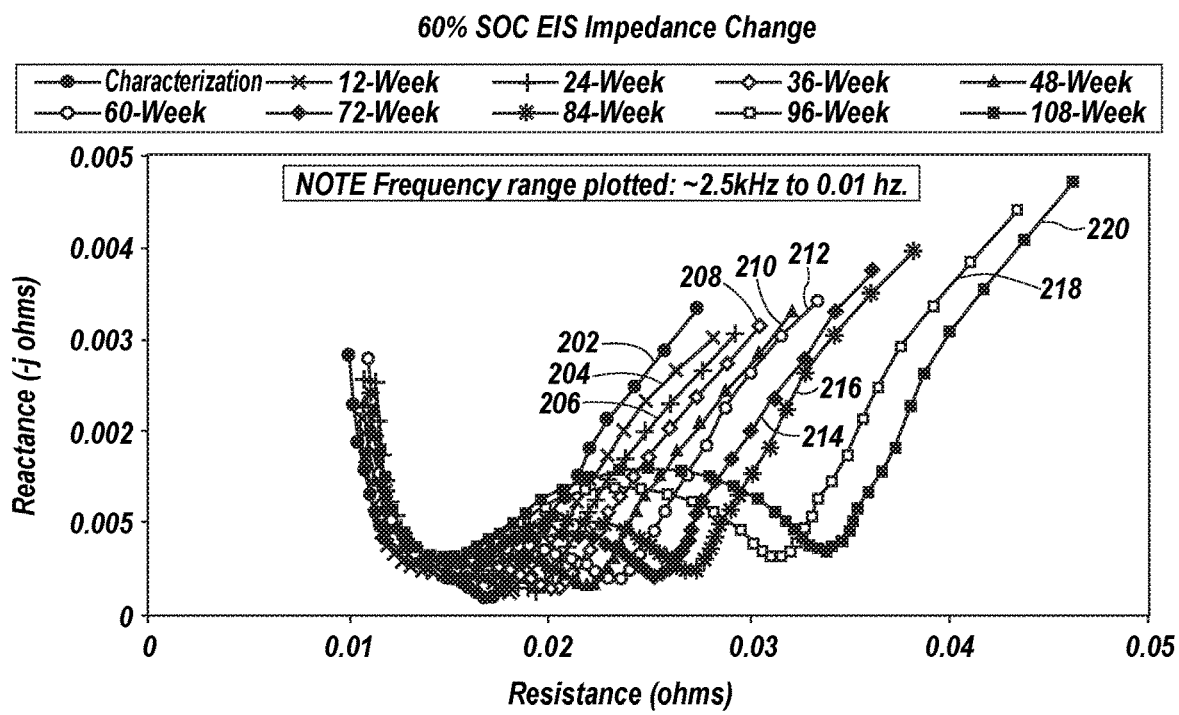
FIG. 2 illustrates battery impedance plots showing impedance growth as a cell ages.

FIG. 2 illustrates battery impedance plots showing impedance growth as a cell ages. Line 202 illustrates a baseline characterization. Lines 204, 206, and 208 illustrate measurements taken after 12, 24, and 36 weeks, respectively. Lines 210, 212, and 214 illustrate measurements taken after 48, 60, and 72 weeks, respectively. Lines 216, 218, and 220 illustrate measurements taken after 84, 96, and 108 weeks, respectively.

The semicircles, and consequently Rct, grows as the battery ages and can thus effectively estimate the battery SOH by analyzing movement of the semicircle over time. The plots show the high frequency tails that are absent in FIG. 1 but present in FIG. 2 resulted from measurement cables.

2. Some Impedance Measurement Techniques

A Fast Summation Transformation (FST) algorithm for a real-time Battery Impedance Identification System has been previously developed and described in U.S. Pat. No. 8,150,643, the disclosure of which is hereby incorporated herein by reference in its entirety, including all figures, tables and drawings.

Some embodiments of the present disclosure provide hardware architectures that modify and optimally implement the FST algorithm or a triads based Generalized Fast Summation Transformation (GFST) algorithm previously developed and described in U.S. Pat. No. 8,352,204, the disclosure of which is hereby incorporated herein by reference in its entirety, including all figures, tables and drawings.

Some possible constraints of the FST algorithm are that all the frequencies present in a Sum of Sinusoids (SOS) response of a system are octave harmonic and the sample frequency of acquired time record for that SOS is also coherent octave harmonic and at least 4 times the highest frequency present in the SOS. For the triads based GFST instead of the integer 2 for octaves it is integer 3 and the harmonics may be triad harmonic with the sample rate harmonic at 9 times the highest frequency. This attribute means that the data acquisition rate can be at least one tenth of that for used by other battery impedance algorithms.

Some embodiments include a structured implementation to exploit the attributes of the FST and GFST algorithms and also be conducive to an embedded system dedicated to real-time applications.

Many systems are developed with the goal of in situ and real-time battery impedance identification. One feature of this hardware for these concepts is a single, very high sample rate for signal generation and data acquisition. Most systems including FST and GFST need a high sample rate for signal generation. In CSD, FST and GFST signal generation, the SOS is synthesized with zero order hold pulses that are conditioned with a low pass smoothing filter. A lower sample rate may require a higher order and lower cut off smoothing filter. This lower sample rate may cause delay, attenuation and initial phase shift, especially in the higher frequencies of the SOS. Additionally, leakage past the smoothing filter by the higher frequencies present in the zero order hold pulses will introduce errors in the results. A very high sample rate for the zero order hold SOS generation may mitigate many of these issues. INI also needs a high sample rate for zero order hold generation of excitation noise. With INI, the smoothing filter will bandwidth limit the spectrum of the noise and if the zero order hold sample rate is too low then INI may not cover high enough frequencies in the response.

The computation requirements for both CSD and INI may need high sample rates for the acquired response time records. This computation requirement is because the mathematical operations of synchronous detection; auto and cross correlation using numerical integration and accuracy requires a small time step. Additionally, INI uses a Fast Fourier Transform (FFT) operation which includes a small time step to control aliasing. The mathematical operations and large data arrays associated with INI and CSD may utilize increased computational power over that needed for FST or GFST. The FST and GFST algorithms do not use integration and the sample rate of the acquired time record, while it must be coherent with the octave harmonic or triad harmonic SOS frequencies, can be as low as just 4 times (octaves) or 9 times (triads) the highest frequency within the SOS. The mathematical operations on the much smaller acquired time record for FST and GFST are pattern sign changes, summations and simple arithmetic operations on the numerical result for each frequency. As a result, the computational power required for FST and GFST are significantly less than required for INT or CSD.

3. In Situ Impedance Monitoring Concepts for Full-Size Battery Packs

Research has shown that the change of a battery's internal impedance spectrum correlates strongly with the health of a battery. An in situ system that can make a rapid measurement of a battery pack's internal impedance spectrum would provide an important metric that, along with other measurements could determine and track the overall health of the pack. One area that would greatly benefit from such technology is the automotive industry, where Lithium Ion battery packs in excess of 300 volts are often utilized as power storage on electric, hybrid electric, and plug-in hybrid electric vehicles.

Embodiments discussed herein have yielded software and hardware elements capable of accurately measuring impedance at voltage levels of about 15 volts. These relatively low-voltage embodiments may be easily modified to accommodate 24 volt batteries but beyond that the preamp is modified. A preamp for measurement techniques discussed herein is configured to withstand mid-range voltages of about 50 volts and the high-range voltages of some high-voltage full battery packs (e.g., about 300 volts). The preamp allows the existing low-voltage design to be augmented for use in applications for these mid-range voltage packs and high-range voltage packs.

Some embodiments include a hardware/software system that can, in near real time, measure the impedance spectra of a single cell using many methods. Three of these methods are discussed in more detail.

An Impedance Noise Identification (INI) system determines impedance through cross-correlations and Fast Fourier Transforms of a low-level charge neutral noise signal. It results in a very high resolution spectrum over the desired frequency range, and can be performed in less than 30 seconds.

A Compensated Synchronous Detection (CSD) technique determines impedance by synchronously detecting a sum-of-sines signal that has been compensated for cross-talk noise.

A Fast Summation Transformation (FST) technique determines impedance by deconvolving a uniquely harmonically related sum-of-sines signal using rectification and sample summation. Both the CSD and FST methods make measurement with a limited number of frequencies (e.g., about 12) strategically spread over the relevant range of interest and can be completed within one period of the lowest frequency. These techniques use the same hardware platform, which can perform measurements on batteries up to about 15 volts, the maximum seen in a standard 12 volt lead acid type automotive battery.

In general, lower voltage designs cannot be applied directly to the external positive and negative terminals of a battery whose voltage exceeds 15 volts. However, if the system were in situ and internal to the pack application, options become possible. A brute force approach would be using relay contacts to isolate a single cell from the pack and measure it. Thus, to ascertain the health of the entire pack would require every cell to be individually measured at 10 seconds each. For the quantity of individual cells needed to achieve the voltage requirements of automotive applications, this method may become prohibitive as it could no longer be considered real time. If the pack consists of parallel strings of series cells and if one could cause the strings to be open circuit so an impedance interrogation current source could be place in series, a measurement of impedance would be obtained.

FIG. 3 illustrates a simplified case of two parallel strings of series impedance and cells. A first string 310 includes batteries 312, 314, and 316 in series, with additional batteries possible as illustrated by the ellipses. A second string 320 includes batteries 322, 324, and 326 in series, with additional batteries possible as illustrated by the ellipses. A current source 330 is shown in the first string 310, which can be inserted as the interrogation current source. The circuit can be analyzed with a loop equation relative to Vs.

$$V_S = -\sum_{i=1}^{N} V_{1i} + \sum_{i=1}^{N} V_{2i} + I_S \left( \sum_{i=1}^{N} R_{1i} + \sum_{i=1}^{N} R_{2i} \right) \quad (1)$$

In Equation 1, the DC summations will either buck to zero or result in some small DC offset that the impedance analysis algorithms (e.g., FST, CSD, INI) will reject. As a result, the impedance analysis algorithms will obtain the result given by Equation 2.

$$Z_{CSD/INI} = \left( \sum_{i=1}^{N} R_{1i} + \sum_{i=1}^{N} R_{2i} \right) \quad (2)$$

It should be noted that the resistances in the summations of Equation 2 are expected to be complex. Additionally, the result is a composite of the whole pack as the individual cells are not being measured.

In FIG. 3 the pack analyzed includes two parallel strings of N series-connected cells and the impedance identified for that case is given by Equation 2. For a general case of M parallel strings of N series-connected cells, with the $j^{th}$ string being interrogated, Equation 3 gives that result.

$$Z_{(CSD/INI)j} = \left( \sum_{i=1}^{N} R_{ji} \right) + \left( \sum_{k(\neq j)=1}^{M} \left( \sum_{i=1}^{N} R_{ki} \right)^{-1} \right)^{-1} \quad (3)$$

Notice that in Equation 3 the first term is the series impedance of the string being interrogated and that is added to the parallel combination of all the remaining strings. Thus, to obtain the first term for a given string, that string must be interrogated, but one also gets the parallel combination of all the remaining strings as an additive term. If the process of Equation 3 is applied to each string a system of equations is obtained in terms of the string impedances (sum of all battery impedances for a given string). However, these equations cannot lead to individual string impedances, but it is possible to back out the ratios of string impedances. A simpler approach will get the individual string impedances.

If the pack has three or more strings, then individual string identification is possible. Assume that, via switching, three strings can be isolated in the pack and an interrogation current source switched into the ground leg of any given string.

Figure 4:
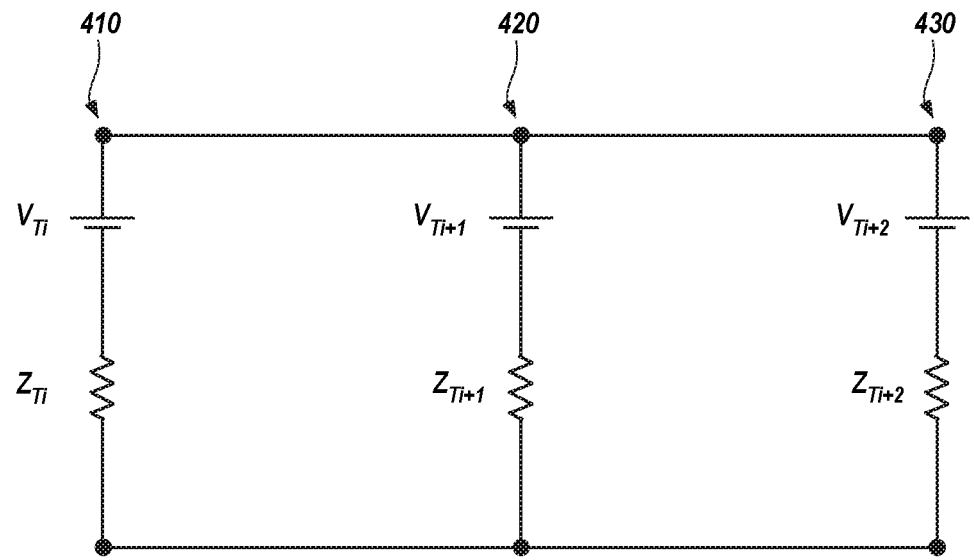
FIG. 4 illustrates three isolated strings whose string impedances are to be identified.

FIG. 4 illustrates three isolated strings (410, 420, and 430) whose string impedances are to be identified. In FIG. 4, $V_{T_i}$ is the total of the $i^{th}$ string battery voltage and $Z_{T_i}$ is the total of the $i^{th}$ string battery impedance. The string impedances to be identified are: $Z_{T_i}$, $Z_{T_{i+1}}$ and $Z_{T_{i+2}}$.

Figure 5A:
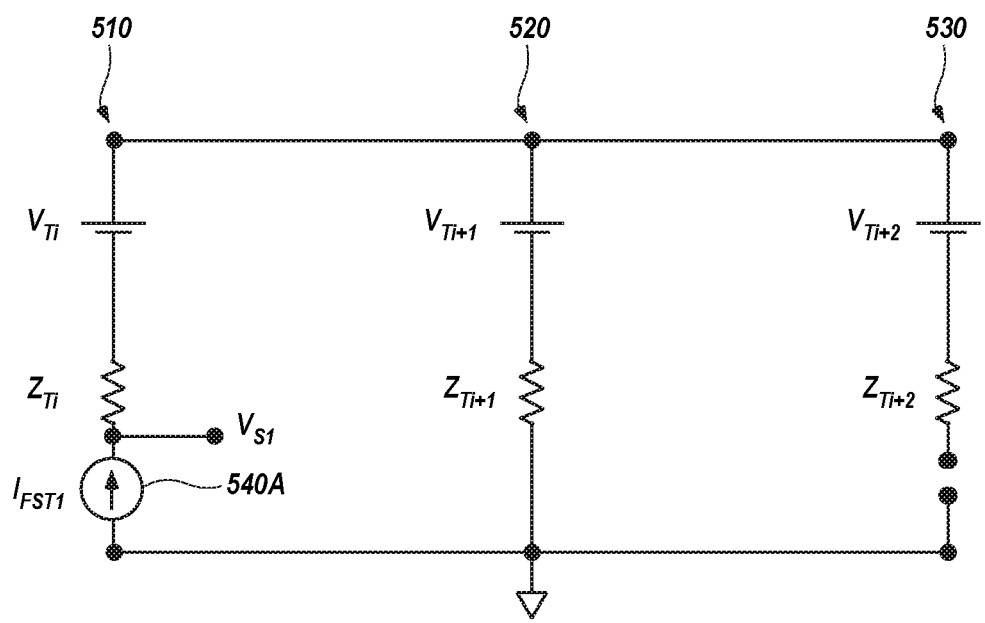
FIGS. 5A-5C illustrate the circuit of FIG. 4 configured for various relationships of impedances.

FIG. 5A illustrates the circuit configured to obtain a first relationship of impedances shown in FIG. 4. Three isolated strings (510, 520, and 530) whose string impedances are to be identified are illustrated with an interrogation current source 540A inserted in the first isolated string 510.

Writing the first simple loop Equation:

$$V_{S_1} = I_{FST_1}(Z_{T_i} + Z_{T_{i+1}}) - V_{T_i} + V_{T_{i+1}}$$

Assume: $V_{T_i} = V_{T_{i+1}}$, $V_{S_1}$ is measured, $I_{FST_1}$ is known:

$$\frac{V_{S_1}}{I_{FST_1}} = K_1 = (Z_{T_i} + Z_{T_{i+1}}) \quad (4)$$

Figure 5B:
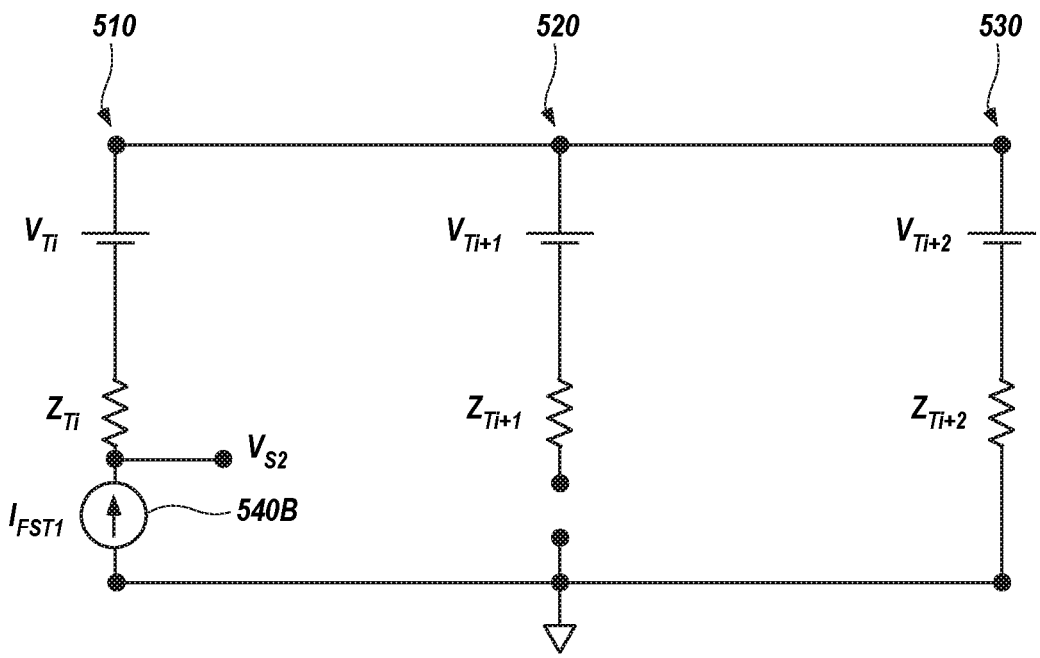

FIG. 5B illustrates the circuit configured for a second relationship of impedances shown in FIG. 4. Three isolated strings (510, 520, and 530) whose string impedances are to be identified are illustrated with an interrogation current source 540B inserted in the first isolated string 510. In the same manner as the second simple loop Equation 5 yields:

$$\frac{V_{S_2}}{I_{FST_1}} = K_2 = (Z_{T_i} + Z_{T_{i+2}}) \quad (5)$$

Figure 5C:
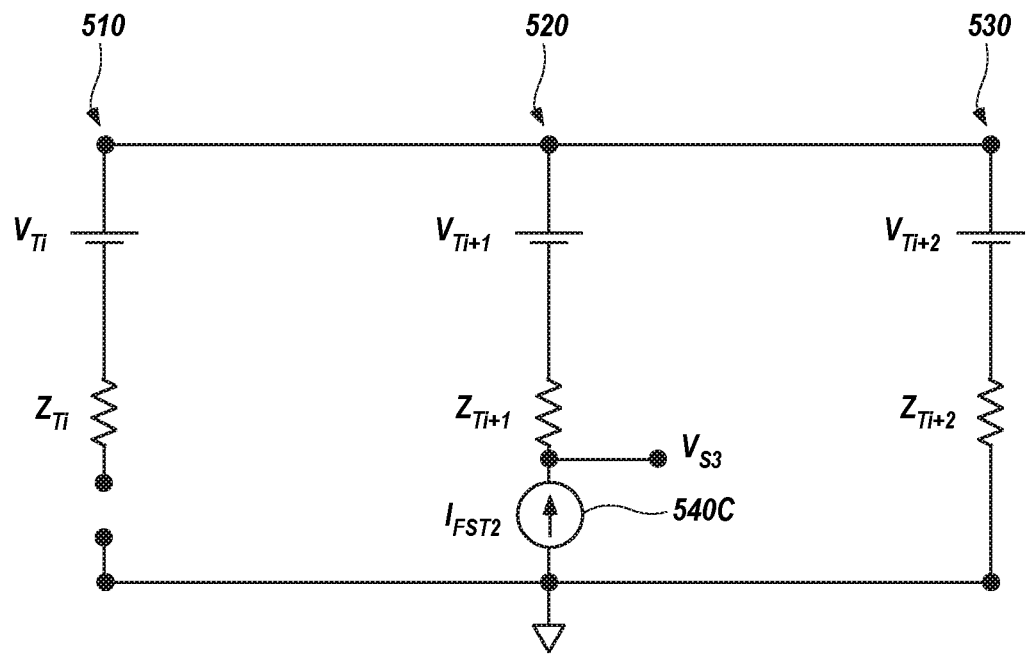

FIG. 5C illustrates the circuit configured for a third relationship of impedances shown in FIG. 4. Three isolated strings (510, 520, and 530) whose string impedances are to be identified are illustrated with an interrogation current source 540C inserted in the second isolated string 520. Also in the same manner, the last Equation is obtained:

$$\frac{V_{S_3}}{I_{FST_2}} = K_3 = (Z_{T_{i+1}} + Z_{T_{i+2}}) \quad (6)$$

Equations 4, 5, 6 are solved for $Z_{T_i}$, $Z_{T_{i+1}}$ and $Z_{T_{i+2}}$:

$$\begin{bmatrix} Z_{T_i} \\ Z_{T_{i+1}} \\ Z_{T_{i+2}} \end{bmatrix} = \frac{1}{2} \times \begin{bmatrix} 1 & 1 & -1 \\ 1 & -1 & 1 \\ -1 & 1 & 1 \end{bmatrix} \begin{bmatrix} K_1 \\ K_2 \\ K_3 \end{bmatrix} \quad (7)$$

$$Z_{T_i} = \frac{1}{2}(K_1 + K_2 - K_3)$$

$$Z_{T_{i+1}} = \frac{1}{2}(K_1 - K_2 + K_3)$$

$$Z_{T_{i+2}} = \frac{1}{2}(-K_1 + K_2 + K_3)$$

As long as there are at least three parallel strings, then the individual string impedance can be identified. Additionally, if there are more than three parallel strings then there will be multiple combinations of three strings. For example, with four parallel strings there are four ways to take three strings at a time. With additional measurement time, these multiple results could be averaged. This technique does require the ability to isolate those three strings and insert a current source into the various ground legs. The measured voltage is right across the current source and there is no excessive DC voltage in this measurement as the battery voltage bucks itself out.

Details related to a hardware architecture and related processes for high voltage applications are discussed below.

4. Embedded System Architecture for Battery Impedance Identification

Embodiments of the present disclosure include a system capable of measuring the impedance spectrum of a battery or other energy storage device in as little as ten seconds. An Impedance Measurement Device (IMD) can be configured to use a Sum of Sines (SOS) signal to measure all of the component frequencies in parallel in one period of the lowest frequency, as discussed above. The methodologies related to SOS are generically referred to herein as Harmonic Compensated Synchronous Detection (HCSD) after the general name of the processing algorithm.

Figure 6:
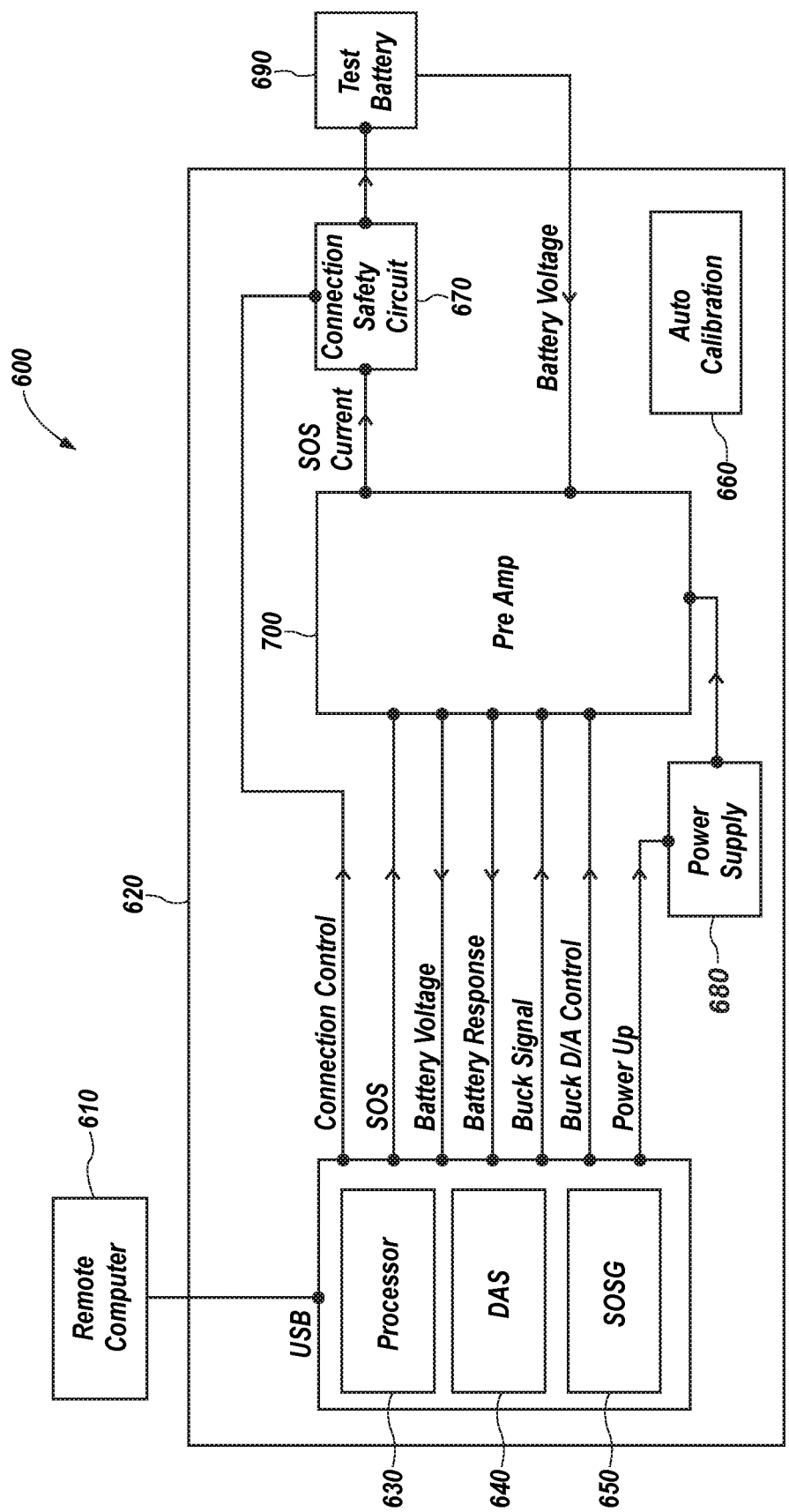
FIG. 6 illustrates a general block diagram of a system with an Impedance Measurement Device (IMD) according to an embodiment of the present disclosure.

FIG. 6 illustrates a general block diagram of a system 600 with an Impedance Measurement Device (IMD) 620, according to an embodiment of the present disclosure.

The system 600 for real-time battery impedance spectrum measurement may include a processor 630, an SOS Generator (SOSG) 650; a Data Acquisition System (DAS) 640; a power supply 680 and a preamplifier 700. An auto calibration module 660 may be included in some embodiments under control of the processor 630. Details about auto calibration are discussed more fully below in combination with FIG. 18.

Figure 7:
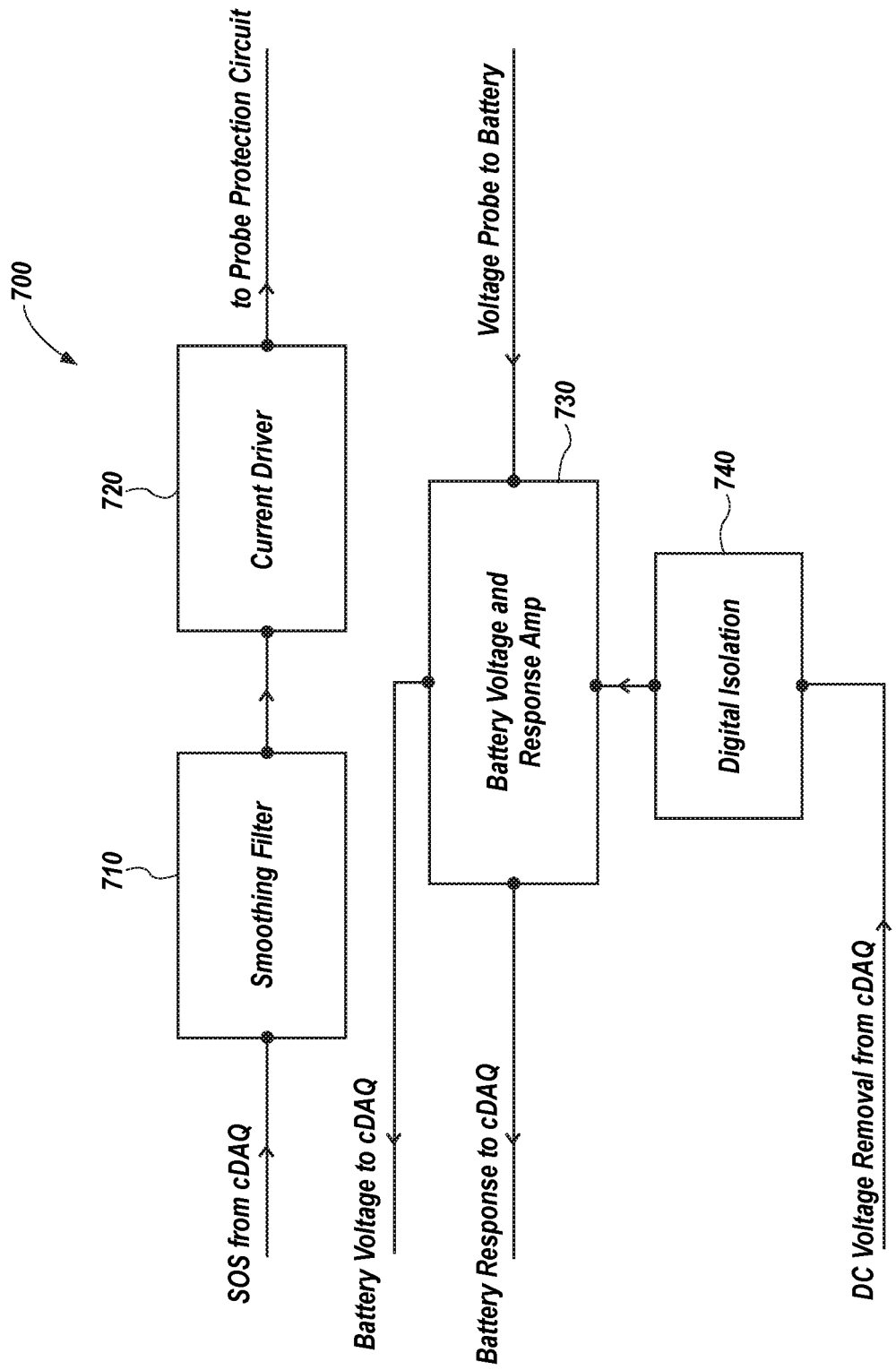
FIG. 7 illustrates details of a preamplifier that may be used in combination with the system of FIG. 6.

FIG. 7 illustrates details of a preamplifier 700 that may be used in combination with the system 600 of FIG. 6. The preamplifier 700 may include a smoothing filter 710, one or more current drivers 720, a voltage and response amplifier 730, and a digital isolation module 740. FIGS. 6 and 7 are described together.

A user may control the IMD 620 from a remote computer 610 via a Universal Serial Bus (USB) interface or other suitable interface, such as, for example, hardwire serial interfaces, hardwire parallel interfaces, and wireless interfaces (e.g., WiFi, ZIGBEE®, BLUETOOTH®).

The processor 630 may be used to synchronize and control the DAS 640, the SOSG 650 and the preamplifier 700 as per a schedule and control parameters dictated by the remote computer 610. As a non-limiting example, the processor 630 may interface with the remote computer 610 to download desired parameters and commands and upload various measured data. As non-limiting examples, the processor 630, or other devices not shown such as general purpose memory, includes adequate buffer memory to hold an acquired battery response time record until processed, hold the desired number of battery impedance spectrums for archive, hold system control and interface software; hold high resolution SOS samples, and hold the impedance spectrum control parameters.

The processor 630 may be configured to accept downloaded impedance spectrum control and calibration parameters and upload to the remote computer 610 archived battery impedance spectrum data under direction of the remote computer 610. Additionally, the IMD 620 may be able to be controlled via a human interface on the remote computer 610 or the IMD 620 for the purpose of inputting control constraints to the IMD 620, performing embedded system diagnostics, calibration, or performing manual impedance spectrum acquisition. The IMD 620 may implement a minimum of three point magnitude and phase calibration for each frequency within the SOS. As non-limiting examples, the IMD 620 may utilize the FST or GFST data processing algorithms for battery impedance spectrum as discussed above.

When a measurement is executed, the DAS 640 may send out a digital signal to a power supply relay to power up the rest of the system (e.g., the preamplifier 700 and a connection safety circuit 670). Next, the DC battery voltage may be measured by the voltage and response amplifier 730 in the preamplifier 700 and input to the DAS 640 as the analog signal "Battery Voltage." The DAS 640 or the processor 630 may digitize the voltage and may send the digitized result to the remote computer 610.

The remote computer 610 or processor 630 may then processes the measured DC battery voltage and uses the DAS 640 to send a series of digital words (e.g., "Buck Signal", "Buck D/A Control" in FIG. 6 and "DC voltage Removal" in FIG. 7) to the preamplifier 700 to generate a DC bias voltage to subtract from the DC voltage response from the overall response of the battery.

When a battery 690 under test is excited with the SOS current, the voltage that appears at its terminals is the battery voltage plus the tiny voltage drop of the SOS current acting on the internal impedance of the battery 690. It is this SOS voltage drop that, when captured and processed, will yield the spectrum of the battery impedance. The challenge is that the battery voltage can be as much as two orders of magnitude greater than the SOS voltage drop. Thus, to accurately detect that signal, the battery voltage is subtracted out prior to measuring the SOS voltage drop allowing all the bits of resolution of the A/D convertor to focus on the desired signal to greatly improve accuracy. This subtraction of the battery voltage may be accomplished by measuring the battery voltage prior to the application of the SOS current and then feeding back a computer generated buck voltage that is subtracted with a differential amplifier from the total battery voltage to yield only the SOS voltage.

Once the DC bias voltage has been removed from the overall battery response the remote computer 610 or the processor 630 may send a digital signal to the connection safety circuit 670 to connect the battery 690 to current drivers in the preamplifier. With the preamplifier 700 connected to the battery 690, the remote computer 610 or processor 630 sends a measurement signal such as, for example, an "SOS" signal or other suitable measurement signal to the preamplifier 700.

The SOS signal may be smoothed out using the smoothing filter 710, then fed into the current driver 720, which converts the signal into a current ("SOS Current" in FIG. 6).

The voltage and response amplifier 730 in the preamplifier 700 detects the "Battery Voltage," and subtracts the DC "Buck" voltage to become the "Battery Response" as a signal that may be digitized by the DAS 640. The resultant battery response may be used by various algorithms discussed herein to generate the impedance spectrum.

In one embodiment, the IMD 620 may be able to process a battery impedance spectrum with at least 15 frequencies of resolution for FST and 11 frequencies for GFST (based upon triads) when the start frequency is 0.1 Hz. In addition, the IMD 620 may be able to support a dither feature of high spectrum resolution with dither steps as fine as 21/4 for FST and 31/4 for GFST based upon triads. For suitable results, the SOS time record may be as low as one period of the lowest frequency and the IMD 620 may be able to process a SOS with a start frequency of as low as 0.01 Hz or a stop frequency as high as 5 kHz.

The SOSG 650 may, under control of the processor 630, generate a zero order hold synthesis (explained more fully below in connection with FIGS. 13A-13 D) of the SOS as an input to the preamplifier 700 and may include an average of about 0.05% of the RMS value. As a non-limiting example, a sample rate for the SOSG Digital to Analog Convertor (DAC) may be configured at least one-hundred times the highest frequency in the SOS and compatible with the smoothing filter 710 within the preamplifier 700.

In one embodiment, the SOSG 650 under control of the processor can synthesize a sample clock to be used by the DAS 640 that is four times the highest frequency within the SOS, coherent with that frequency for FST, and nine times the highest frequency and coherent with that frequency for GFST. The SOSG 650 may have a programmable signal level for the DAC output to the smoothing filter 710, which enables the processor 630 to control the SOS RMS current level to the battery being tested.

The DAS 640 may be configured with 16 bits of resolution and accept an external sample clock from the SOSG 650 with clock frequency that could range, for example, from 1 kHz to 100 kHz. The DAS 640 may accept an enable signal from the processor 630 to start acquiring data concurrent with the application of the SOS current signal to the battery 690 being tested. The DAS 640 may accept the analog battery voltage signal that has been conditioned by the preamplifier 700 for digitizing. The DAS 640 may include a buffer memory to hold a sample of the digitized battery voltage signal for uploading to memory (not shown). Each of the acquired samples may become part of the time record array that is input into the FST algorithm. Additionally, the DAS 640 may acquire a measurement of the DC voltage and case temperature of the test battery 690 prior to the application of the SOS current.

When an SOS current is not being sent to the test battery 690 the connection to that test battery 690 can be disconnected via relay contact isolation in the connection safety circuit 670 and that isolation may be greater than about 100 Megaohms. That isolation relay may have a contact open or close delay time of about 0.5 second. In some embodiments, the relay operation delay time can be configured not to interfere with either the SOS current excitation or data acquisition for the test battery 690.

Additionally, the SOS current leads may be configured as a twisted pair and be protected with a fuse. The preamplifier 700 may utilize a full differential battery voltage sense and may incorporate a method to bias out the common mode battery voltage from the batteries response to the SOS current excitation. This biasing will enable the full 16 bits of resolution to be focused upon the test batteries response to the SOS current rather than the average battery voltage. The preamplifier 700 differential voltage sensing leads may be shielded with ground at the preamplifier 700, floated at the test battery, and have at minimum 2 k ohm isolation resistors located at the connection to the terminals of the test battery 690.

The preamplifier 700 input signal may be the zero order hold SOS signal from the SOSG 650. The preamplifier 700 may include an active Butterworth low pass filter as the smoothing filter 710 and include about 1 db of attenuation at 8 kHz and 60 db of attenuation to the frequencies introduced by the zero order hold upon the SOS signal. Additionally, the preamplifier 700 may include circuitry to monitor the case temperature of the test battery and provide that analog signal to the DAS 640. All grounds in the PRAMP may be brought to a single point chassis ground.

In some embodiments, the IMD 620 may be configured to interface to the terminals of the test battery 690 via a "4 wire interface" whereby there are 2 wires dedicated to carry the SOS interrogation current and 2 separate wires dedicated to sensing the battery voltage. The 2 SOS current conducting wires to the test battery 690 may be fused and isolated via relay contacts such that when SOS current is not sent to the battery, both contacts will provide substantially complete isolation for these 2 leads. The 2 voltage sensing leads may each include a series isolation resistor of greater than or equal to 2 k ohm and located at the connection to the test battery.

The impedance spectrum data passed to the host computer shall be in any suitable format, such as, for example, Comma Separated Values (CSV) format. Each individual spectrum may include a time stamp, an information header, and the data may include the frequencies, the real part of the impedance, the imaginary part of the impedance and the common mode battery voltage for that spectrum. Additional data that may be included are the SOS RMS current; the magnitude and phase calibration constants.

Figure 8:
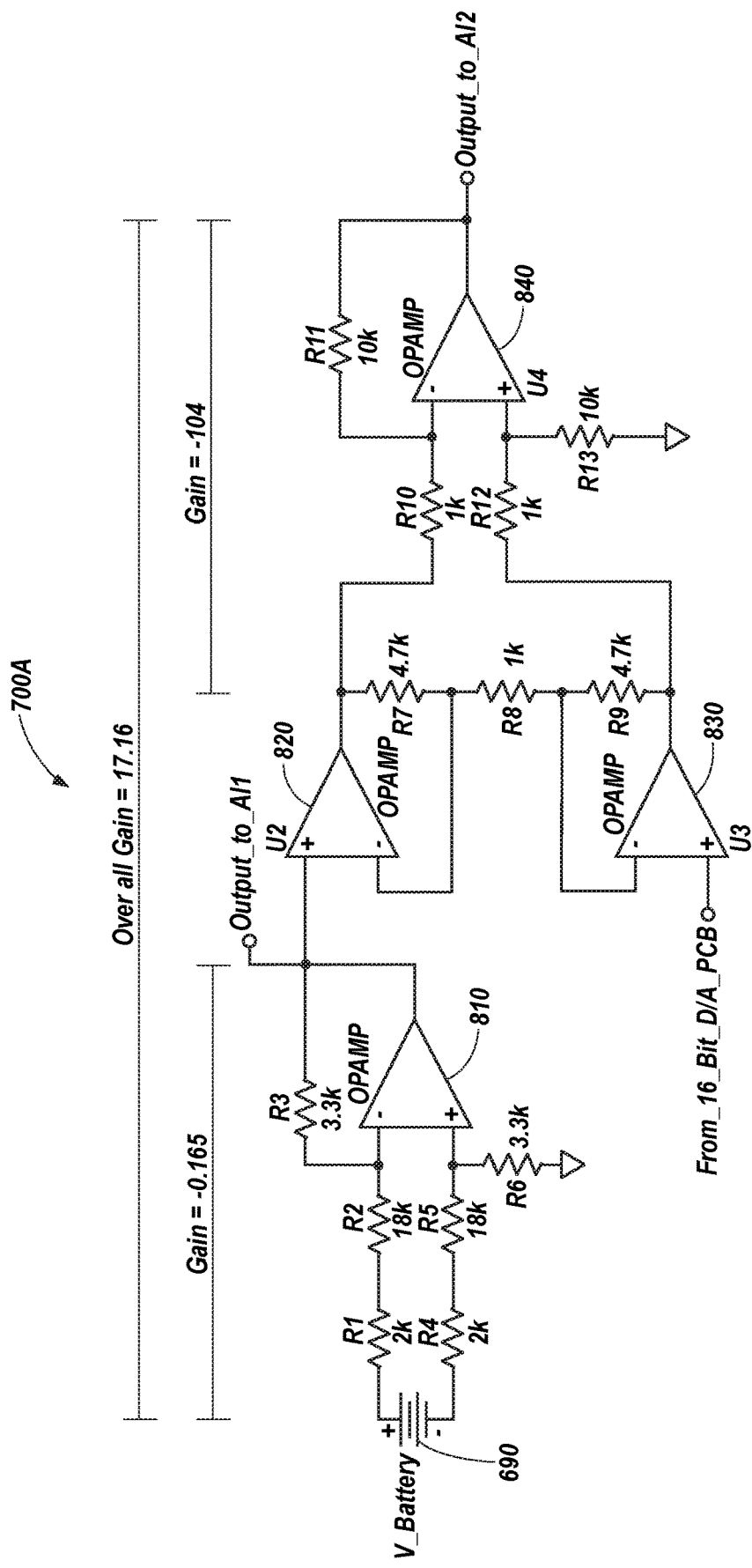
FIG. 8 illustrates a circuit diagram of a preamplifier suitable for use with mid-range voltage systems.

FIG. 8 illustrates a circuit diagram of a preamplifier 700A suitable for use with mid-range voltage systems. FIG. 8 illustrates connection of the test battery 690 to a first amplifier 810. The output of the first amplifier 810 may be returned to the DAS 640 (FIG. 6) as the battery voltage signal. A second amplifier 820 may be used to condition the battery voltage and set an appropriate voltage for comparison to a buck signal from the DAS 640.

The buck signal from the DAS 640 is input to a third amplifier 830 to define the voltage that should be compared to the output of the second amplifier 820. The buck voltage generation may also have a software component. Prior to the application of the SOS current the computer will iterate the buck voltage until the SOS voltage reaches zero to within an error tolerance at which point the feedback is frozen. Also, to mitigate noise, all the circuit boards of the preamplifier 700A may be configured as multi-layer boards with planes for power and ground. Additionally, analog signals may be sent between the DAS 640 and the preamplifier 700A as full differential signals and their ground is common only at a single point ground.

The preamplifier 700A may be configured to accommodate 50V batteries. As a non-limiting example, the first amplifier 810 forms a first stage differential amplifier acting as an attenuator with a gain set to about 0.165. Thus, the voltage sent to the DAS 640 is within a range of about +/−10 volts, which is compatible with the DAS 640 in this embodiment. A fourth amplifier 840 may be configured with a second stage gain of about 104 to get the SOS voltage compatible with an input range of about +/−0.5V as set for that channel on the DAS 640.

Additionally, software may be included to determine if the voltage probe is hooked up correctly. The first stage may be configured to be fully tolerant of 50V batteries fully floated or grounded, as well as hooked up forwards or backwards. The current driver 720 (FIG. 7) may be made tolerant of 50V by having its DC power supplies at +55 and −5 volts. The preamplifier 700 may also includes protection circuitry to prohibit the application of the 50V battery hooked up backwards to the current test leads as −50V applied to the current driver may destroy it. This protection may be accomplished with an isolation relay (not shown) with two NO contacts and two NC contacts. The 2 NC contacts allow a differential amplifier to observe the battery voltage. The output of that amplifier may be converted to a logic signal with a comparator and that signal may be configured to gate a bi-level logic signal from that will only allow the NO contacts to close and connect the current driver 720 to the test battery 690 if the differential amplifier observes the right polarity of the battery voltage. That differential amplifier may be biased so that when the NC contacts open and the NO contacts close the amplifier will not change polarity.

With a +55V power supply the current driver amplifiers may dissipate significantly more power than in lower voltage applications. To address this, the system may be configured with four current driver stages with each stage limited to share an average SOS current of 0.25 ARMS for a total average maximum of 1.0 ARMS.

Figure 9:
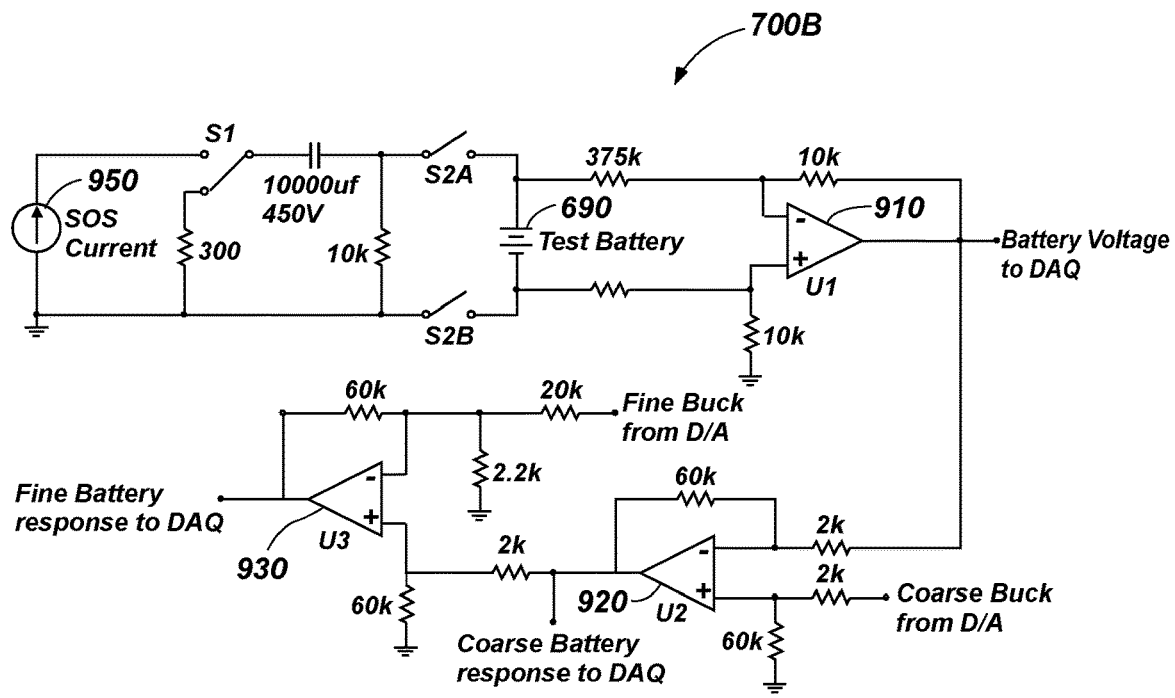
FIG. 9 illustrates a circuit diagram of a preamplifier suitable for use with high-range voltage systems.

FIG. 9 illustrates a circuit diagram of a preamplifier 700B suitable for use with high-range voltage systems. To start a measurement relay contacts S2A and S2B close. Relay contact S1 remains connected to the 300 ohm resistor. The 10000 of capacitor between will charge up to the voltage of the test battery 690. When the voltage drop across the 300 ohm resistor goes to zero the relay contact S1 will switch to an SOS current 950 from the DAS 640 (FIG. 6).

FIG. 9 illustrates connection of the test battery 690 to a first amplifier 910. The output of the first amplifier 910 may be returned to the DAS 640 (FIG. 6) as the battery voltage signal. In the embodiment of FIG. 9, a coarse buck signal and a fine buck signal are used from the DAS 640. A second amplifier 920 creates a difference between the battery voltage from the first amplifier 910 and the coarse buck signal from the DAS 640. A third amplifier 9-20-930 creates a difference between the output of the second amplifier 920 and the fine buck signal from the DAS 640. The output of a third amplifier 930 is returned to the DAS 640 as the battery response signal.

Because the capacitor is blocking the DC battery voltage the current source will not see the full battery voltage but it will see the capacitor voltage response to the SOS current 950. Because the SOS current 950 is charge neutral the current source will start with an opposing voltage of zero and, over the duration of the SOS, it will raise up to a peak and return back to zero. As long as that opposing voltage seen by the current source is within the power supply limits, that current will flow into the battery 690 and the battery response can be acquired and processed to obtain an impedance spectrum. After the measurement is complete relay contacts S2A and S2B open to disconnect the battery 690. Relay contact S1 switches back to the 300 ohm resistor allowing the capacitor to discharge through the 300 ohm and 10 k ohm resistors. Simulations indicate that 10 second SOS spectra at current levels 250 mA or less can be acquired. It may take several seconds for the capacitor to charge up. A safety circuit may be included to ensure that the capacitor is charged up before the SOS current 950 is connected to the battery 690.

Figure 10:
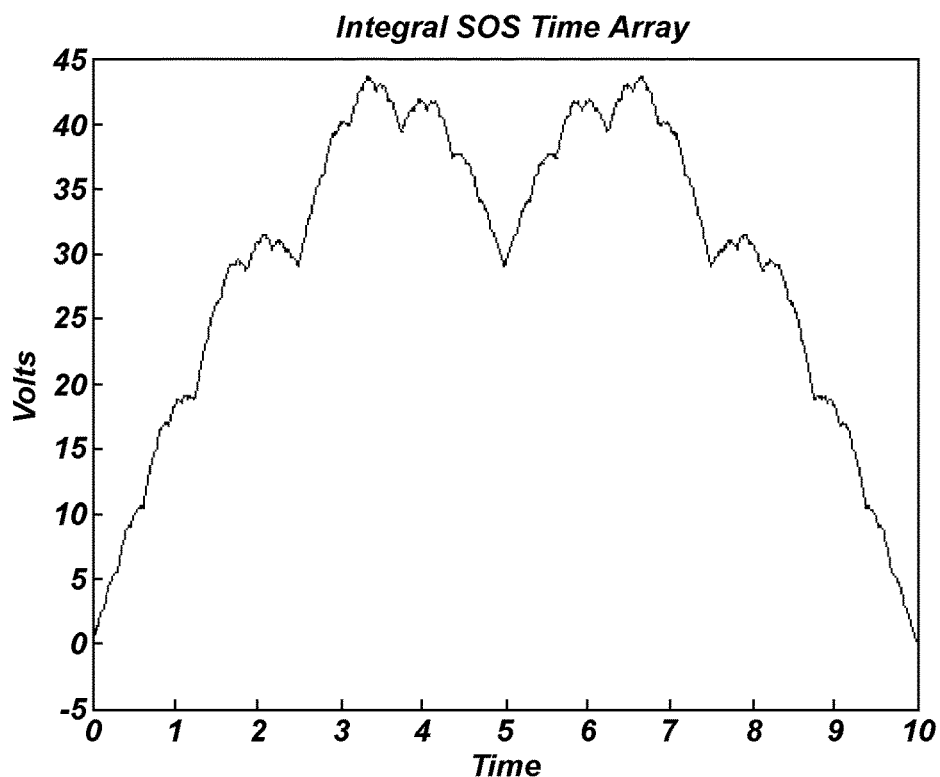
FIG. 10 illustrates results of a Matlab simulation of a response of the preamplifier of FIG. 9 to an SOS current of a 10-second duration.

FIG. 10 illustrates results of a Matlab simulation that estimates a perfect capacitor voltage response to a 250 mA RMS SOS current of 10-second duration. As seen in FIG. 10 the maximum voltage will be about 45V. Thus, the current driver design discussed above with respect to FIG. 8 and voltages of about +55 and −5 could apply. Another approach that could eliminate the offset power needed for the current drivers would be to include some negative time with the SOS current (i.e., including a portion of the SOS excitation current prior to the onset of measurement at time equals zero) as it will reduce the positive voltage peak and add some negative voltage. This technique will also have the feature of improving the low frequency response of the measurement.

Additionally, the non-ideal characteristics of the coupling capacitor should be carefully considered. Typical limitations of the capacitor are ESR and leakage current. As long as the ESR is in the low ohms range, which is usually the case, it will not be a problem but accommodating leakage current may be a challenge. Very low leakage current flowing into a really stiff current source (i.e., a high source impedance) could elevate the voltage beyond the power supply limit and destroy the power op-amp. Buck current compensation would involve measuring the leakage current and biasing the current drivers to sink the leakage current. An approach that will likely mitigate this issue would be a combination reducing the "stiffness" of the current source and buck current compensation. In FIG. 9 with contacts S2A and S2B closed, the coupling capacitor will charge up. The residual voltage across that resistor after charge up is from the leakage current. Thus, the leakage current can be measured and the current drivers biased to sink it when contact S1 is switched. As with the preamplifier buck voltage, the bias current would be held constant during measurement time when the SOS current is driving the test battery. Any leakage current shift during the measurement would be accommodated by the reduced source impedance of the current driver.

A model of the measurement system was configured to include source impedance on the current driver (20 k ohm), a non-ideal coupling capacitor (leakage resistance and ESR from typical vendor data of a capacitor data sheet. The model represents the measurement system where the relay contacts of FIG. 9 are indexed and the measurement is under way. Circuit analysis of the model was performed and a recursive model was derived that was excited with the same duration, RMS level and sample rate of SOS current used with an actual measurement. A Matlab time domain solution was obtained for the current source voltage, the coupling capacitor voltage, and the test cell voltage. The measurement was configured as a 10 second run (15 frequencies starting at 0.1 Hz) with 1 second of negative time and a RMS level of 0.25 A RMS. The voltage time record obtained for the test cell was processed (via Matlab) with HCSD. It was assumed that the coupling capacitor is blocking a battery voltage of 300V. Thus, the total capacitor voltage will be 300V minus the time record of capacitor voltage computed during the simulation.

Figure 11A:
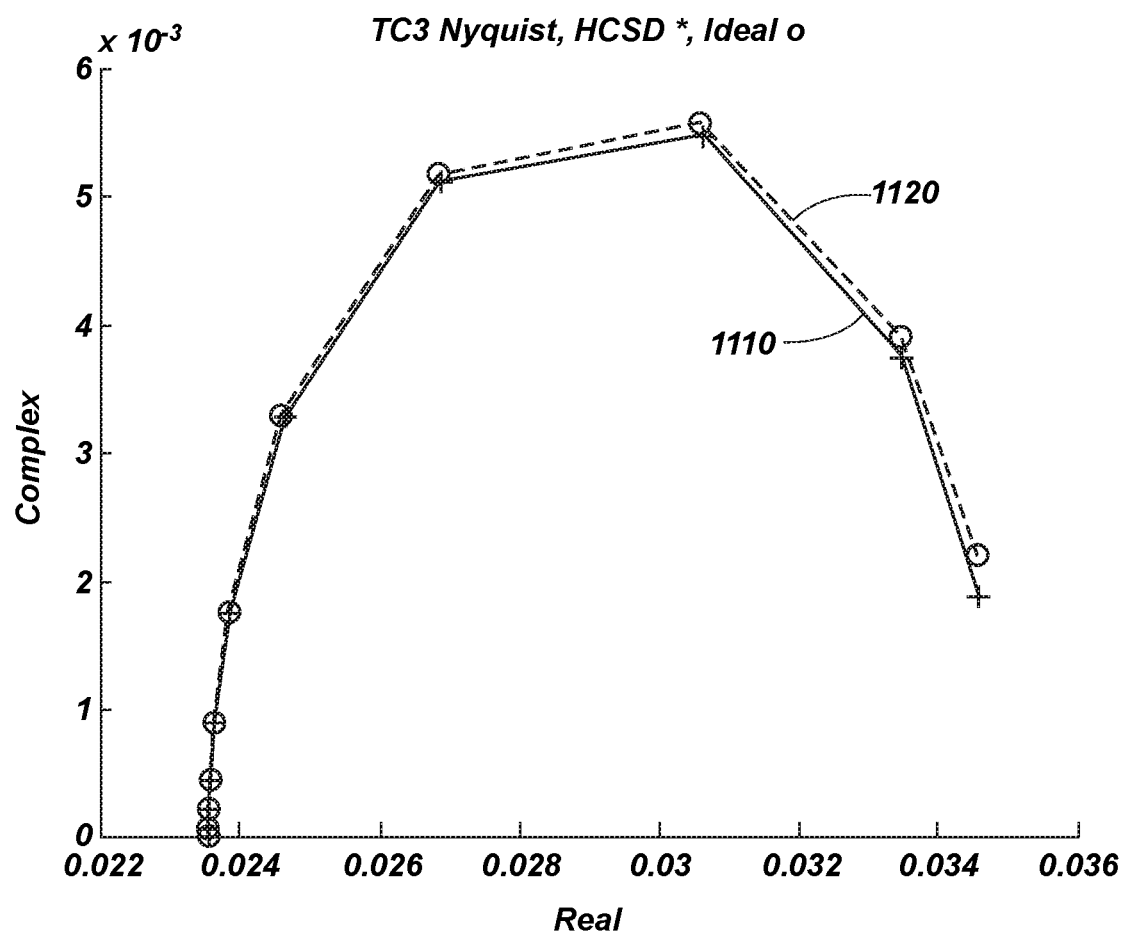
FIGS. 11A-11C illustrate simulation results for a model of the preamplifier circuit of FIG. 9.
Figure 11B:
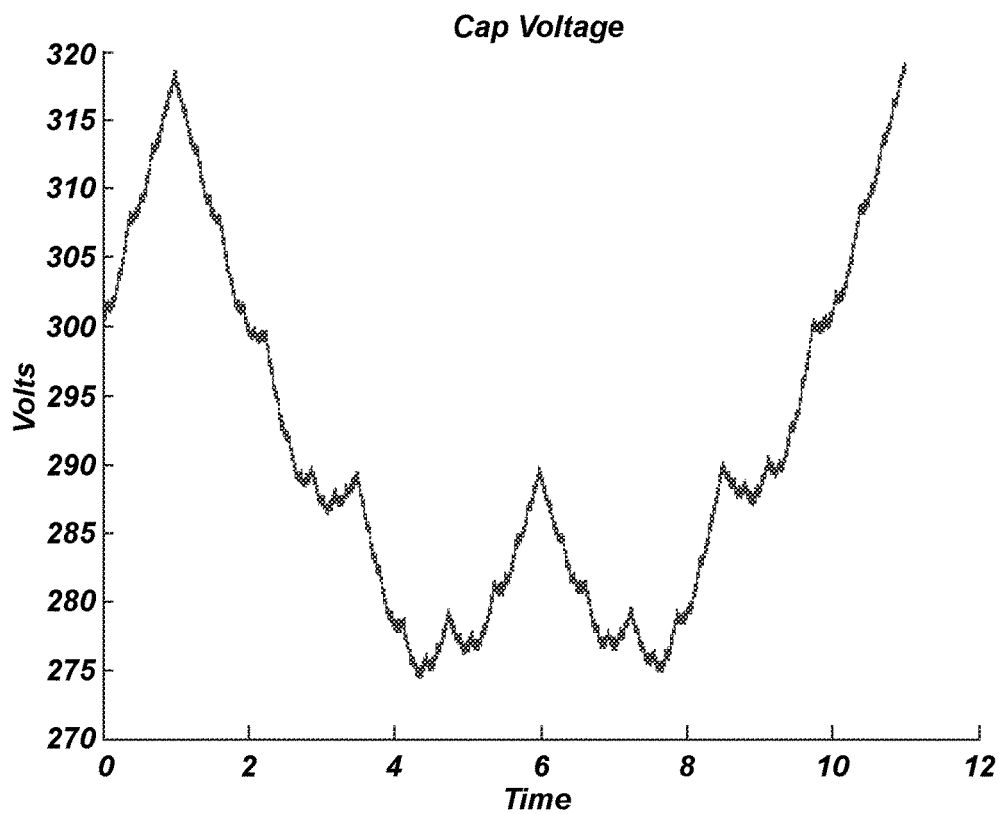
Figure 11C:
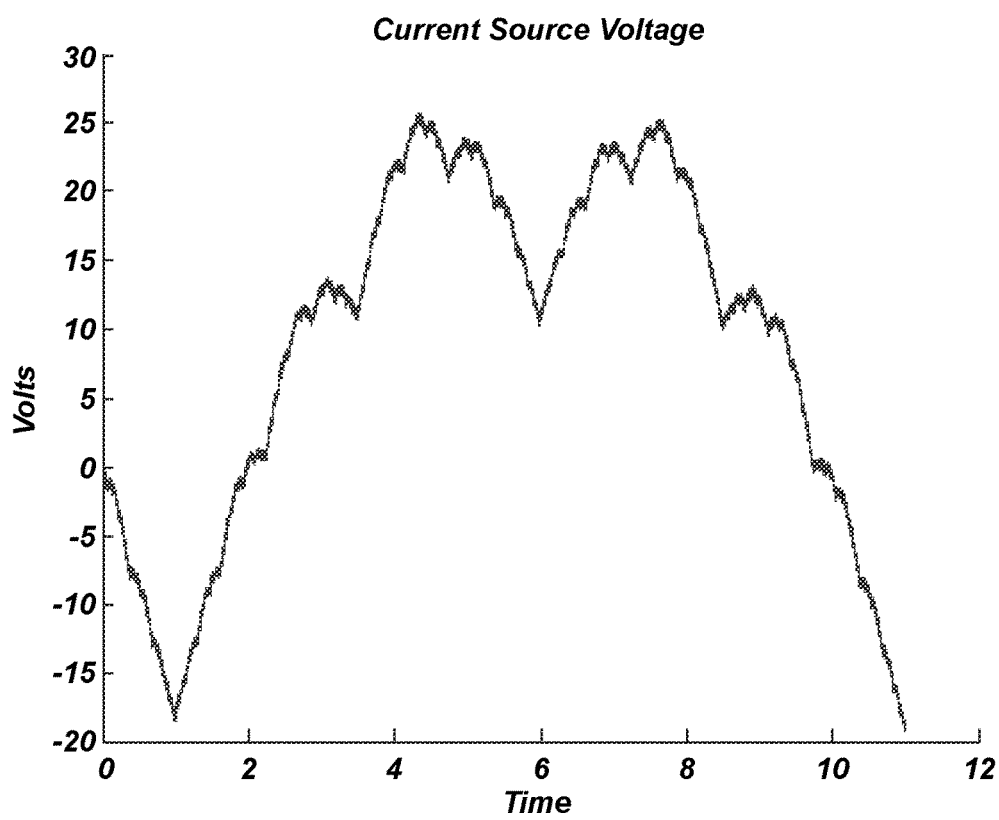

FIGS. 11A-11C illustrate simulation results for the model of the preamplifier 700A of FIG. 9. As seen in FIG. 11A, the coupling circuit does degrade the measurement by a small, but acceptable, amount. This degradation is apparent from an HCSD curve 1110 being slightly lower than an ideal curve 1120. FIG. 11B illustrates the voltage on the blocking capacitor. FIG. 11C illustrates the voltage at the current driver.

5. Measurement Discrepancy

The impedance measurements obtained with the IMD 620 may exhibit discrepancies compared to EIS measurements on the same test cell. The measurements from an IMD 620 may underestimate the imaginary portion of the impedance.

Figure 12:
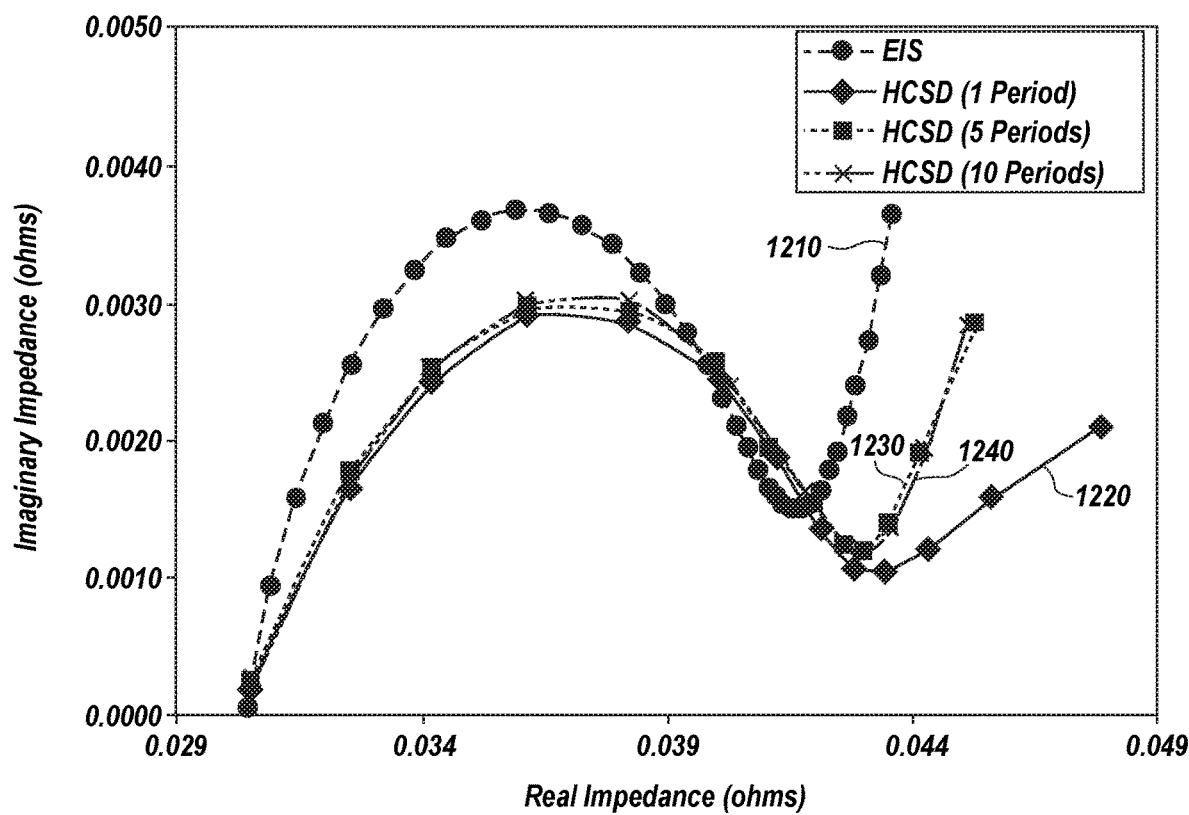
FIG. 12 illustrates a difference between measurements obtained from the IMD and EIS measurements.

FIG. 12 illustrates a difference between measurements obtained from the IMD 620 and EIS measurements. Curve 1210 illustrates an impedance spectrum obtained from conventional EIS measurements. Curve 1220 illustrates measurements using an HCSD algorithm using one period on the IMD 620. Curve 1230 illustrates measurements using an HCSD algorithm using five periods on the IMD 620. Curve 1240 illustrates measurements using an HCSD algorithm using ten periods on the IMD 620. As can be seen, using more than one period can decrease the discrepancy between the measurements on the IMD 620 and EIS measurements.

Measurement results using multiple periods reduced the low frequency discrepancies in the Warburg tail. These discrepancies may have arose from a startup transient and were eliminated with multiple periods of the lowest frequency in the SOS and resulted in the transient response settling out. The multiple periods did not, however, eliminate the underestimation of the reactance. Calibration techniques are used in some embodiments of the present disclosure to account for these discrepancies.

6. IMD Calibration

Initial calibration efforts involved a single linear gain and offset correction applied uniformly at all frequencies to the impedance response magnitude as obtained via HCSD. A one-point correction was applied to the phase component. Note that while the IMD results are typically displayed and analyzed in Cartesian coordinates (e. g., real and imaginary) the back end processing acts upon the impedance in polar form (e.g., magnitude and phase). This initial technique was developed to correct for system gains to accommodate tolerances in components (e.g., typical resistor tolerances are around ±5%). This technique involved measuring three current shunts and calculating an averaged single gain/offset correction for the magnitude and "zeroing out" the phase. This approach, however, resulted in the aforementioned discrepancies.

Linear regression techniques defined for calibration generally are not optimal. Deviations from normality or errors that are not independent can result in a non-optimal fit in a least squares sense.

Another general calibration approach involves an error correcting feedback during normal operation. This adaptive, or self-calibration technique corrects the measurement against some a priori optimizing methodology. This technique generally eliminates the need for offline calibrations but requires significant development effort to realize an effective optimization methodology. Therefore, new techniques are required to obtain effective calibration results.

6.1. Concept for IMD Calibration

An improved calibration method calculates a gain and offset correction at each frequency. The calibrated response is more accurate because the HCSD measurement response at each frequency has a unique correction factor, but will result in the calibration being performed at all of the target frequencies. The improved calibration method uses non-inductive shunts to more closely match a purely resistive assumption.

Additionally, the input SOS will be advanced one time step to mitigate the zero-order hold effect arising from the analog conversion of the digital signal discussed below in connection with FIGS. 13A-13D. In addition, the SOS signal will be pre-emphasized to mitigate attenuation from the smoothing filter. As the imaginary portion of the impedance exhibits the greatest discrepancies, the calibration method exercises the system over both magnitude and phase.

The calibration is generally defined in the polar format with the calibration applied to magnitude and phase. Although batteries and other energy storage devices exhibit considerable nonlinearities, the method assumes linearization about an operating point and performing small signal analysis. Because the excitation SOS current RMS is small relative to the rated current levels an assumption can be made that the total system is linear with respect to this approach and thus the measurement is of the form:

$$R(\omega_i) = [SOS(\omega_i) \angle \phi_{SOS}(\omega_i) \angle \phi_{SOS}(\omega_i)][H(\omega_i) \angle \phi_H(\omega_i)]$$
$$[CD(\omega_i) \angle \phi_{CD}(\omega_i)][Z(\omega_i) \angle \phi_Z(\omega_i)][A(\omega_i) \angle \phi_A(\omega_i)]$$

Rearranging to group the magnitude and phase terms together yields: $R(\omega_i) = SOS(\omega_i) \| H(\omega_i) \| CD(\omega_i) \| Z(\omega_i) \| A(\omega_i) + \angle \phi_{SOS} + \angle \phi_H(\omega_i) + \angle \phi_{CD}(\omega_i) + \angle \phi_Z(\omega_i) + \angle \phi_A(\omega_i)$ Where: $R(\omega_i)$ is the measurement response at frequency $\omega_i$ $SOS(\omega_i) \angle \phi_{SOS}(w_i)$ is the SOS magnitude and phase at frequency $\omega_i$ $H(\omega_i) \angle \phi_H(\omega_i)$ is the smoothing filter magnitude and phase at frequency $\omega_i$ $CD(\omega_i) \angle \phi_{CD}(\omega_i)$ is the current driver response magnitude and phase at frequency $\omega_i$ $Z(\omega_i) \angle \phi_Z(\omega_i)$ is the desired impedance magnitude and phase at frequency $\omega_i$ $A(\omega_i) \angle \phi_A(\omega_i)$ is the preamp response magnitude and phase at frequency $\omega_i$ It follows from the assumption of linearity at each frequency $\omega_i$ that the magnitudes all multiply and the phase angles all add. In addition, It can be observed that the SOS magnitude and phase angle at each frequency can be preset.

The smoothing filter 710 and response of the preamplifier 700 are determined by design, component characteristics, and tolerance. The first part of the calibration is to mitigate the zero order hold delay inherent in the computer generation of the SOS by advancing the SOS by one time step. Thus, time equal to zero the SOS starts at time equal to $\Delta t$, the sample time step, instead of zero.

Figure 13A:
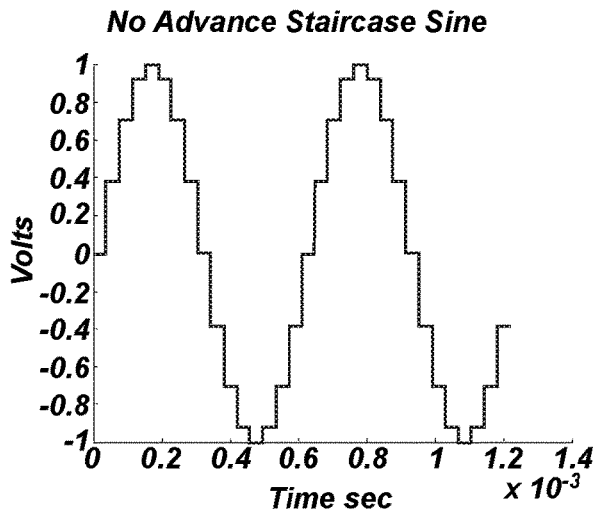
FIGS. 13A-13D illustrate a zero order hold sine wave in various formations.
Figure 13B:
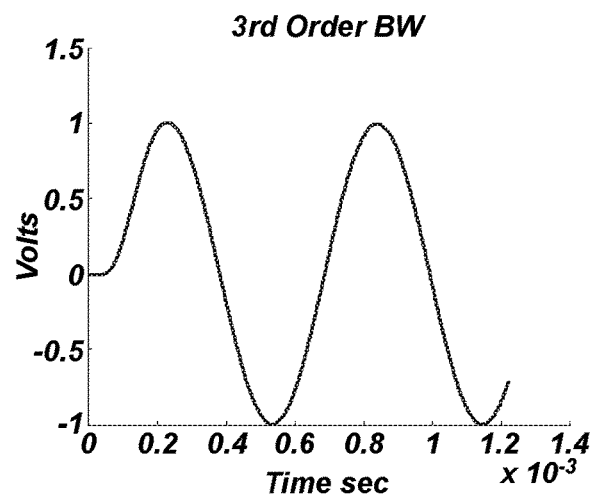

FIGS. 13A-13D illustrate a zero order hold sine wave in various formations. FIG. 13A illustrates a 1638.4 kHz zero order hold sine wave with no advance. This sine wave is a typical last frequency in an excitation SOS. FIG. 13B illustrates the smoothing filter response to the sine wave of FIG. 13B. It can be seen that the delay in FIG. 13B relative to FIG. 13A is a significant fraction of the period of the sine wave. This delay may corrupt attempts at a phase measurement.

Figure 13C:
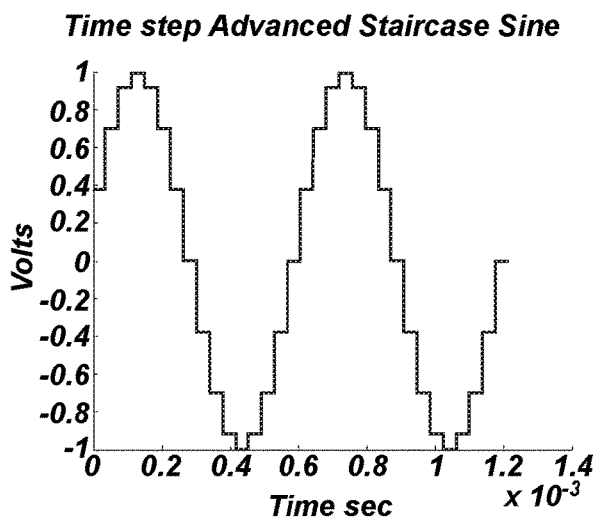
Figure 13D:
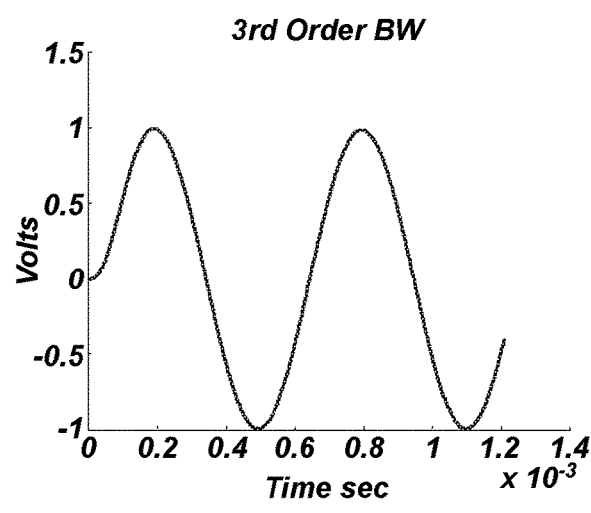

FIGS. 13C and 13D illustrate the impacts of a time step advance to mitigate this delay problem. It can be seen that the time delay is greatly reduced with the zero order hold advance. Thus, in some embodiments the calibration may implement a one-time step advance in the computer generated SOS.

Next is to pre-emphasize the SOS in magnitude and phase at each frequency such that when a measurement is made on the middle shunt the observed response magnitude is flat over all SOS frequencies with a zero phase shift. This pre-emphasis will eliminate the effect of the smoothing filter and the amplifier response on the measurement. To pre-emphasize the magnitude at frequency co, the amplitude of the SOS sine wave at $\omega_i$ is divided by the amplitude observed in a measurement from a non pre-emphasized SOS obtained from a middle calibration shunt and then multiplied by the amplitude desired. For phase pre-emphasis, the phase of the SOS sine wave at $\omega_i$ is set to the negative of the phase observed from a non pre-emphasized SOS obtained from a middle calibration shunt.

6.2. Magnitude Calibration

With the theoretical excitation issues resolved the next issue is the magnitude calibration. The approach taken is to obtain the response of the system via HCSD from the pre-emphasized SOS for three non-inductive shunts, a low, middle, and a high value. The range of the shunts selected should encompass the expected magnitude of the impedance to be measured (e.g., 16.67 mΩ, 25 mΩ, 50 mΩ are typical values). At each SOS frequency a least squares linear regression calibration (gain and offset) fit for the magnitude is computed using the data from the three shunts. Thus, for each frequency of the SOS there will be gain and offset magnitude calibration constants for that frequency.

6.3. Phase Calibration

A further part of calibration is phase calibration. The approach for phase calibration is to run the system with the middle value shunt and a pre-emphasized SOS (magnitude and phase). Included in each frequency of the SOS is a specific calibration phase shift that serves the same purpose as the three shunt values used for magnitude calibration. Based upon the linear system assumption, a phase shift in the SOS is assumed to originate in the shunt being measured. This approach allows the imaginary response to be calibrated. A range of phase calibration that encompasses the expected range of phase shift and the steps for the phase shift are selected. A maximum of −90° to +90° could be chosen and steps of −45°, −30°, −10°, 0°, +10°, +30°, +45° has been shown to work. The pre-emphasized SOS at each frequency is set to the step of phase shift and phase of $Z_{raw}(\omega_i)$ is obtained via HCSD at each frequency. As was done with the magnitude calibration for shunts at each SOS frequency, a least squares linear regression calibration fit for phase is computed. Thus, for each frequency of the SOS there will be gain and offset phase calibration constants for that frequency. To apply the calibration to a measurement, the test battery is excited by a pre-emphasized (i.e., filter response mitigation) SOS with a one sample advance (i.e., zero-order hold mitigation) over the frequencies and RMS level of the SOS that is as calibrated and the uncorrected impedance $Z_{raw}(\omega_i)$ obtained via HCSD.

The estimated battery impedance $Z_{corr}(\omega_i)$ from the calibration is given by:

$$|Z_{corr}(\omega_i)|=|Gain_{mag}(\omega_i)||Z_{raw}(\omega_i)|+Offset_{mag}(\omega_i)$$

$$\angle Z_{corr}(\omega_i)=|Gain_{phase}(\omega_i)||Z_{raw}(\omega_i)|+Offset_{phase}(\omega_i)$$

Where: $Gain_{mag}(\omega_i)$, $Offset_{mag}(\omega_i)$ are the magnitude calibration constants at $\omega_i$
$Gain_{phase}(\omega_i)$, $Offset_{phase}(\omega_i)$ are the phase calibration constants at $\omega_i$

7. Experimental Testing

Test cells with known characteristics were used to verify and validate the new calibration procedures. The test cells are resistor-capacitor circuits built with shunts and ultracapacitors and are time invariant. These test cells were designed to have an impedance spectrum similar to batteries.

Figure 14:
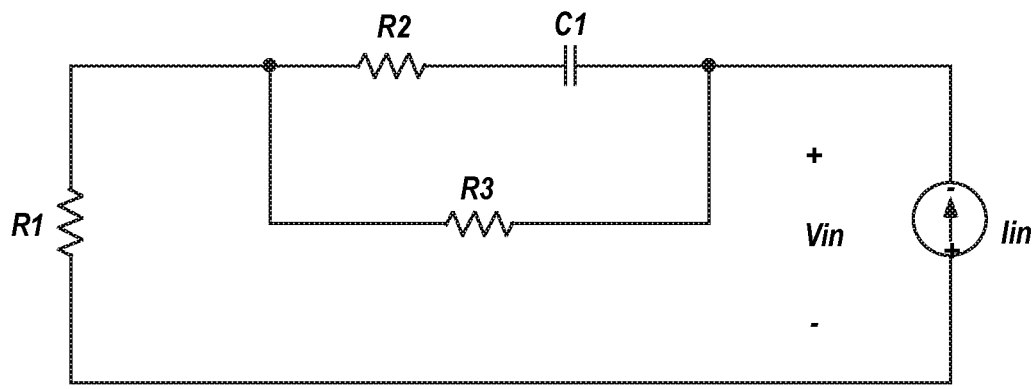
FIG. 14 illustrates a circuit diagram for tests cells with an impedance spectrum similar to batteries.

FIG. 14 illustrates a circuit diagram for tests cells with an impedance spectrum similar to batteries. Eight test cells were constructed for testing and validation. The component values for each of the test cells are listed in Table 1.

TABLE 1

Equivalent circuit test cell component values.

| Cell | R1 | R2 | R3 | C |
|------|-----|-----|-----|-----|
| TC1 | 10 mΩ | 10 mΩ | 10 mΩ | 18F |
| TC2 | 15 mΩ | 15 mΩ | 10 mΩ | 18F |
| TC3 | 15 mΩ | 15 mΩ | 20 mΩ | 9F |
| TC4 | 33 mΩ | 33 mΩ | 33 mΩ | 18F |
| TC5 | 33 mΩ | 33 mΩ | 20 mΩ | 44F |
| TC6 | 50 mΩ | 50 mΩ | 40 mΩ | 22F |
| TC7 | 50 mΩ | 50 mΩ | 50 mΩ | 13.6F |
| TC8 | 10 mΩ | 5 mΩ | 5 mΩ | 21F |

All of the test cells underwent impedance characterization using EIS. These measurements became the baseline benchmarks that were then used to evaluate the calibration performance.

7.1. Calibration Setup

The new calibration procedure has several features that can be customized to produce a calibration set tailored to the expected test range and conditions. Calibration shunt magnitude range is defined by the magnitude values of the shunts selected for a given calibration. During testing and validation three different ranges were used to cover all of the anticipated target impedance ranges. These ranges were low (10 mΩ, 16.67 mΩ, and 25 mΩ), medium (16.67 mΩ, 25 mΩ, and 50 mΩ), and high (50 mΩ, 100 mΩ, and 200 mΩ). These three ranges were chosen to correspond with both the test cell ranges and typical battery ranges.

The measurement current RMS value scales the input signal to the desired RMS value. In order to maintain the validity of the assumption of linearity due to small signal analysis it is desirable to control the RMS of the SOS current signal. This control is also desirable to ensure the IMD does not cause excessive stress to the test target, which is more important for batteries than electric circuit equivalent test cells. Three RMS values were used during this study, 250 mA, 500 mA, and 750 mA.

The frequency range and the number of frequencies are important calibration parameters. As the calibration corrections are calculated for each frequency, the calibration needs to be performed over the deployment frequencies. There are two standard frequency ranges of interest based on the range of interest to researchers (e.g., portions of the impedance spectrum containing useful diagnostic and prognostic information), test duration and hardware limitations (e.g., filter cutoff frequencies). The "long" range starts at 0.0125 Hz with 18 frequencies corresponding to a measurement duration of 80 seconds and the "short" range starts at 0.1 Hz with 15 frequencies corresponding to a measurement duration of 10 seconds. While the short range is faster, it does not capture the impedance at the lower frequencies. Thus, the calibration validation utilized the long frequency range.

7.2. Results

The calibration procedure validation study involved HCSD measurements using an IMD on test cells and Li-ion cells and the corresponding EIS measurements. IMD test bed measurements taken on test cells are plotted with their corresponding EIS measurements.

Figure 15:
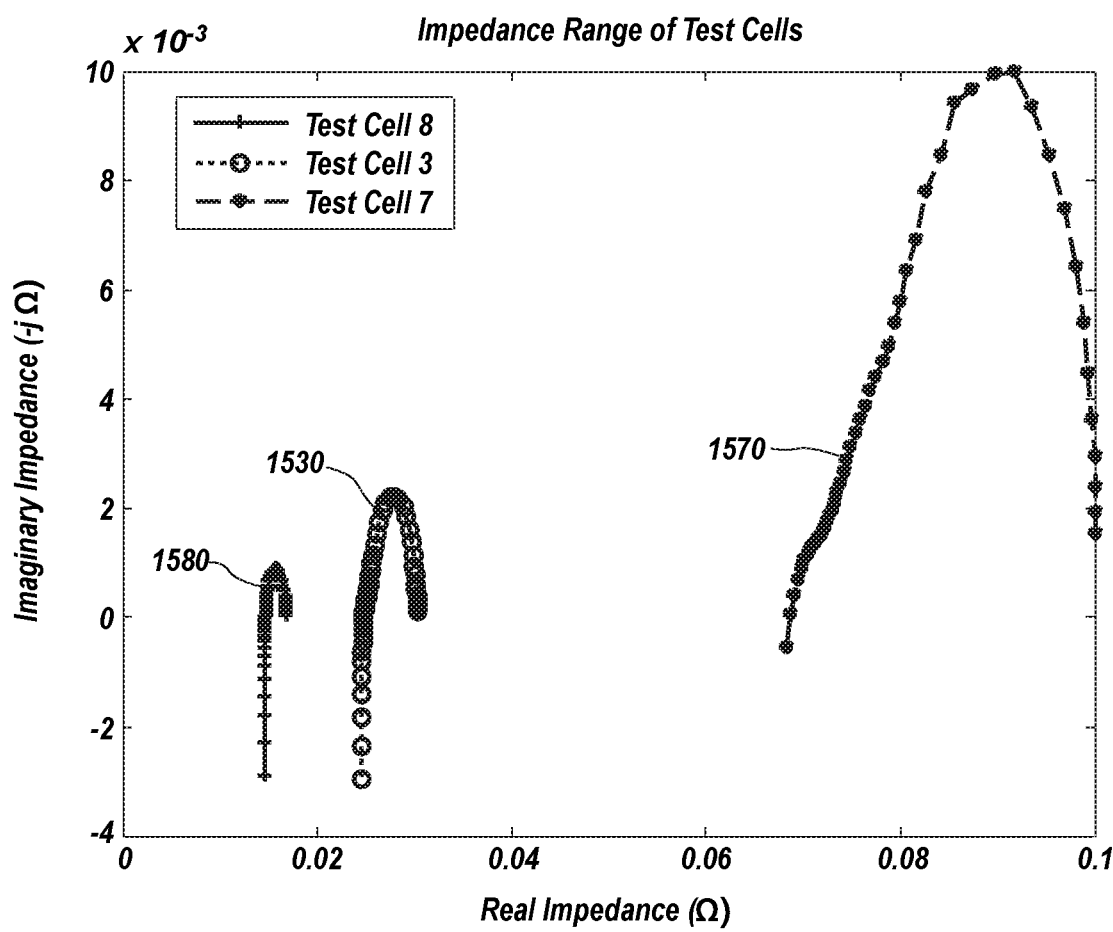
FIG. 15 illustrates EIS impedance spectra for three test cells.

FIG. 15 illustrates EIS impedance spectra for three test cells. The EIS impedance spectrum of test cells 3 (line 1530), 7 (line 1570), and 8 (line 1580) are plotted together showing that they span the frequency range of interest and thus were selected for the validation study.

Figure 16A:
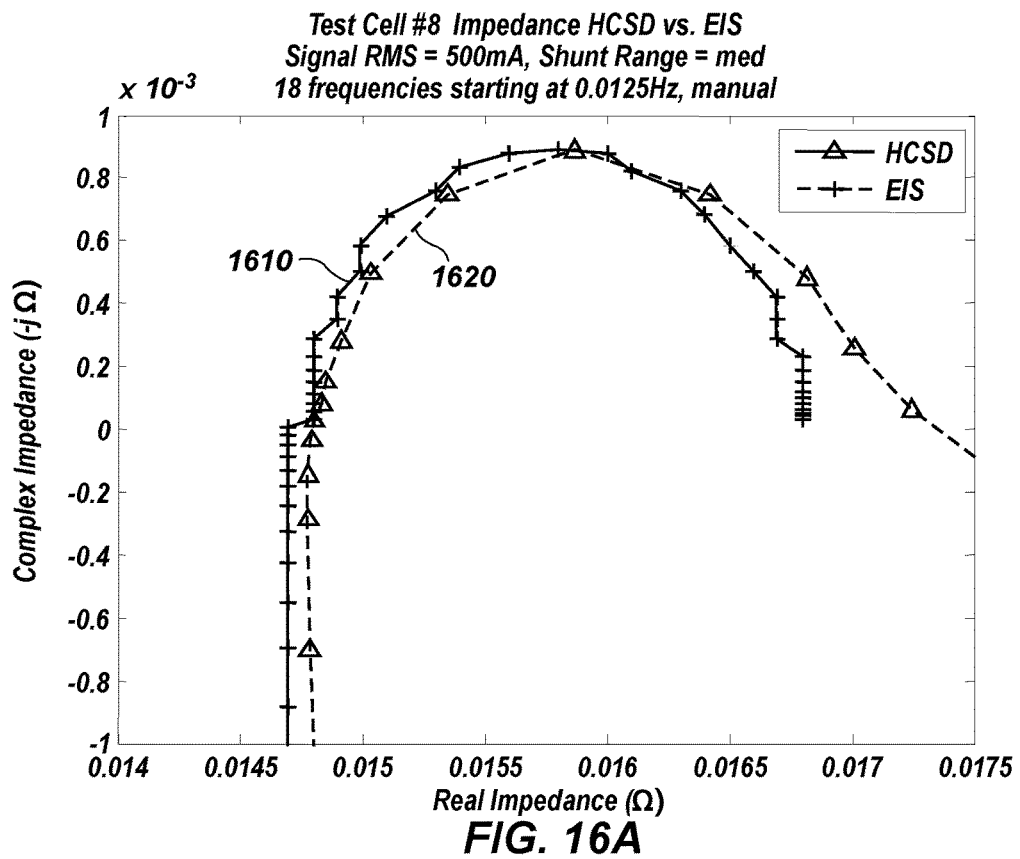
FIGS. 16A-16C illustrate impedance spectra for Harmonic Compensated Synchronous Detection (HCSD) measurements versus EIS measurements.
Figure 16B:
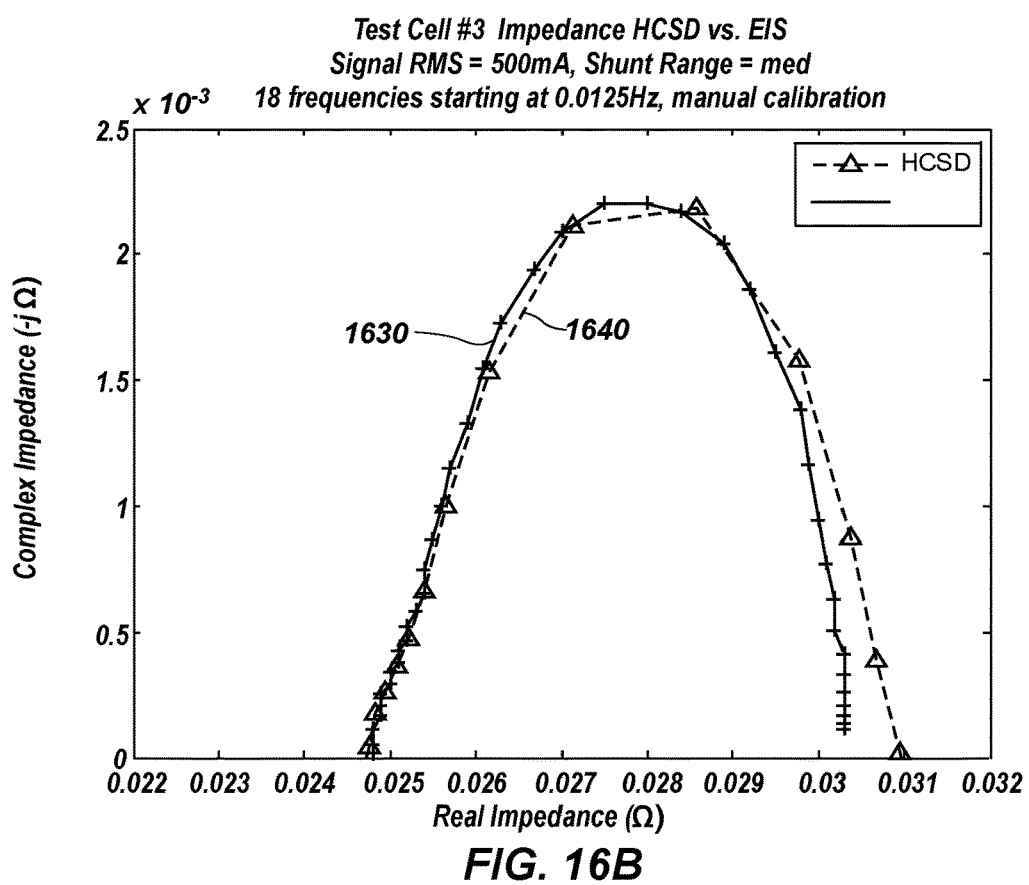
Figure 16C:
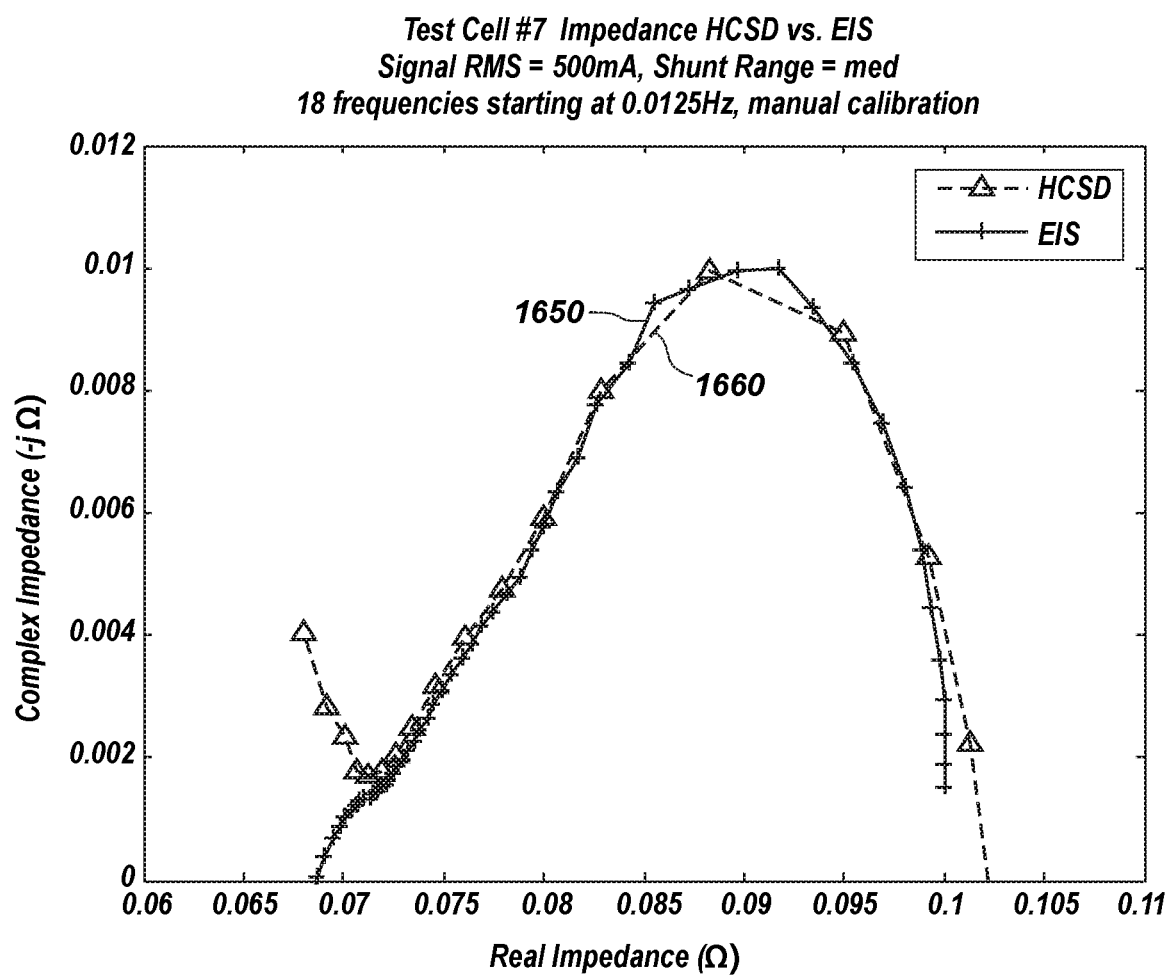

FIGS. 16A-16C illustrate impedance spectra for HCSD measurements versus EIS measurements. FIG. 16A illustrates an EIS spectrum 1610 and HCSD spectrum 1620 for test cell 8. FIG. 16B illustrates an EIS spectrum 1630 and HCSD spectrum 1640 for test cell 8. FIG. 16C illustrates an EIS spectrum 1650 and HCSD spectrum 1660 for test cell 8. Comparing these test cell results with the impedance plot of FIG. 12, it is clear that the under-estimation problem of the imaginary response has been resolved.

Additional tests were performed on two Li-ion cells using IMD HCSD tests and EIS tests that were run within minutes of each other. The HCSD test was run with the SOS set at 500 mA RMS, medium shunt range calibration, and 18 frequencies starting at 0.0125 Hz.

Figure 17A:
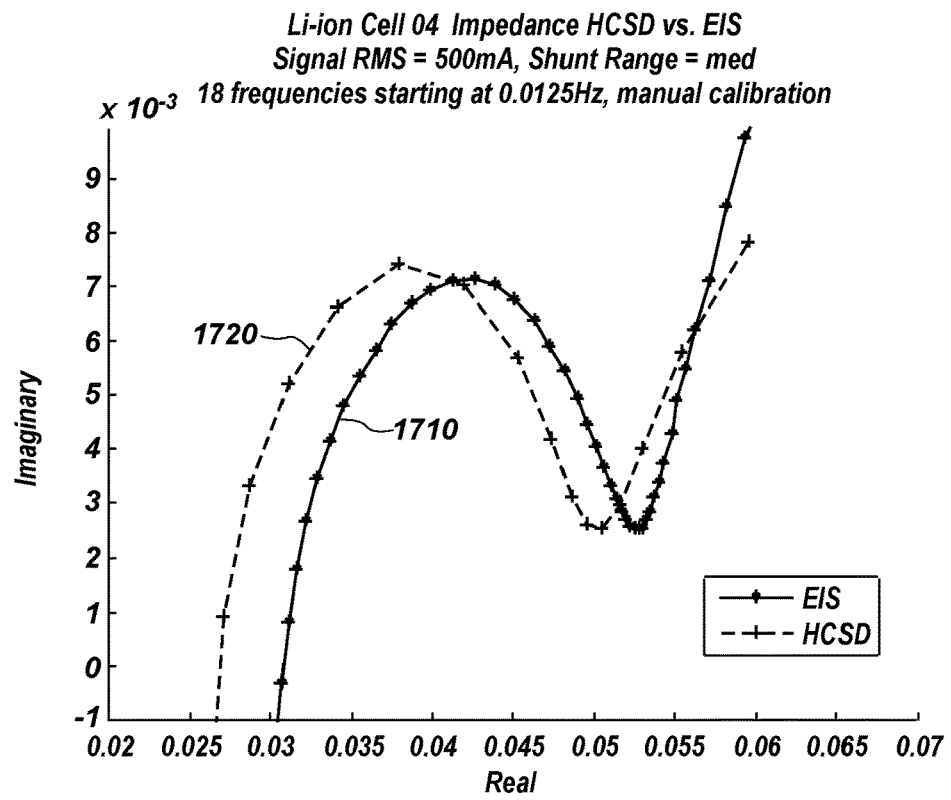
FIGS. 17A and 17B illustrate impedance spectra for HCSD measurements versus EIS measurements for two Li-Ion cells.
Figure 17B:
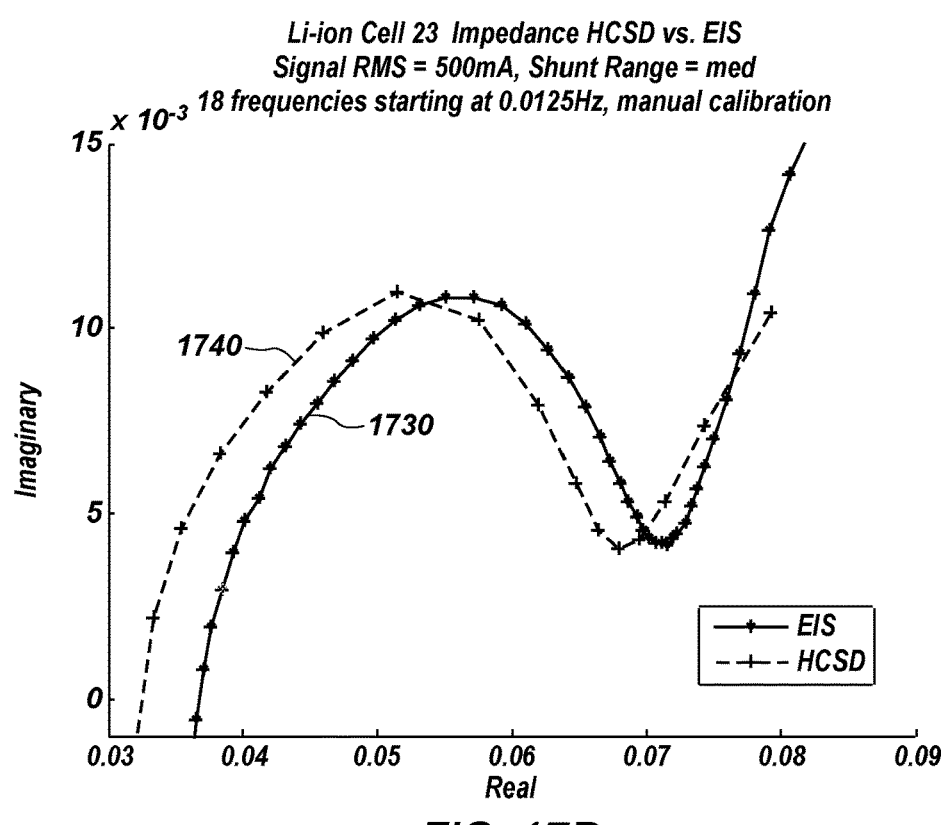

FIGS. 17A and 17B illustrate impedance spectra for HCSD measurements (1720 and 1740) versus EIS measurements (1710 and 1730) for two Li-Ion cells.

Figure 18A:
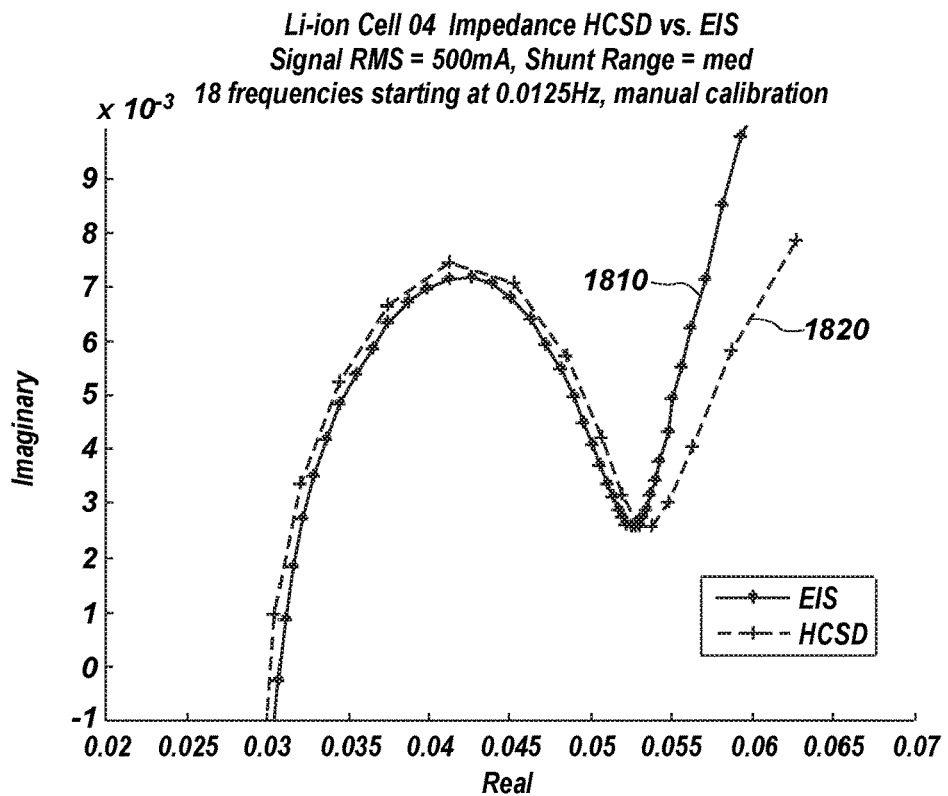
FIGS. 18A and 18B illustrate the impedance spectra of FIGS. 17A and 17B with the HCSD curves shifted to align with the EIS curves.
Figure 18B:
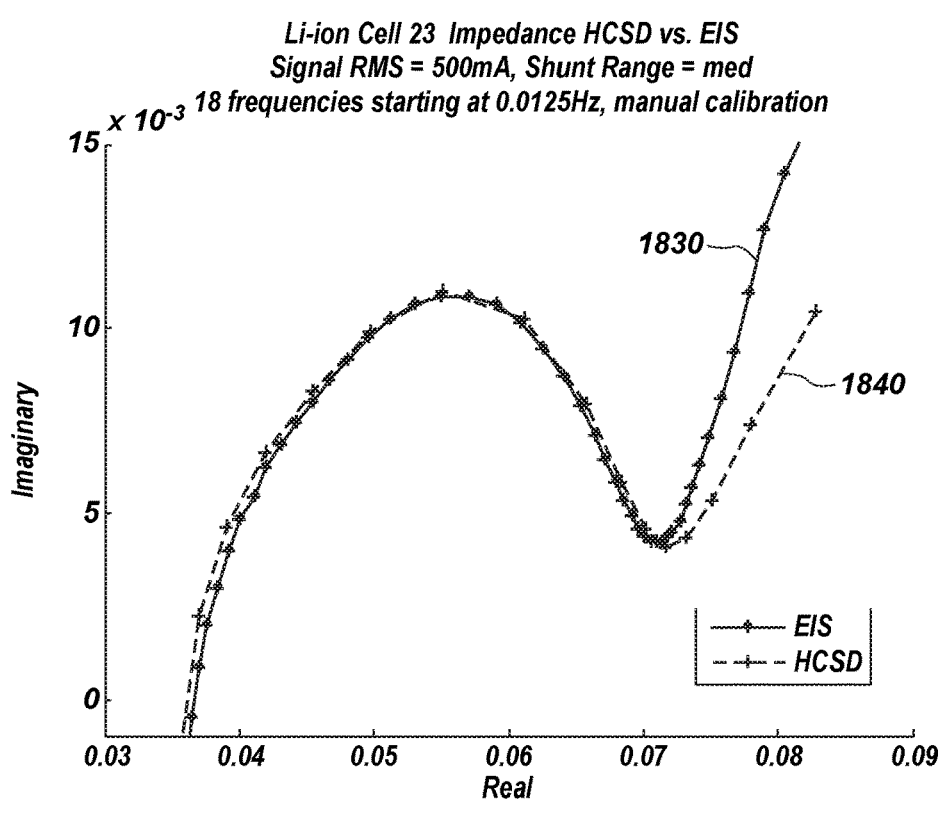

FIGS. 18A and 18B illustrate the impedance spectra of FIGS. 17A and 17B with HCSD curves (1820 and 1840) shifted to align with EIS curves (1810 and 1830). Once shifted, the HCSD results show very close agreement with the corresponding EIS results.

The HCSD spectrum measurements were shifted along the real axis as compared to the corresponding EIS measurement. The EIS measurements are showing a larger resistance (real impedance) compared to HCSD. This discrepancy may be explained because the IMD using the HCSD algorithm connected directly to the Li-ion cells during measurement, whereas the EIS measurement required a more elaborate setup resulting in longer test leads and thus a larger contact resistance.

In summary, the impedance spectrum calibration procedure corrects both resistive and reactive components of the impedance measurement utilizing calibration targets that are purely resistive in nature. Being purely resistive enables realization of the calibration procedure in a simpler and more direct method as compared to requiring calibration targets with known and accurate reactive responses. The calibration discussed herein successfully remediates the measurement under-estimation of the imaginary response. The new calibration produces meaningful results comparable to EIS measurements.

8. Automated Calibration for Complex Impedance Measurements

Some embodiments of the present disclosure provide an automated calibration procedure that uses an array of shunts to calibrate impedance measurements in both magnitude and phase. This technique enables a more accurate detection of impedance using rapid techniques. Embodiments may also include a technique that successfully removes the effects of noise in the buck voltage feedback so as to eliminate crosstalk error in the sum-of-sines detection during the measurement. Embodiments may also include an Impedance Measurement Device (IMD) that is capable of measuring the impedance spectrum of a module using any of the rapid techniques described herein.

In some embodiments of the present disclosure methods and apparatuses are disclosed for implementing an automated calibration technique that calibrates the impedance measurement in both the magnitude and phase when using shunts. The present disclosure also describes methods and apparatuses to reduce crosstalk interference from voltage feedback noise as well as hardware enhancements that enable rapid impedance measurements for modules that have voltages up to 300 V.

Rapid impedance spectrum measurements provide a unique opportunity to develop a more robust and accurate description of the state-of-health and remaining useful life of an energy storage device. Several techniques are disclosed to acquire high resolution impedance spectra within a few seconds.

When comparing the rapid impedance measurements to standard AC impedance sweeps, it was observed that the width of the semicircle arc was similar but its height was depressed. It was further determined that there were two primary causes for this error. The first cause was that the phase was not considered during calibration. Embodiments of the present disclosure describe a unique approach for calibrating the phase using an array of shunts and signal processing techniques. An automated calibration tool is also described.

Another source of the error in the rapid impedance measurement technique was in the voltage feedback. When the bias voltage was detected and subtracted from the measured response so as to more accurately detect the effects of the sum-of-sines signal, noise was still present in the signal and created crosstalk interference. This error was minimized using a digital feedback system with total ground isolation.

Embodiments of the present disclosure also include hardware to enable rapid impedance measurements for modules with voltage levels as high as about 300 V. Although the impedance techniques remain similar, previous hardware was based on 5 V cells. The hardware described herein may be used as an Impedance Measurement Device that could be incorporated into a battery management system for in situ applications.

In automated calibration, the calibration is still performed as discussed above with three shunts, low, medium, and high. However, the shunt selection has been automated and configured to perform both magnitude calibration and phase calibration.

A spread of non-inductive shunts are selected and configured as a series string. When SOS current is applied to the string every shunt sees the same current. To calibrate, any combination of three shunts can be selected and since they all see the same current they do not have to be adjacent. Micro relays may be used connect the voltage to be sensed to the selected shunts to measure voltage drop for that shunt. The relays may all be computer controlled, for example, as shown in FIG. 6 by the processor 630, the remote computer 610, or combination thereof.

Figure 19:
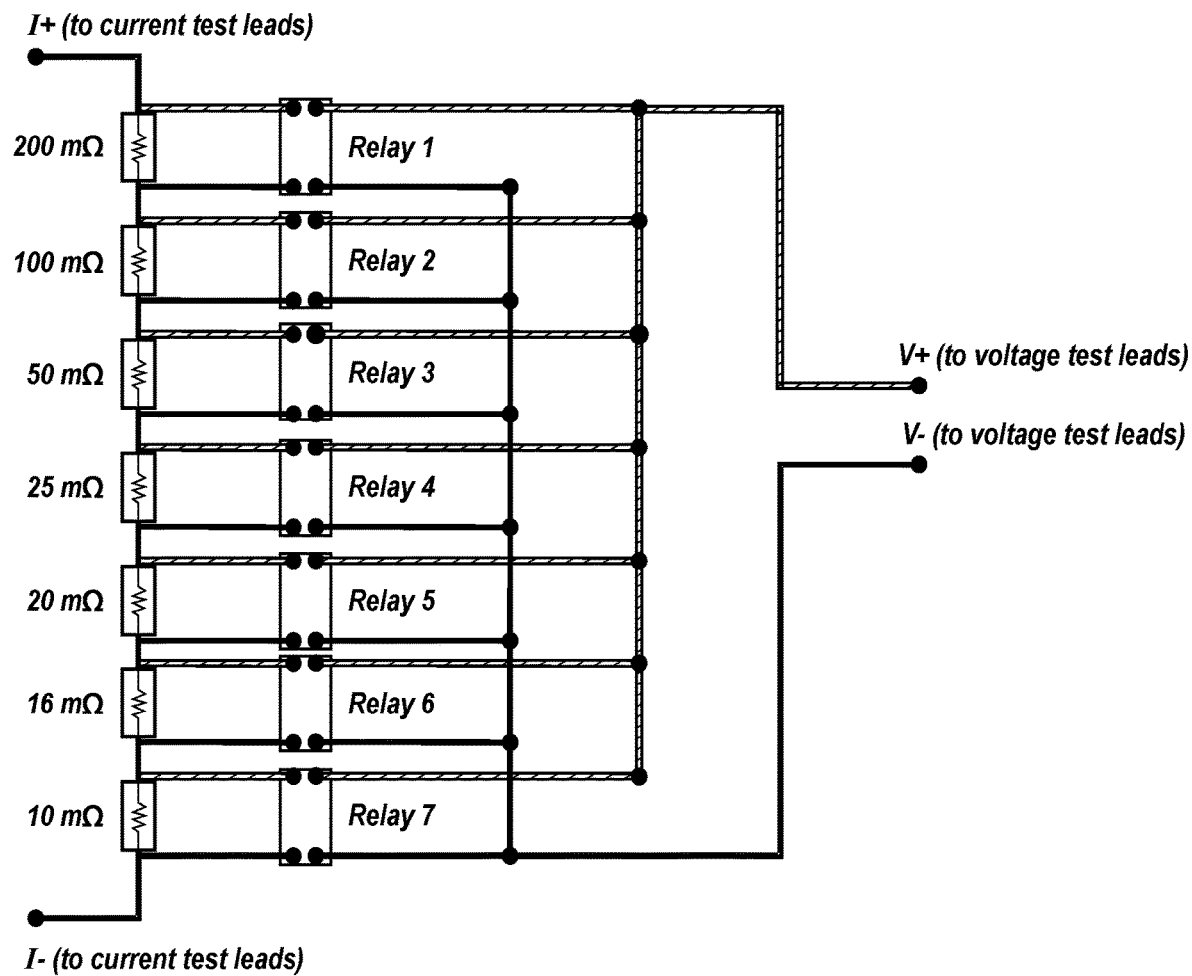
FIG. 19 illustrates shunts and relays that may be used in embodiments of an automatic calibration module.

FIG. 19 illustrates shunts and relays that may be used in embodiments of an automatic calibration module. Referring to FIGS. 6 and 19, test leads from the IMD 620 connect to the automated calibration module 660. Thus, measurement effects from the test leads are calibrated out. As a non-limiting example, a 3-bit control word from the processor 630 could be decoded to seven different control signals to control each of relays 1 through 7, which connect the desired shunts to voltage test leads.

In a calibration application (e.g., a Graphical User Interface or other suitable interface) a user can input all the desired calibration constraints. As non-limiting examples, the user may select the shunts, the RMS current, the phase shifts, the frequencies, etc.

The system 600 may be configured to store multiple calibrations to allow a user to select a calibration compatable to specific measurement scenarios. From the shunts selected for the series string within the automated calibration module 660, a broad combination of low, medium and high shunt value options are possible.

9. Universal Calibration

In some embodiments a single calibration process may apply to all standard IMD measurement scenarios. To reach this general goal, the frequency ranges desired need to coincide, a single group of calibration shunts need to work for all cases, and the RMS currents need to scale for a calibration. It is proposed that for most energy storage devices the following frequency ranges may be standardized that will all end with a highest frequency of 1638.4 Hz. A long frequency range would start at 0.0125 Hz. A medium frequency range would start at 0.1 Hz and a short frequency range would start at 0.8 Hz. The long frequency range would contain 18 frequencies and would have a duration of about 80 seconds. The medium frequency range would contain 15 frequencies and the duration would be about 10 seconds. The short frequency range would contain 12 frequencies and a duration of 1.25 seconds.

Clearly, the long frequency range contains all of the same frequencies as the medium frequency range and the short frequency range. This overlapping of frequencies will enable universal calibration.

A final piece of universal calibration is that the shorter frequency measurements can use the calibrations of the long universal calibration where the frequencies overlap. Although less critical, standard RMS measurement current ranges are also proposed: 62.5 mA, 125 mA, 250 mA and 500 mA. The universal calibration would be done at 500 mA RMS and then scaled to any current.

The calibration is performed at each frequency and includes a filter correction part and a response calibration part. The filter correction is normalized so filter corrections of the relevant frequencies are selected from the universal calibration. The phase calibration is inherently normalized so the relevant frequencies are also selected from the universal calibration for phase calibration. The magnitude calibration, however, must be scaled. In the calibration process the magnitude constants may be normalized to the calibration RMS current. Thus, the relevant frequency constants are multiplied by the measurement RMS current. Additionally, if the measurement number of frequencies is less than that of the universal calibration, the relevant magnitude calibration constants are multiplied by the square root of the ratio of the number of measurement frequencies to the universal calibration frequencies.

9.1. Validation of Mid-Shunt Auto-Calibration

A comparison of test cell response for mid-shunt calibration (25 m, 50 m, 100 m) against low-shunt calibration (16 m, 25 m, 50 m) for Auto-Cal was performed to verify that the mid-shunt range will provide adequate performance for IMD measurements.

Figure 20:
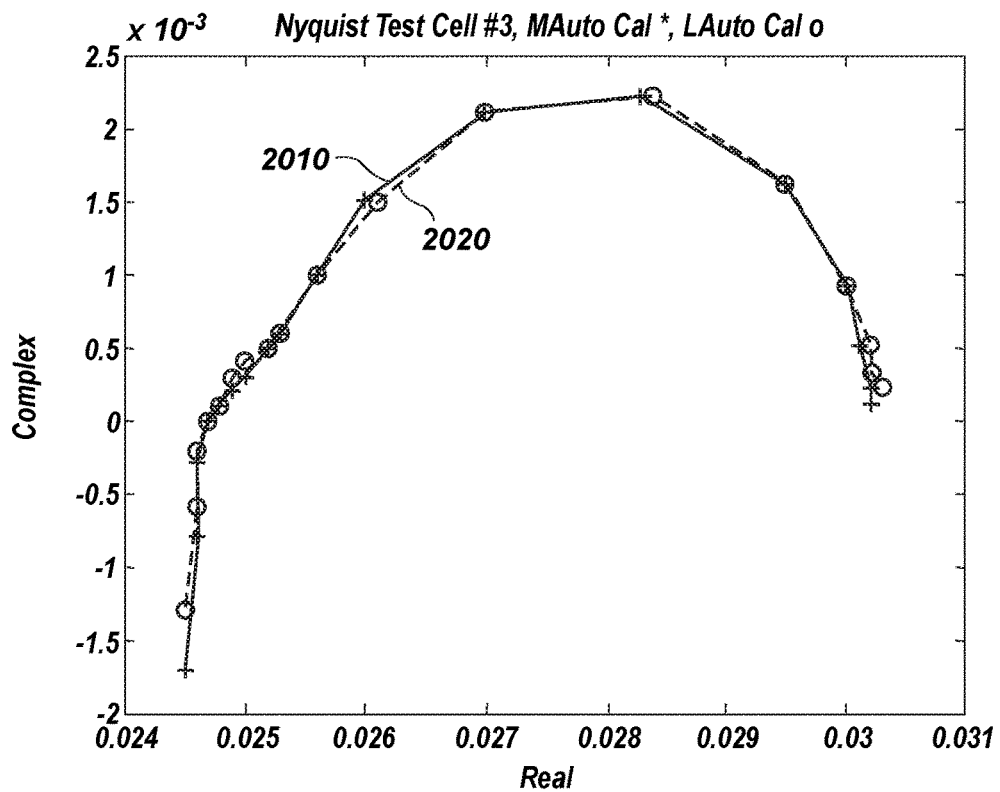
FIG. 20 shows Nyquist plots for mid-shunt calibration and low-shunt calibration for a test cell.

FIG. 20 shows Nyquist plots for mid-shunt calibration 2010 and low-shunt calibration 2020 for test cell 3. It can be seen that the difference between calibrations is negligible.

The next comparison is with batteries. A Li Ion cell and lead acid batteries were measured with both calibrations. The lead acid batteries were measured in series combinations of 12V, 24V, 36V & 48V.

Figure 21A:
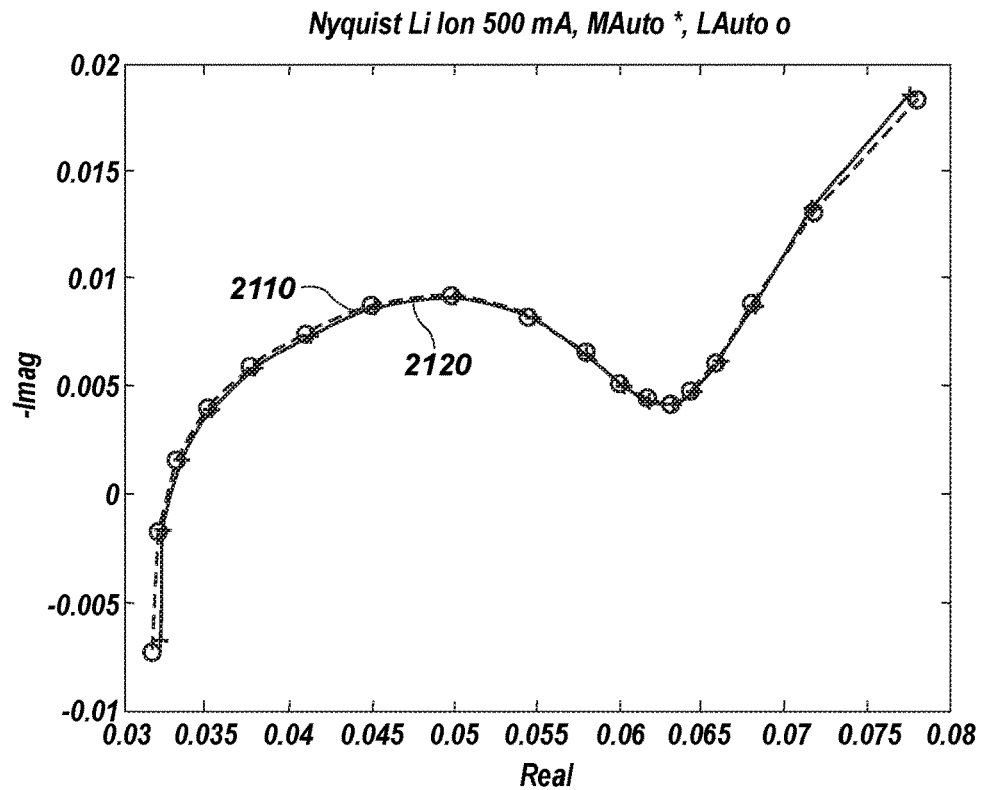
FIGS. 21A-21C show Nyquist plots for mid-shunt calibration and low-shunt calibration for various batteries.
Figure 21B:
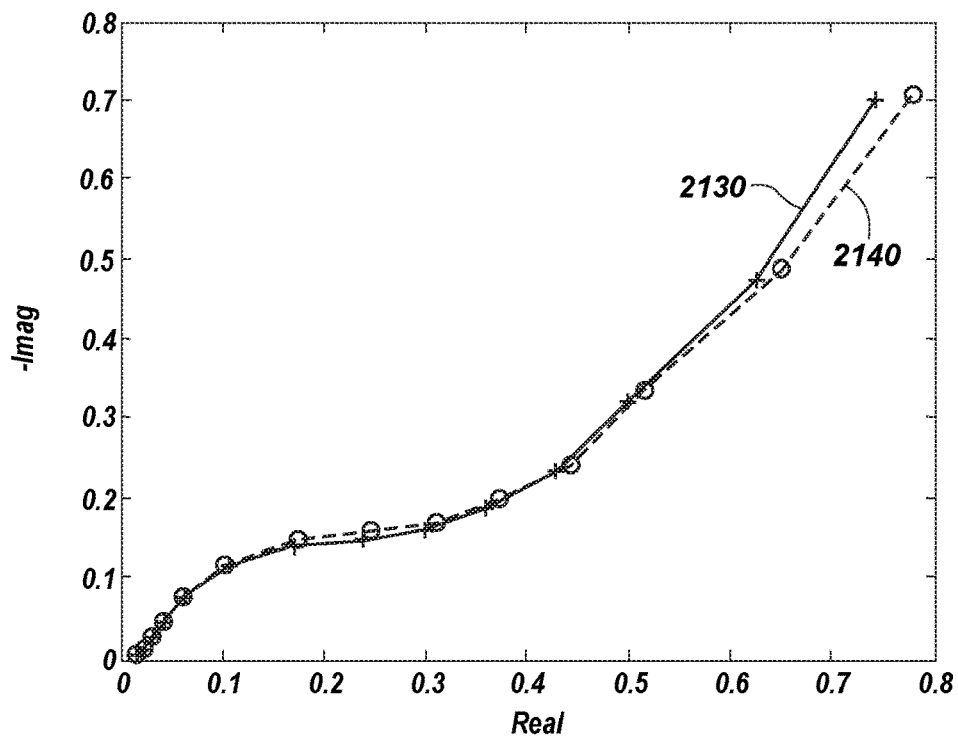
Figure 21C:
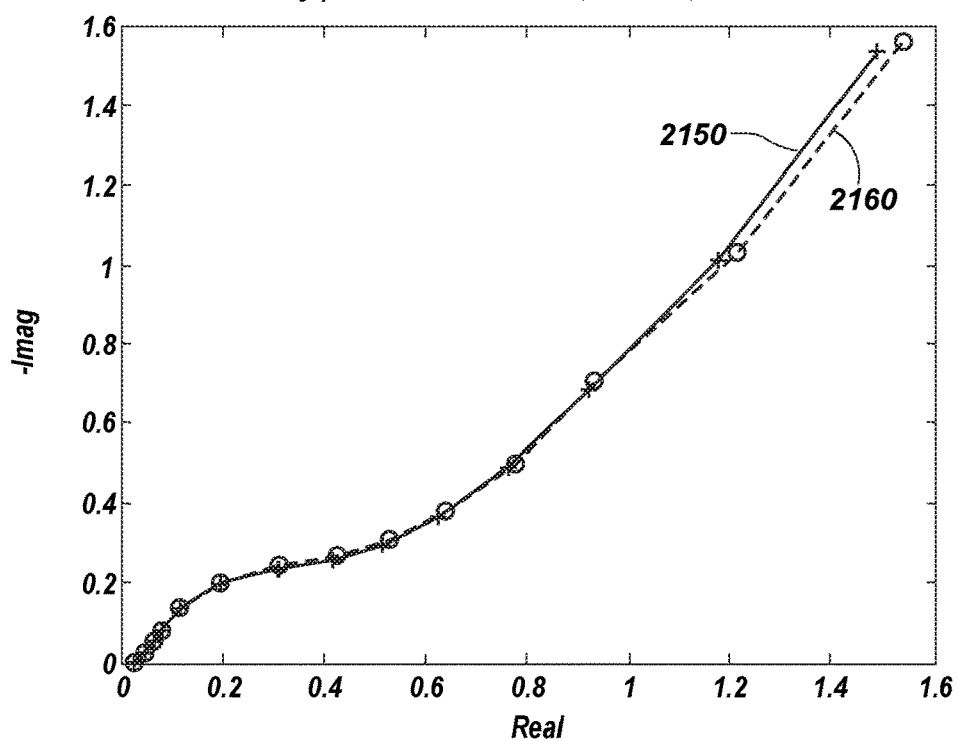

FIGS. 21A-21B shows Nyquist plots for mid-shunt calibration 2010 and low-shunt calibration 2020 for various batteries. FIG. 21A shows mid-shunt calibration 2110 and low-shunt calibration 2120 for a Li-Ion battery. FIG. 21B shows mid-shunt calibration 2130 and low-shunt calibration 2140 for a 12 volt lead acid battery series combination. FIG. 21C shows mid-shunt calibration 2150 and low-shunt calibration 2160 for a 24 volt lead acid battery series combination While the 48 V lead acid battery measurements are not shown, the results agree very closely as do the results for the Li-Ion battery shown in FIG. 21A. The 12 volt and 24 volt measurements shown in FIGS. 21B and 21C, respectively, show a minor disagreement in the Warburg region. Because of the very close match with test cells and the battery results it is concluded that the mid-range shunts for calibration can match the performance of low-range calibration shunts. This is a significant conclusion because the mid-range calibration will scale to the RMS current while the low-range calibration will not.

9.2. Demonstration of RMS Current Scaling for Calibration

One consideration for universal calibration is whether a calibration done at higher current can be scaled down and applied to a measurement done at a lower current. To demonstrate this, measurements were made on the group of lead acid batteries for 62.5 mA RMS. The impedance response was captured and the time record of battery voltage that was processed with the 62.5 mA calibration was also captured. In addition, a 500 mA calibration was scaled to 62.5 mA and applied the captured time record. The response from the 62.5 mA calibration is plotted with the response from the 500 mA calibration scaled to 62.5 mA. All of the responses were performed for the mid-shunt range.

Figure 22A:
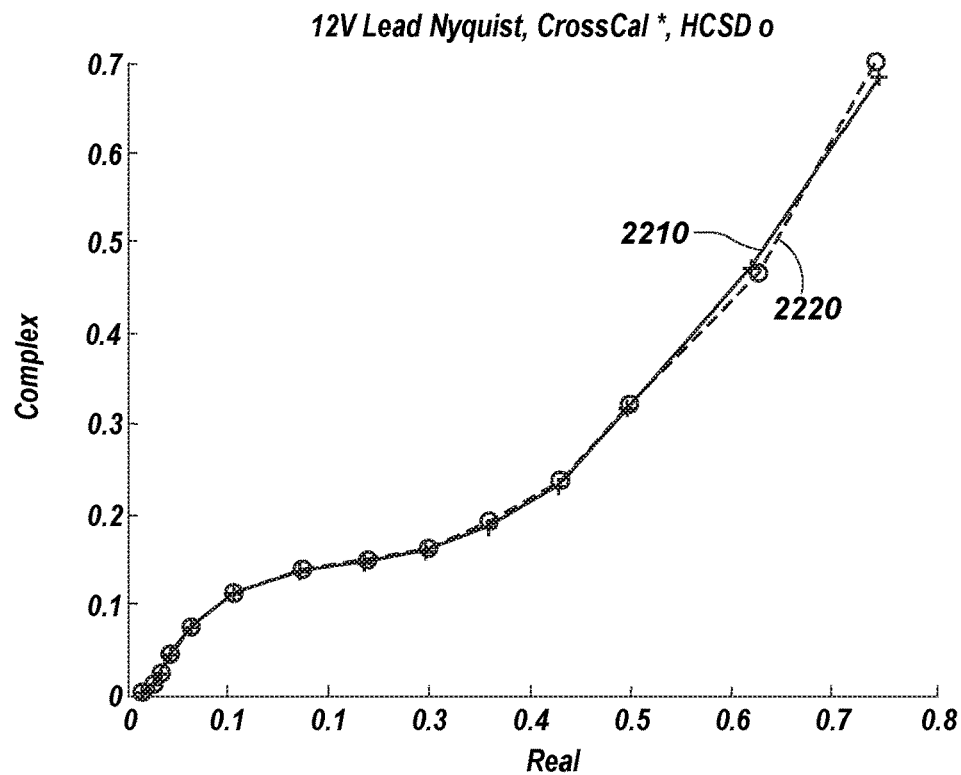
FIGS. 22A and 22B illustrate calibration with current scaling for a 12 volt lead acid battery and a 24 volt lead acid battery, respectively.
Figure 22B:
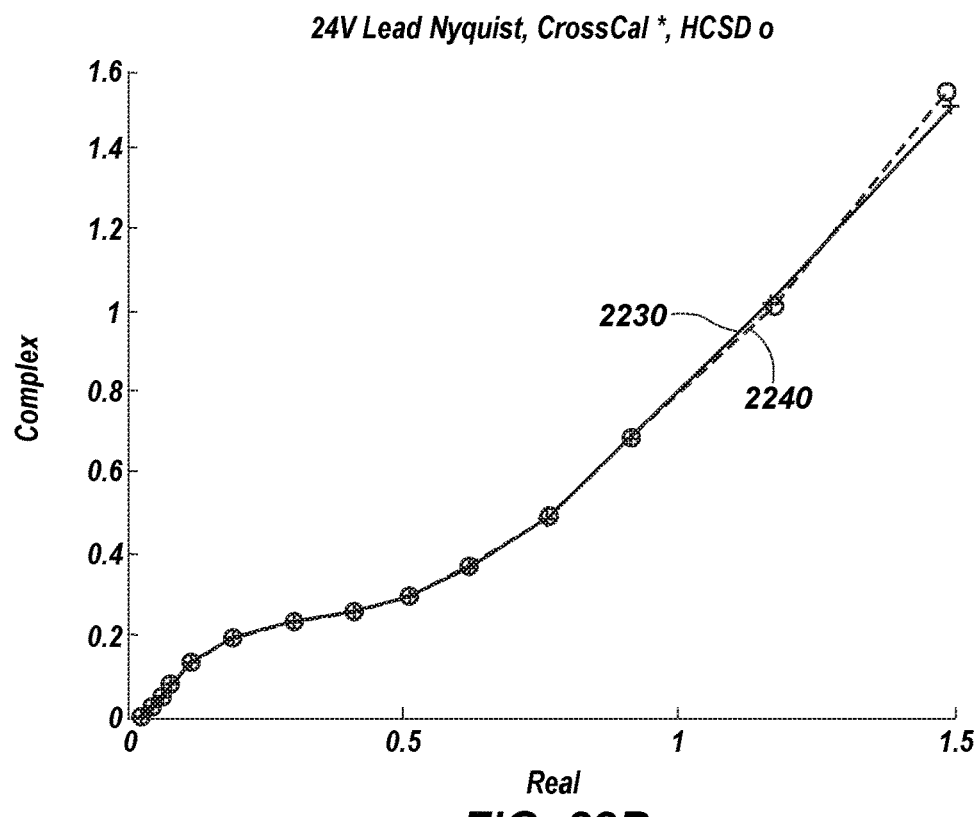

FIGS. 22A and 22B illustrate calibration with current scaling for a 12 volt lead acid battery and a 24 volt lead acid battery, respectively. FIG. 22A is for a 12 volt battery with line 2210 representing the 62.5 mA calibration and line 2220 representing the 500 mA calibration scaled to 62.5 mA. FIG. 22B is for a 24 volt battery with line 2230 representing the 62.5 mA calibration and line 2240 representing the 500 mA calibration scaled to 62.5 mA. As can be seen, the calibration for the mid-shunt range scales the RMS current with very good results. This good performance was achieved with a very large scaling of 500 mA to 62.5 mA.

9.3. Demonstration of Frequency Scaling for Calibration

Scaling of calibration with frequency is enabled by the overlapping of frequency ranges. The proposed standard frequency ranges all end with 1638.4 Hz with the long range (18 lines) having a start of 0.0125 Hz, the medium range (15 lines) having a start of 0.1 Hz and the short range (12 lines) having a start of 0.8 Hz. For this test, results are shown for the Li Ion battery and test cell 8. Although not shown, similar very close results were also found for the other test cells and lead acid battery configurations. The four-lead acid battery configuration (12V, 24V, 36V and 48V) were measured with medium range runs (15 frequencies, start 0.1 Hz).

Figure 23A:
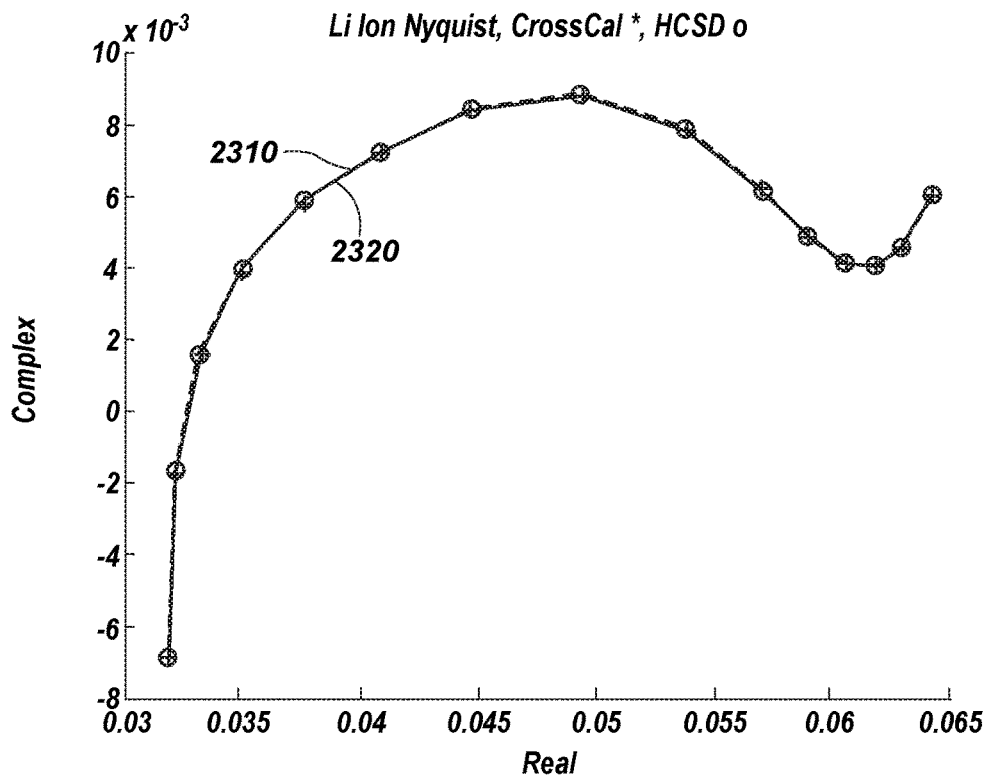
FIGS. 23A and 23B illustrate calibration with frequency range scaling for a Li-Ion battery, and a test cell, respectively.
Figure 23B:
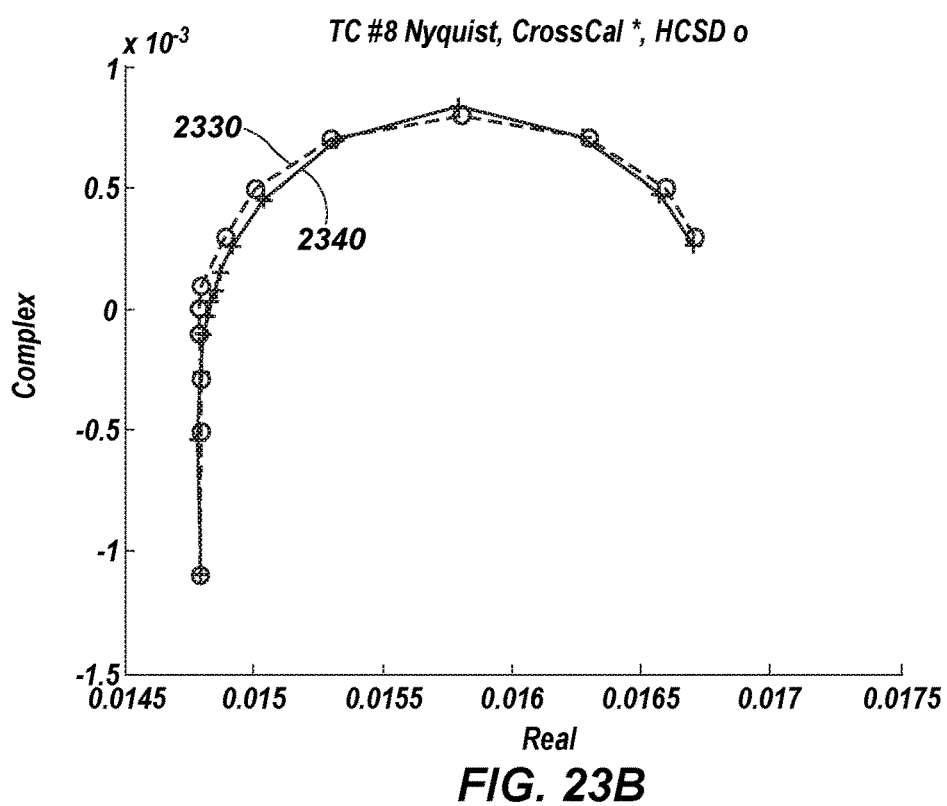

FIGS. 23A and 23B illustrate calibration with frequency range scaling for a Li-Ion battery, and a test cell, respectively. FIG. 23A is for a Li-Ion battery with line 2310 showing a medium-range calibration and line 2320 showing a long-range calibration scaled to a medium range. FIG. 23B is for test cell 8 with line 2330 showing a medium-range calibration and line 2340 showing a long-range calibration scaled to a medium range. As can be seen, the calibration for the long-range calibration scales to medium-range calibration show very good results.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention.

What is claimed is:

1. A method of estimating an impedance of a device to be measured, comprising:
    generating a sum-of-sines (SOS) signal comprising a summation of two or more sinusoidal signals at different frequencies with a frequency step factor therebetween;
    mitigating a zero-order hold delay by advancing the SOS signal by a time step to create a stimulus signal, wherein the time step comprises a time period between successive elements of a digital representation of one of the two or more sinusoidal signals;
    applying the stimulus signal to the device to be measured with an impedance measurement device;
    detecting a response signal with the impedance measurement device, the response signal comprising a response of the device to be measured to the stimulus signal; and
    estimating the impedance of the device to be measured using a sum-of-sines analysis of the response signal.

2. The method of claim 1, further comprising, prior to applying the stimulus signal to the device to be measured:
   pre-emphasizing a magnitude of each of the two or more sinusoidal signals such that a magnitude of the response signal is substantially flat over a frequency range encompassing all of the two or more sinusoidal signals when the stimulus signal is applied to a shunt impedance; and
   pre-emphasizing a phase of each of the two or more sinusoidal signals such that a phase shift of the response signal is substantially near zero when the stimulus signal is applied to the shunt impedance.

3. The method of claim 1, further comprising calibrating a magnitude of each of the two or more sinusoidal signals before applying the stimulus signal to the device to be measured by:
   applying the stimulus signal to a first shunt impedance and detecting a first response signal of the impedance measurement device with the first shunt impedance;
   applying the stimulus signal to a second shunt impedance and detecting a second response signal of the impedance measurement device with the second shunt impedance;
   applying the stimulus signal to a third shunt impedance and detecting a third response signal of the impedance measurement device with the third shunt impedance;
   at each frequency of the two or more sinusoidal signals, combining the first response signal, the second response signal and the third response signal to determine a magnitude calibration; and
   applying the magnitude calibration to each of the two or more sinusoidal signals of the stimulus signal.

4. The method of claim 3, further comprising converting each of the first response signal, the second response signal, and the third response signal from a time domain to a frequency domain prior to the combining and wherein the combining is performed in the frequency domain using a least squares linear regression to determine the magnitude calibration.

5. The method of claim 1, further comprising calibrating a phase of each of the two or more sinusoidal signals before applying the stimulus signal to the device to be measured by:
   applying the stimulus signal including an added first phase shift to a shunt impedance and detecting a first response signal of the impedance measurement device with the shunt impedance;
   applying the stimulus signal including an added second phase shift to the shunt impedance and detecting a second response signal of the impedance measurement device with the shunt impedance;
   applying the stimulus signal including an added third phase shift to the shunt impedance and detecting a third response signal of the impedance measurement device with the shunt impedance;
   at each frequency of the two or more sinusoidal signals, combining the first response signal, the second response signal and the third response signal to determine a phase calibration; and
   applying the phase calibration to each of the two or more sinusoidal signals of the stimulus signal.

6. The method of claim 5, further comprising converting each of the first response signal, the second response signal, and the third response signal from a time domain to a frequency domain prior to the combining and wherein the combining is performed in the frequency domain using a least squares linear regression to determine the phase calibration.

7. The method of claim 1, further comprising calibrating the impedance measurement device before applying the stimulus signal to the device to be measured by:
   determining a gain correction for each frequency of the two or more sinusoidal signals using three or more shunt impedances encompassing an expected magnitude of the impedance of the device to be measured by:
      pre-emphasizing a magnitude of each of the two or more sinusoidal signals in the stimulus signal;
      applying the stimulus signal to each of the three or more shunt impedances and detecting a magnitude-calibration response signal for each of the three or more shunt impedances; and
      combining the magnitude-calibration response signals to develop the gain corrections for each frequency of the two or more sinusoidal signals;
   determining a phase correction for each frequency of the two or more sinusoidal signals using three or more phase shifts by:
      pre-emphasizing a phase of each of the two or more sinusoidal signals in the stimulus signal using the three or more phase shifts;
      applying the stimulus signal to at least one of the three or more shunt impedances;
      detecting a phase-calibration response signal for each of the three or more phase shifts; and
      combining the phase-calibration response signals to develop the phase corrections for each frequency of the two or more sinusoidal signals; and
   applying the corresponding gain corrections and the corresponding phase corrections to each frequency of the two or more sinusoidal signals of the stimulus signal.

8. The method of claim 1, further comprising calibrating the impedance measurement device before applying the stimulus signal to the device to be measured by:
   pre-emphasizing a magnitude and phase of each of the two or more sinusoidal signals;
   applying the stimulus signal to one or more shunt impedances at a known Root Mean Square (RMS) current;
   detecting a current calibration response signal of the one or more shunt impedances with the impedance measurement device;
   determining calibration coefficients from the current calibration response signal; and
   using the calibration coefficients to scale a magnitude of each of the two or more sinusoidal signals to an RMS value less than or equal to the known RMS current.

9. The method of claim 8, wherein the known RMS current is substantially 500 mA or less.

10. The method of claim 8, wherein:
   the two or more sinusoidal signals at different frequencies have some overlap and a longest frequency range is used for an act of applying the stimulus signal to the one or more shunt impedances at the known Root Mean Square (RMS) current; and
   the method further includes scaling the two or more sinusoidal signals to a number of frequencies that is a subset of the frequencies in the longest frequency range.

11. An impedance measurement device comprising:
   a processor;
   a data acquisition system; and
   a sum-of-sines-generator for generating a sum-of-sines (SOS) signal comprising a summation of two or more sinusoidal signals at different frequencies with a frequency step factor therebetween; and wherein one or more of the processor and the data acquisition system are configured to:
  perform a function of the sum-of-sines-generator;
  advance the SOS signal by a time step to create a stimulus signal, wherein the time step comprises a time period between successive elements of a digital representation of one of the two or more sinusoidal signals;
  apply the stimulus signal to a device to be measured;
  while the stimulus signal is being applied, sample a response signal, the response signal comprising a response of the device to be measured to the stimulus signal; and
  analyze the response signal with a sum-of-sines analysis to estimate the impedance of the device to be measured.

12. The impedance measurement device of claim 11, further comprising:
  two or more shunt impedances configured to be selectively coupled to the stimulus signal; and
  wherein one or more of the processor and the data acquisition system are further configured to modify the stimulus signal prior to applying the stimulus signal to the device to be measured by:
    pre-emphasizing a magnitude of each of the two or more sinusoidal signals such that a magnitude of the response signal is substantially flat over a frequency range encompassing all of the two or more sinusoidal signals when the stimulus signal is applied to at least one of the two or more shunt impedances; and
    pre-emphasizing a phase of each of the two or more sinusoidal signals such that a phase shift of the response signal is substantially near zero when the stimulus signal is applied to at least one of the two or more shunt impedances.

13. The impedance measurement device of claim 11, further comprising:
  two or more shunt impedances configured to be selectively coupled to the stimulus signal; and
  wherein one or more of the processor and the data acquisition system are further configured to perform a plurality of magnitude calibration processes prior to applying the stimulus signal to the device to be measured, wherein each magnitude calibration process of the plurality is performed while coupled to a different shunt impedance and comprises:
    forming the shunt impedance by selectively enabling at least one of the two or more shunts;
    applying the stimulus signal to the shunt impedance;
    detecting a calibration response signal of the impedance measurement device with the shunt impedance; and
    at each frequency of the two or more sinusoidal signals:
      combining the calibration response signals from each magnitude calibration process of the plurality to determine a magnitude calibration; and
      applying the magnitude calibration to each of the two or more sinusoidal signals.

14. The impedance measurement device of claim 11, further comprising:
  two or more shunt impedances configured to be selectively coupled to the stimulus signal; and
  wherein one or more of the processor and the data acquisition system are further configured to perform a plurality of phase calibration processes prior to applying the stimulus signal to the device to be measured, wherein each phase calibration process of the plurality is performed with a different calibration phase shift on the stimulus signal and comprises:
    forming a shunt impedance by selectively enabling at least one of the two or more shunts;
    applying the stimulus signal with the calibration phase shift to the shunt impedance;
    detecting a calibration response signal of the impedance measurement device with the shunt impedance; and
    at each frequency of the two or more sinusoidal signals:
      combining the calibration response signals from each phase calibration process of the plurality to determine a phase calibration; and
      applying the phase calibration to each of the two or more sinusoidal signals.

15. The impedance measurement device of claim 11, further comprising:
  two or more shunt impedances configured to be selectively coupled to the stimulus signal; and
  wherein one or more of the processor and the data acquisition system are further configured to:
  perform a plurality of magnitude calibration processes prior to applying the stimulus signal to the device to be measured, wherein each magnitude calibration process of the plurality is performed while coupled to a different shunt impedance and comprises:
    forming the shunt impedance by selectively enabling at least one of the two or more shunts;
    applying the stimulus signal to the shunt impedance; and
    detecting a magnitude calibration response signal of the impedance measurement device with the shunt impedance;
  perform a plurality of phase calibration processes prior to applying the stimulus signal to the device to be measured; wherein each phase calibration process of the plurality is performed with a different calibration phase shift on the stimulus signal and comprises:
    forming a shunt impedance for phase measurement by selectively enabling at least one of the two or more shunts;
    applying the stimulus signal with the calibration phase shift to the shunt impedance for phase measurement; and
    detecting a phase calibration response signal of the impedance measurement device with the shunt impedance for phase measurement; and
  at each frequency of the two or more sinusoidal signals:
    combining the magnitude calibration response signals from each magnitude calibration process of the plurality to determine a magnitude calibration;
    combining the phase calibration response signals from each phase calibration process to determine a phase calibration; and
    applying the magnitude calibration and the phase calibration to each of the two or more sinusoidal signals.

16. The impedance measurement device of claim 15, further comprising converting each magnitude calibration response signal and each phase calibration response signal from a time domain to a frequency domain prior to the combining and wherein the combining is performed in the frequency domain using a least squares linear regression to determine the magnitude calibration and the phase calibration.

17. The impedance measurement device of claim 11, wherein one or more of the processor and the data acquisition system are further configured to calibrate the impedance measurement device before applying the stimulus signal to the device to be measured by:
  pre-emphasizing a magnitude and phase of each of the two or more sinusoidal signals;
  applying the stimulus signal to one or more shunt impedances at a known Root Mean Square (RMS) current;
  detecting a current calibration response signal of the one or more shunt impedances with the impedance measurement device;
  determining calibration coefficients from the current calibration response signal; and
  using the calibration coefficients to scale a magnitude of each of the two or more sinusoidal signals to an RMS value less than or equal to the known RMS current.

18. The impedance measurement device of claim 12, wherein the two or more shunt impedances are non-inductive.

19. An impedance measurement device, comprising:
  a processor;
  a data acquisition system;
  a sum-of-sines generator for generating a stimulus signal to be applied to a device to be measured, the stimulus signal including a summation of two or more sinusoidal signals at different frequencies with a frequency step factor therebetween; and
  an amplifier circuit configured to generate an output signal proportional to a difference between a first input and a second input, wherein the first input is operably coupled to the device to be measured and the second input is operably coupled to a buck signal from the data acquisition system; and
  wherein one or more of the processor and the data acquisition system are configured to:
    set a voltage of the buck signal to an initial value;
    sample the output signal;
    modify the voltage of the buck signal responsive to the sampled output signal;
    repeat the sampling of the output signal and the modifying of the voltage on the buck signal until the output signal is within an error tolerance;
    once within the error tolerance, maintain the voltage on the buck signal as a final buck voltage;
    apply the stimulus signal to the device to be measured to generate a response signal including a bias voltage of the device to be measured;
    sample the output of the amplifier circuit while the stimulus signal is being applied to generate a bias-removed response signal comprising the response signal with an approximation of the bias voltage removed; and
    estimate the impedance of the device to be measured using a sum-of-sines analysis of the bias-removed response signal.

20. The impedance measurement device of claim 19, wherein:
  the buck signal is a coarse buck signal;
  the amplifier circuit includes a third input operably coupled to a fine buck signal from the data acquisition system and the amplifier circuit is configured to generate the output signal proportional to a difference between the device to be measured and the fine buck signal when the coarse buck signal is held constant; and
  after the final buck voltage is determined and is being applied to the amplifier circuit, one or more of the processor and the data acquisition system are further configured to:
    set a voltage of the fine buck signal to a fine initial value;
    sample the output signal;
    modify the voltage of the fine buck signal responsive to the sampled output signal;
    repeat the sampling of the output signal and the modifying of the voltage of the fine buck signal until the output signal is within a fine error tolerance; and
    once within the fine error tolerance, maintain the voltage on the fine buck signal as a final fine buck voltage.

21. The impedance measurement device of claim 20, wherein the amplifier circuit comprises:
  a first differential amplifier comprising:
    a first input operably coupled to the device to be measured;
    a second input operably coupled to the coarse buck signal; and
    an output; and
  a second differential amplifier comprising:
    a first input operably coupled to the output of the first differential amplifier;
    a second input operably coupled to the fine buck signal; and
    an output operably coupled to the data acquisition system.

22. The impedance measurement device of claim 20, wherein a final coarse buck voltage and a final fine buck voltage are determined using a digital feedback system with total ground isolation.

23. The impedance measurement device of claim 19, wherein the amplifier circuit is configured for and capable of comparing mid-range voltages.

24. The impedance measurement device of claim 23, wherein the mid-range voltages are substantially equal to 50 volts.

25. The impedance measurement device of claim 19, wherein the amplifier circuit is configured for and capable of comparing high-range voltages.

26. The impedance measurement device of claim 25, wherein the high-range voltages are substantially equal to 300 volts.

27. The impedance measurement device of claim 19, further comprising a circuit combination operably coupled between the data acquisition system and the device to be measured, the circuit combination including a coupling capacitor, and two or more relays configured for interfacing to the high-range voltages such that:
  one or more first relays close to charge the coupling capacitor to the high-range voltage of the device to be measured while a second relay isolates the impedance measurement device from the coupling capacitor;
  after the coupling capacitor is charged, the second relay closes to couple the impedance measurement device to the coupling capacitor to apply the stimulus signal; and
  after the sampling of the response signal, the one or more first relays open to decouple the device to be measured from the coupling capacitor.

* * * * *

UNITED STATES PATENT AND TRADEMARK OFFICE
CERTIFICATE OF CORRECTION

PATENT NO. : 10,901,044 B2  
APPLICATION NO. : 16/167962  
DATED : January 26, 2021  
INVENTOR(S) : Jon P. Christophersen et al.

Page 1 of 1

It is certified that error appears in the above-identified patent and that said Letters Patent is hereby corrected as shown below:

In the Specification

| | | |
|---|---|---|
| Column 1, | Line 40, | change "DE-AC07-051D14517" to --DE-AC07-05ID14517-- |
| Column 8, | Line 10, | change "INT" to --INI-- |
| Column 15, | Line 18, | change "10000 of capacitor" to --10000 uf capacitor-- |
| Column 15, | Line 29, | change "9-20-930" to --930-- |
| Column 17, | Line 66, | change "$R(\omega_i)=$ [SOS($\omega_i$)$\angle\phi_{sos}(\omega_i)\angle\phi_{sos}(\omega_i)$] [$H(\omega_i)\angle\phi_H(\omega_i)$]" to --$R(\omega_i) = [SOS(\omega_i)\angle\phi_{sos}(\omega_i)] [H(\omega_i)\angle\phi_H(\omega_i)]$-- |
| Column 18, | Line 2, | change "$R(\omega_i)=SOS(\omega_i)\|H(\omega_i)\|CD(\omega_i\|Z(\omega_i)\|A$" to --$R(\omega_i) = |SOS(\omega_i)\|H(\omega_i)\|CD(\omega_i\|Z(\omega_i)\|A$-- |
| Column 18, | Line 3, | change "($\omega_i$)+ $\angle\phi_{sos}+\angle\phi_H(\omega_i)+ \angle\phi_{CD}(\omega_i)+ \angle\phi_Z(\omega_i) + \angle\phi_A(\omega_i)$" to --($\omega_i$)|+$\angle\phi_{sos}(\omega_i) + \angle\phi_H(\omega_i) + \angle\phi_{CD}(\omega_i) + \angle\phi_Z(\omega_i) + \angle\phi_A(\omega_i)$-- |
| Column 18, | Line 49, | change "frequency co," to --frequency $\omega_i$-- |
| Column 19, | Line 33, | change "$|Z_{corr}(\omega_i)=|Gain_{mag}(\omega_i)Z_{raw}(\omega_i)| + Offset_{mag}(\omega_i)$" to --$|Z_{corr}(\omega_i)| = Gain_{mag}(\omega_i)|Z_{raw}(\omega_i)| + Offset_{mag}(\omega_i)$-- |
| Column 19, | Line 35, | change "$\angle Z_{corr}(\omega_i) = |Gain_{phase}(\omega_i)Z_{raw}(\omega_i)| + Offset_{phase}(\omega_i)$" to --$\angle Z_{corr}(\omega_i) = Gain_{phase}(\omega_i)\angle Z_{raw}(\omega_i) + Offset_{phase}(\omega_i)$-- |

Signed and Sealed this  
Twenty-seventh Day of April, 2021

Drew Hirshfeld  
*Performing the Functions and Duties of the  
Under Secretary of Commerce for Intellectual Property and  
Director of the United States Patent and Trademark Office*